(12) United States Patent
Murakami et al.

(10) Patent No.: US 12,407,951 B2
(45) Date of Patent: Sep. 2, 2025

(54) IMAGING DEVICE AND CAMERA SYSTEM

(71) Applicant: Panasonic Intellectual Property Management Co., Ltd., Osaka (JP)

(72) Inventors: Masashi Murakami, Kyoto (JP); Makoto Shouho, Osaka (JP); Yoshihiro Sato, Osaka (JP); Kazuko Nishimura, Kyoto (JP); Junji Hirase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 126 days.

(21) Appl. No.: 18/340,886

(22) Filed: Jun. 26, 2023

(65) Prior Publication Data

US 2023/0336886 A1 Oct. 19, 2023

Related U.S. Application Data

(63) Continuation of application No. PCT/JP2021/037712, filed on Oct. 12, 2021.

(30) Foreign Application Priority Data

Jan. 15, 2021 (JP) ................................ 2021-005352

(51) Int. Cl.
*H04N 25/59* (2023.01)
*H04N 25/57* (2023.01)
(Continued)

(52) U.S. Cl.
CPC ............. *H04N 25/59* (2023.01); *H10F 39/18* (2025.01); *H10F 39/8037* (2025.01)

(58) Field of Classification Search
CPC ...... H04N 25/59; H04N 25/575; H04N 25/70; H04N 25/76; H04N 25/77; H04N 25/771;
(Continued)

(56) References Cited

U.S. PATENT DOCUMENTS 6,246,436 B1 6/2001 Lin et al.
6,323,490 B1 11/2001 Ikeda et al.
(Continued)

FOREIGN PATENT DOCUMENTS

JP 08-289205 11/1996
JP 11-214738 8/1999
(Continued)

OTHER PUBLICATIONS

International Search Report of PCT application No. PCT/JP2021/037712 dated Dec. 21, 2021.
(Continued)

*Primary Examiner* — Marly S Camargo
(74) *Attorney, Agent, or Firm* — Rimon P.C.

(57) ABSTRACT

An imaging device includes a charge accumulator, a first transistor, and a first capacitive element. The first transistor has a first source, a first drain, and a first gate electrode electrically connected to one of the first source and the first drain. The first capacitive element holds the charges and has a first terminal. A fixed potential is supplied to the other of the first source and the first drain. One of the first source and the first drain is always electrically connected to the first terminal of the first capacitive element from start to end of an exposure period.

20 Claims, 31 Drawing Sheets

(51) Int. Cl.
   *H04N 25/771*   (2023.01)
   *H10F 39/00*    (2025.01)
   *H10F 39/12*    (2025.01)
   *H10F 39/18*    (2025.01)

(58) Field of Classification Search
   CPC ..... H04N 25/47; H10F 39/18; H10F 39/8037; H10F 39/12; H10F 39/803
   See application file for complete search history.

(56) References Cited

U.S. PATENT DOCUMENTS

| | | | |
|---|---|---|---|
| 11,653,117 B2 * | 5/2023 | Nishimura | ............ H04N 25/77 |
| 2008/0266434 A1 | 10/2008 | Sugawa et al. | |
| 2009/0179293 A1 | 7/2009 | Shim et al. | |
| 2014/0070075 A1 | 3/2014 | Anaxagoras | |
| 2015/0194458 A1 | 7/2015 | Furukawa et al. | |
| 2016/0105622 A1 | 4/2016 | Tamaki | |
| 2017/0214871 A1 | 7/2017 | Kanehara et al. | |
| 2017/0214878 A1 | 7/2017 | Van Der Tempel | |
| 2019/0238767 A1 | 8/2019 | Satou et al. | |
| 2019/0238768 A1 * | 8/2019 | Yamada | ................. H04N 25/78 |
| 2020/0304735 A1 * | 9/2020 | Abe | ..................... H04N 25/616 |
| 2021/0185249 A1 | 6/2021 | Murakami et al. | |

FOREIGN PATENT DOCUMENTS

| | | |
|---|---|---|
| JP | 11-274524 A | 10/1999 |
| JP | 2005-328493 | 11/2005 |
| JP | 2008-079001 | 4/2008 |
| JP | 2009-164604 | 7/2009 |
| JP | 2016-076921 | 5/2016 |
| JP | 2017-135693 | 8/2017 |
| JP | 2017-523688 | 8/2017 |
| WO | 2020/144910 | 7/2020 |

OTHER PUBLICATIONS

The EPC Office Action dated Apr. 30, 2024 for the related European Patent Application No. 21919519.5.

The EPC Office Action dated May 30, 2025 for the related European Patent Application No. 21919519.5.

* cited by examiner

FIG. 32
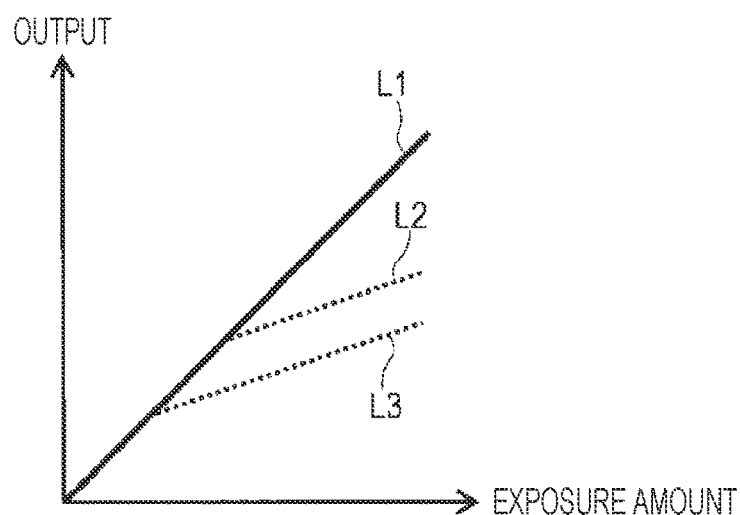
FIG. 33
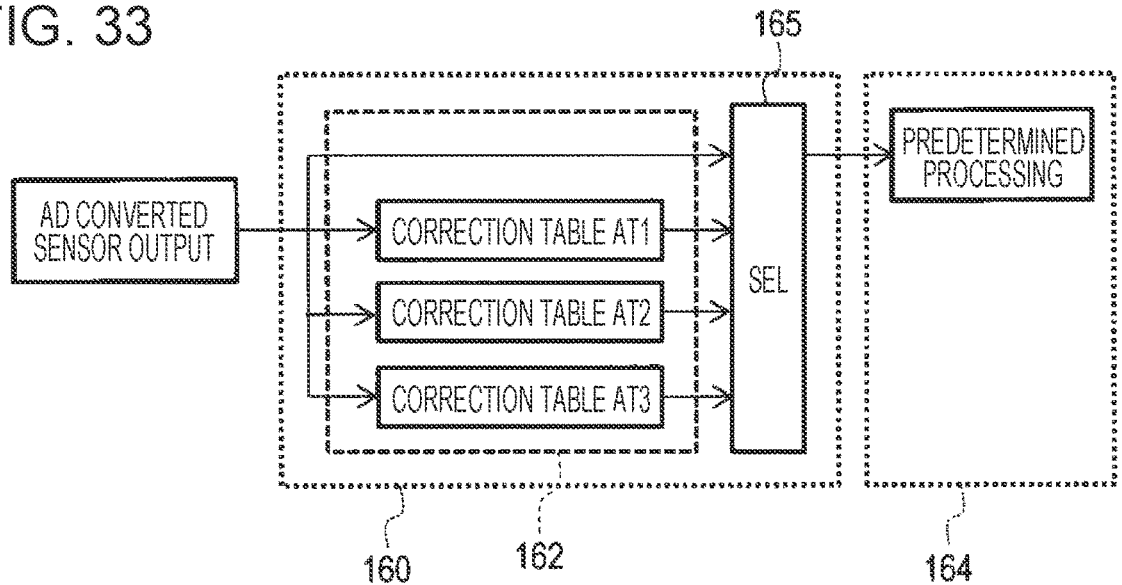
FIG. 34
| SENSOR OUTPUT [LSB] | OUTPUT AFTER CORRECTION IS APPLIED [LSB] |
|---|---|
| 0 | 0 |
| ⋮ | ⋮ |
| N | X |
| ⋮ | ⋮ |

FIG. 35
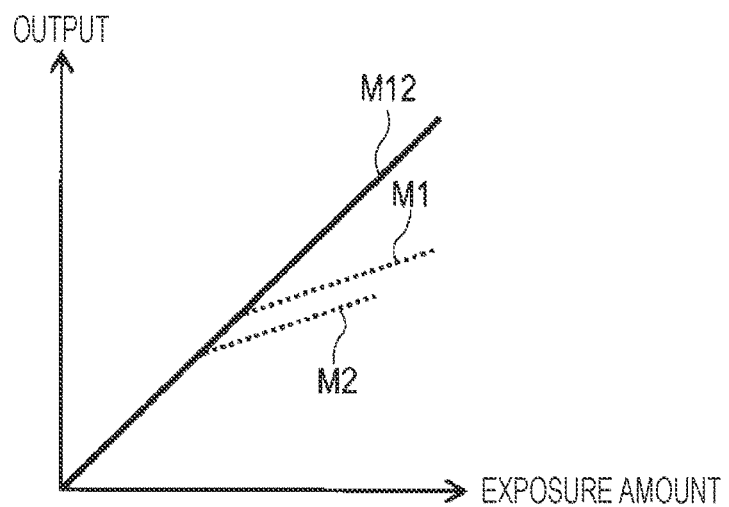
FIG. 36
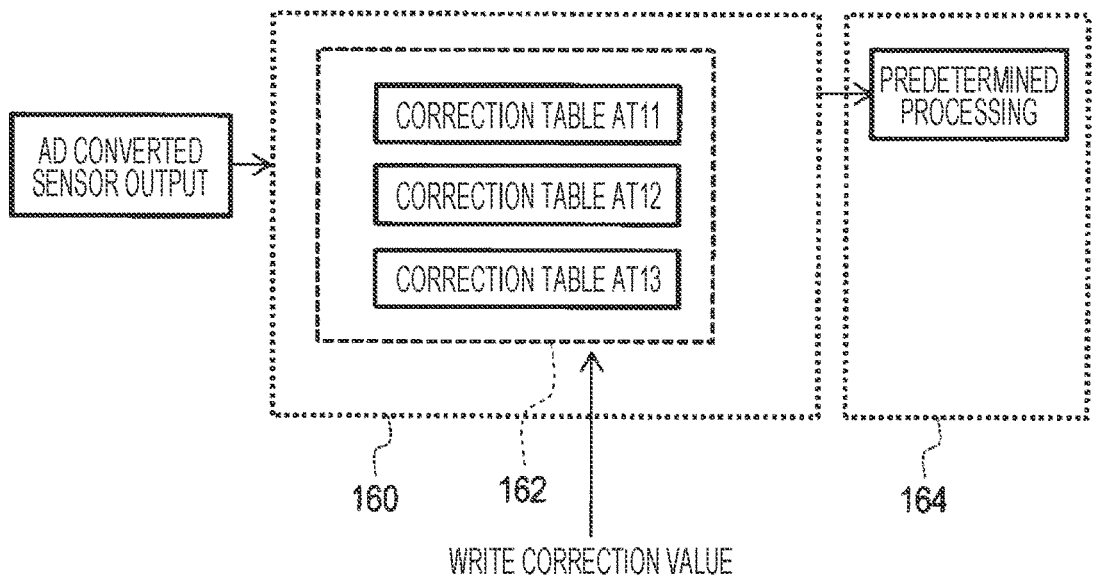
FIG. 37
| SENSOR OUTPUT [LSB] | OUTPUT AFTER CORRECTION IS APPLIED [LSB] |
|---|---|
| 0 | 0 |
| ⋮ | ⋮ |
| N | X |
| ⋮ | ⋮ |

| SENSOR OUTPUT [LSB] | OUTPUT AFTER CORRECTION IS APPLIED [LSB] |
|---|---|
| 0 | 0 |
| ⋮ | ⋮ |
| N | Y |
| ⋮ | ⋮ |

| EXPOSURE AMOUNT | OUTPUT @Va [LSB] | OUTPUT @Vb [LSB] | OUTPUT @Vc [LSB] |
|---|---|---|---|
| 0 | 0 | 0 | 0 |
| e1 | P11 | P12 | P13 |
| e2 | P21 | P22 | P23 |
| e3 | P23 | P23 | P33 |

IMAGING DEVICE AND CAMERA SYSTEM

BACKGROUND

1. Technical Field

The present disclosure relates to an imaging device and a camera system.

2. Description of the Related Art

As a metal oxide semiconductor (MOS) imaging device, a stacked imaging device has been proposed. In a stacked imaging device, a photoelectric conversion layer is stacked on a semiconductor substrate, and charges generated by photoelectric conversion in the photoelectric conversion layer are accumulated in a charge accumulation portion. The accumulated charges are read out by a charge coupled device (CCD) circuit or a complementary MOS (CMOS) circuit provided on the semiconductor substrate. Japanese Unexamined Patent Application Publication No. 2009-164604 discloses such an imaging device.

SUMMARY

One non-limiting and exemplary embodiment provides a technology suitable for realizing a wide dynamic range.

In one general aspect, the techniques disclosed here feature an imaging device including: a charge accumulator that accumulates charges generated by photoelectric conversion; a first transistor having a first source, a first drain, and a first gate electrode electrically connected to one of the first source and the first drain; and a first capacitive element that holds the charges and has a first terminal, in which a fixed potential is supplied to the other of the first source and the first drain, and one of the first source and the first drain is always electrically connected to the first terminal of the first capacitive element from start to end of an exposure period.

The technology according to the present disclosure is suitable for realizing a wide dynamic range.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 32 is a diagram schematically illustrating an example of changes in output from a horizontal signal readout circuit with respect to an increase in amount of exposure;

FIG. 33 is a block diagram schematically illustrating an overview of linearity compensation processing;

FIG. 34 is a diagram illustrating an example of a correction table;

FIG. 35 is a diagram for explaining a difference in linearity deviation for each imaging device or for each camera system;

FIG. 36 is a block diagram schematically illustrating an overview of linearity compensation processing for canceling differences between imaging devices or camera systems;

FIG. 37 is a diagram illustrating an example of a correction table stored in a memory of an imaging device of sample S1;

DETAILED DESCRIPTIONS

Figure 1:
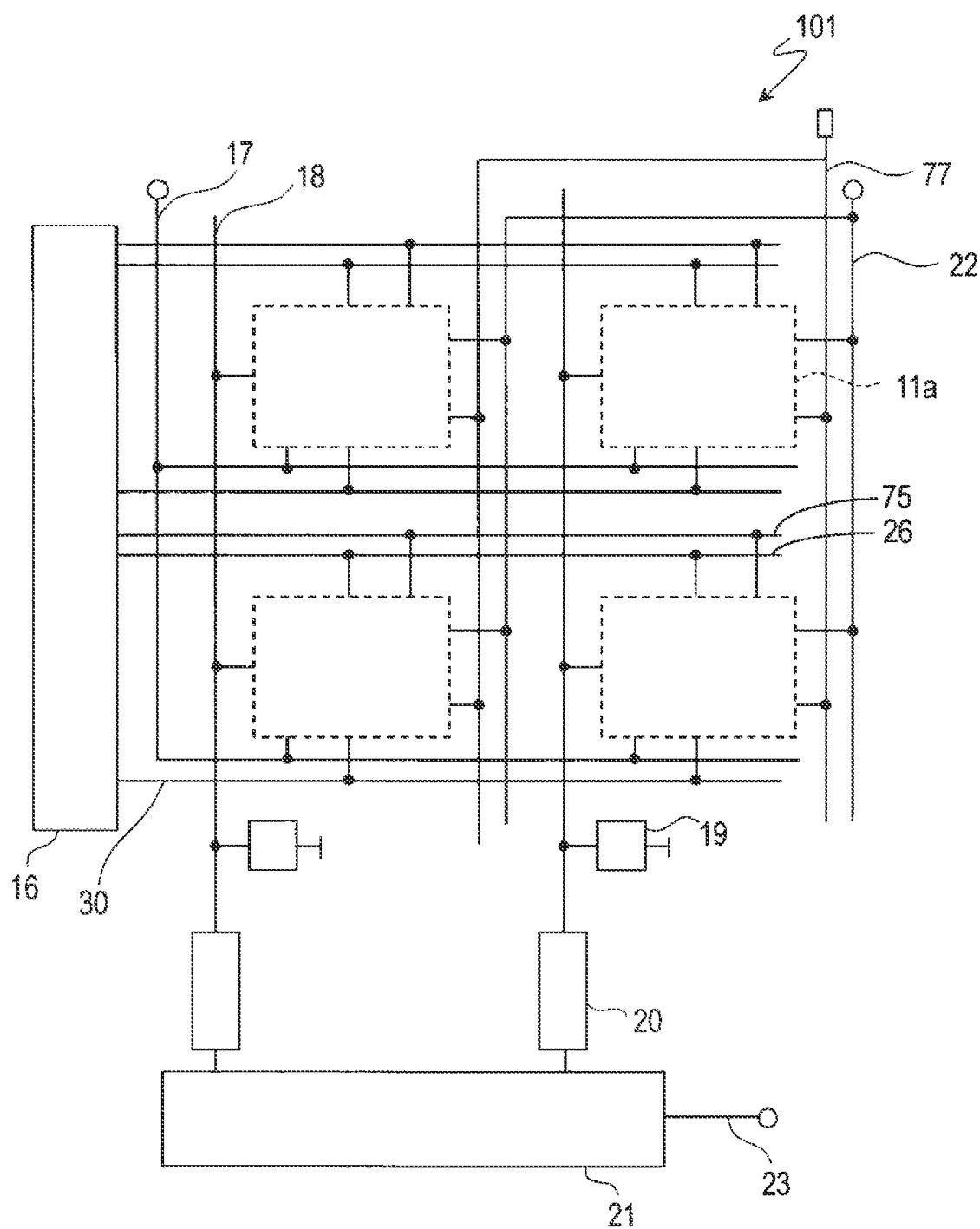
FIG. 1 is a schematic diagram illustrating an exemplary circuit configuration of an imaging device according to a first embodiment.

Overview of One Aspect According to Present Disclosure

An imaging device according to a first aspect of the present disclosure includes:
a charge accumulator that accumulates charges generated by photoelectric conversion;
a first transistor having a first source, a first drain, and a first gate electrode electrically connected to one of the first source and the first drain; and
a first capacitive element that holds the charges and has a first terminal, in which
a fixed potential is supplied to the other of the first source and the first drain, and one of the first source and the first drain is always electrically connected to the first terminal of the first capacitive element from start to end of an exposure period.

This configuration makes it possible to realize an imaging device having pseudo-gamma characteristics.

An imaging device according to a second aspect of the present disclosure is, for example, the imaging device according to the first aspect, further including
an amplifying transistor that outputs an electric signal according to a potential of the charge accumulator.

This configuration makes it possible to detect an electric signal corresponding to the illuminance of light incident on the imaging device.

An imaging device according to a third aspect of the present disclosure is, for example, the imaging device according to the first or second aspect, further including
a second transistor having a second source, a second drain, and a second gate electrode, in which
a fixed potential is supplied to the other of the first source and the first drain through the second transistor.

With this configuration, the charges accumulated in the first source or the first drain can be discharged during a reset period.

An imaging device according to a fourth aspect of the present disclosure is, for example, the imaging device according to the first or second aspect, further including
a second transistor having a second source, a second drain, and a second gate electrode, in which
one of the second source and the second drain is electrically connected to the other of the first source and the first drain, and
a fixed potential is supplied to the other of the second source and the second drain.

With this configuration, the charges accumulated in the first source or the first drain can be discharged during the reset period.

An imaging device according to a fifth aspect of the present disclosure is, for example, the imaging device according to any one of the first to fourth aspects, in which
the first gate electrode of the first transistor is connected to one of the first source and the first drain through the first capacitive element.

With this configuration, a capacitance value of charge accumulation capacitor can be changed in response to a change in potential of the charge accumulator.

An imaging device according to a sixth aspect of the present disclosure is, for example, the imaging device according to any one of the first to fifth aspects, further including
a semiconductor substrate and a photoelectric converter that generates the charges by photoelectric conversion, in which
the photoelectric converter is located in the semiconductor substrate.

This configuration makes it possible to form a photodiode using the semiconductor substrate.

An imaging device according to a seventh aspect of the present disclosure is, for example, the imaging device according to any one of the first to fifth aspects, further including
a semiconductor substrate and a photoelectric converter that generates the charges by photoelectric conversion, in which
the photoelectric converter is located on the semiconductor substrate.

This configuration makes it possible to form a photodiode independently of the semiconductor substrate.

An imaging device according to an eighth aspect of the present disclosure is, for example, the imaging device according to any one of the first to seventh aspects, in which the first capacitive element includes a MIM capacitor.

This configuration makes it possible to expand a dynamic range.

An imaging device according to a ninth aspect of the present disclosure includes:
 a charge accumulator that accumulates charges generated by photoelectric conversion;
 a node electrically connected to the charge accumulator; and
 a circuit, in which
 the circuit includes
  a first transistor having a first source, a first drain, and a first gate electrode electrically connected to one of the first source and the first drain, and
  a first capacitive element that holds the charges and has a first terminal, and
 a fixed potential is supplied to the other of the first source and the first drain, and the other of the first source and the first drain is always electrically connected to the first terminal of the first capacitive element.

This configuration makes it possible to realize an imaging device having pseudo-gamma characteristics.

An imaging device according to a tenth aspect of the present disclosure is, for example, the imaging device according to the ninth aspect, in which,
 when a capacitor electrically connected to the node is defined as a charge accumulation capacitor, the circuit changes a capacitance value of the charge accumulation capacitor in response to a change in potential of the charge accumulator.

This configuration makes it possible to realize an imaging device having pseudo-gamma characteristics.

An imaging device according to an eleventh aspect of the present disclosure is, for example, the imaging device according to the tenth aspect, in which,
 the circuit changes, in response to a change in potential of the charge accumulator, the capacitance value of the charge accumulation capacitor according to a capacitance value of the first capacitive element.

This configuration makes it possible to realize an imaging device having pseudo-gamma characteristics.

An imaging device according to a twelfth aspect of the present disclosure is, for example, the imaging device according to the tenth or eleventh aspect, in which,
 when the potential of the charge accumulator changes beyond a first threshold potential, the circuit changes the capacitance value of the charge accumulation capacitor.

With this configuration, an electric signal corresponding to the quantity of light can be properly generated for a region with a larger quantity of light.

An imaging device according to a thirteenth aspect of the present disclosure is, for example, the imaging device according to the twelfth aspect, further including
 a control circuit, in which
 the control circuit controls the first threshold potential by applying a control potential to the circuit.

With this configuration, an electric signal corresponding to the quantity of light can be properly generated for a region with a larger quantity of light.

An imaging device according to a fourteenth aspect of the present disclosure is, for example, the imaging device according to the twelfth or thirteenth aspect, further including
 a control circuit, in which
 the control circuit switches the first threshold potential according to a shooting mode.

This configuration makes it possible to realize an imaging device having pseudo-gamma characteristics suitable for the shooting mode.

A camera system according to a fifteenth aspect of the present disclosure includes
 an imaging device and a control circuit, in which
 the imaging device includes
  a charge accumulator that accumulates charges generated by photoelectric conversion,
  a first transistor having a first source, a first drain, and a first gate electrode electrically connected to one of the first source and the first drain, and
  a first capacitive element that holds the charges and has a first terminal, and
 a fixed potential is supplied to the other of the first source and the first drain, and
 one of the first source and the first drain is always electrically connected to the first terminal of the first capacitive element from start to end of an exposure period.

This configuration makes it possible to realize an imaging device having pseudo-gamma characteristics.

An imaging device according to a sixteenth aspect of the present disclosure includes:
 a charge accumulator that accumulates charges generated by photoelectric conversion;
 a node electrically connected to the charge accumulator; and
 a specific circuit having a first capacitive element, in which,
 when a capacitor electrically connected to the node is defined as a charge accumulation capacitor, the specific circuit changes a capacitance value of the charge accumulation capacitor in response to a change in potential of the charge accumulator.

The technology according to the sixteenth aspect is suitable for realizing a wide dynamic range.

According to a seventeenth aspect of the present disclosure, in the imaging device according to the sixteenth aspect, for example,
 in response to the change in potential of the charge accumulator, the specific circuit may change the capacitance value of the charge accumulation capacitor according to the capacitance value of the first capacitive element.

The configuration of the seventeenth aspect is a specific example of how to change the capacitance value of the charge accumulation capacitor.

According to an eighteenth aspect of the present disclosure, in the imaging device according to the sixteenth or seventeenth aspect, for example,
 the specific circuit may change the capacitance value of the charge accumulation capacitor when the potential of the charge accumulator changes beyond a first threshold potential.

The configuration of the eighteenth aspect is a specific example of how to change the capacitance value of the charge accumulation capacitor.

According to a nineteenth aspect of the present disclosure, for example, the imaging device according to the eighteenth aspect may further include a control circuit, and
 the control circuit may control the first threshold potential by applying a control potential to the specific circuit.

According to the nineteenth aspect, the first threshold potential can be controlled.

According to a twentieth aspect of the present disclosure, for example, the imaging device according to the eighteenth or nineteenth aspect may further include a control circuit, and the control circuit may switch the first threshold potential according to a shooting mode.

According to the twentieth aspect, the potential of the charge accumulator can be set for each shooting mode when the capacitance value of the charge accumulation capacitor changes.

According to a twenty-first aspect of the present disclosure, for example, in the imaging device according to the twentieth aspect, the specific circuit may further include a first transistor, and the shooting mode may include a first mode and a second mode, in the first mode, the first transistor may be maintained in an off state, in the second mode, the capacitance value of the charge accumulation capacitor may increase when or after the first transistor is turned on in response to a change in potential of the charge accumulator.

The configuration of the twenty-first aspect is one configuration example.

According to a twenty-second aspect of the present disclosure, for example, the imaging device according to any one of the sixteenth to twenty-first aspects may further include an amplifying transistor, and the amplifying transistor may output an electric signal corresponding to the potential of the charge accumulator, when the illuminance of light incident on the imaging device increases beyond a threshold illuminance, a ratio of an increase in level of the electric signal to an increase in illuminance of light incident on the imaging device may decrease.

According to the twenty-second aspect, pseudo-gamma characteristics are achieved.

According to a twenty-third aspect of the present disclosure, for example, in the imaging device according to any one of the sixteenth to twenty-second aspects, the specific circuit may further include a first transistor, the first transistor may have a first source, a first drain, and a first gate electrode, the first capacitive element may have a first terminal and a second terminal, the first gate electrode may be electrically connected to the charge accumulator, and the first source or the first drain may be electrically connected to the first terminal.

According to the twenty-third aspect, the feature of the sixteenth aspect can be realized by applying a control potential to the second terminal of the first capacitive element.

According to a twenty-fourth aspect of the present disclosure, for example, in the imaging device according to any one of the sixteenth to twenty-second aspects, the specific circuit may further include a first transistor, the first transistor may have a first source, a first drain, and a first gate electrode, the first capacitive element may have a first terminal and a second terminal, the first gate electrode may be electrically connected to the first terminal, and the first source or the first drain may be electrically connected to the charge accumulator.

According to the twenty-fourth aspect, the feature of the sixteenth aspect can be achieved by applying a control potential to the second terminal of the first capacitive element.

According to a twenty-fifth aspect of the present disclosure, for example, in the imaging device according to any one of the sixteenth to twenty-second aspects, the specific circuit may further include a first transistor, the first transistor may have a first source, a first drain, and a first gate electrode, the first capacitive element may have a first terminal and a second terminal, the first gate electrode may be electrically connected to the first terminal and the charge accumulator, and one of the first source and the first drain may be electrically connected to the second terminal.

According to the twenty-fifth aspect, the feature of the sixteenth aspect can be realized by applying a control potential to the other of the first source and the first drain.

According to a twenty-sixth aspect of the present disclosure, for example, the imaging device according to the twenty-fifth aspect may further include a control circuit, the control circuit may apply a control potential to the other of the first source and the first drain, and the control circuit may also apply a reset potential to the charge accumulator during a reset period, during a period included in the reset period, the control circuit may temporarily turn on the first transistor by changing the level of the reset potential in a pulsed manner.

According to the twenty-sixth aspect, in the reset period, the potential of the second terminal can be reset as the potential of the charge accumulator is reset.

According to a twenty-seventh aspect of the present disclosure, for example, the imaging device according to the twenty-fifth or twenty-sixth aspect may further include a control circuit, the control circuit may apply a control potential to the other of the first source and the first drain, and the control circuit may also apply a reset potential to the charge accumulator during a reset period, during a period included in the reset period, the control circuit may temporarily short-circuit the first source and the first drain of the first transistor in its off state by changing the level of the control potential in a pulsed manner.

According to the twenty-seventh aspect, in the reset period, the potential of the second terminal can be reset as the potential of the charge accumulator is reset.

According to a twenty-eighth aspect of the present disclosure, for example, in the imaging device according to any one of the sixteenth to twenty-seventh aspects, the specific circuit may further include a second capacitive element, and the specific circuit may change the capacitance value of the charge accumulation capacitor when the potential of the charge accumulator changes beyond a first threshold potential and when the potential of the charge accumulator changes beyond a second threshold potential.

The configuration of the twenty-eighth aspect is a specific example of how to change the capacitance value of the charge accumulation capacitor.

According to a twenty-ninth aspect of the present disclosure, for example, in the imaging device according to any one of the sixteenth to twenty-eighth aspects, the first capacitive element may include at least one selected from the group consisting of a MIM capacitor, a MOM capacitor, and a MOS capacitor.

The MIM capacitor, the MOM capacitor, and the MOS capacitor are specific examples of the first capacitive element.

A camera system according to a thirtieth aspect of the present disclosure includes an imaging device and a control circuit, in which
the imaging device includes
a charge accumulator that accumulates charges generated by photoelectric conversion,
a node electrically connected to the charge accumulator, and
a specific circuit having a first capacitive element,
when a capacitor electrically connected to the node is defined as a charge accumulation capacitor, the specific circuit changes a capacitance value of the charge accumulation capacitor when the potential of the charge accumulator changes beyond a first threshold potential, and
the control circuit controls the first threshold potential by applying a control potential to the specific circuit.

The technology according to the thirtieth aspect is suitable for realizing a wide dynamic range.

In embodiments, terms such as "upper" and "lower" are used only to specify positional relationships between members, and are not intended to limit the orientation of the imaging device when in use.

In the embodiments, appropriate adjustment may be made for each element as the positive and negative signs of signal charges change, such as changing the conductivity type of impurity regions. In addition, the terms may be appropriately replaced as the positive and negative signs of signal charges change.

In the embodiments, the term "node" may be used. A node means an electrical connection between a plurality of elements in an electric circuit, and is a concept that includes wiring and the like responsible for electrical connection between the elements.

Figure 4:
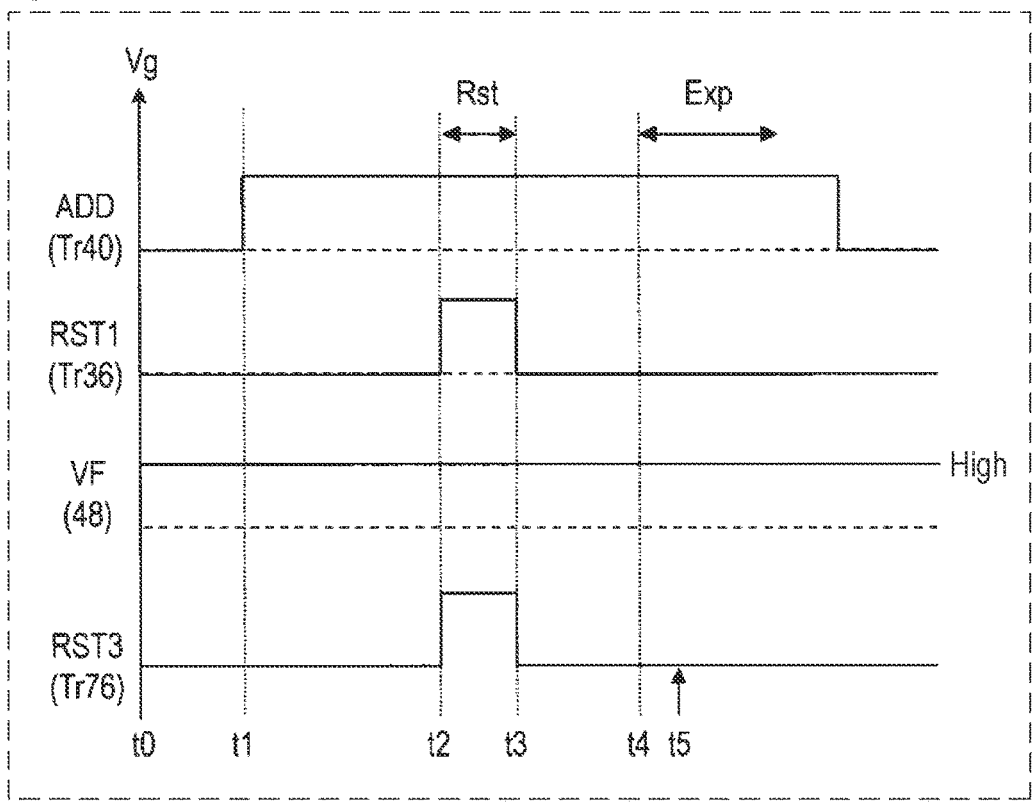
FIG. 4 is a timing chart for explaining an operation example of a transistor in a first mode in the imaging device according to the first embodiment.

In the embodiments, the terms "illuminance" and "light quantity" may be used. The illuminance means the luminous flux incident per unit area, typically in units of lux. Strictly speaking, the "light quantity" means a time integrated value of the luminous flux for an exposure period belonging to one frame period. One frame period refers to one control period of timing control of transistors in a pixel as illustrated in FIG. 4 and the like. The "light quantity" is also referred to as "exposure amount".

In the following embodiments, the expression that "a charge accumulator is electrically connected to an element X" may be used. To be more specific, in the following embodiments, the above expression may be used even when the charge accumulator includes part or all of the element X. For this reason, the above expression should be interpreted as including a case where the charge accumulator includes part or all of the element X. Also, in the following embodiments, the charge accumulator and other elements may be enumerated, such as "having/including the charge accumulator and the element X". To be more specific, in the following embodiments, such enumeration may be made even when the charge accumulator includes part or all of the element X. In such a situation where the enumeration is made, it should be acceptable that the charge accumulator includes part or all of the element X. For example, in the following embodiments, one of the first source and first drain of the first transistor may be included in the charge accumulator. One of the source and drain of a first reset transistor may be included in the charge accumulator. A photoelectric converter may be included in the charge accumulator.

The expressions "the first capacitive element is connected to the first transistor" and "having/including the first capacitive element and the first transistor" should be interpreted as including a case where the first capacitive element is configured using the first transistor. That is, this expression should be interpreted as including a case where the first capacitive element and the first transistor partially or wholly overlap.

In the embodiments, ordinal numbers such as first, second, third, and so on may be used. When an ordinal number is assigned to a certain element, it is not essential that there be elements of the same kind with lower numbers. It is also possible to change the ordinal number, to delete the ordinal number, or to add the ordinal number as necessary.

Hereinafter, embodiments of the present disclosure will be specifically described with reference to the drawings.

However, more detailed description than necessary may be omitted. For example, detailed description of already well-known matters or redundant description of substantially the same configuration may be omitted. This is for avoiding the unnecessary redundancy of the following description and facilitating the understanding of those skilled in the art. It should be noted that the accompanying drawings and the following description are provided so that those skilled in the art can sufficiently understand the present disclosure, and they are not intended to limit the claimed subject matter.

In the drawings, elements having substantially the same configuration, operation, and effect are denoted by the same reference numerals. Numerical values described below are all used to specifically describe the present disclosure, and the present disclosure is not limited to those illustrative numerical values. Moreover, connections between components are used to specifically describe the present disclosure, and connections for achieving functions of the present disclosure are not limited thereto.

First Embodiment

FIG. 1 schematically illustrates an exemplary circuit configuration of an imaging device 101 according to a first embodiment. The imaging device 101 illustrated in FIG. 1 includes a plurality of pixels 11a and peripheral circuits. The plurality of pixels 11a are arranged two-dimensionally on a semiconductor substrate to form a photosensitive region. The photosensitive region may also be referred to as a pixel region. The semiconductor substrate is, for example, a silicon substrate. The semiconductor substrate is not limited to a substrate that is entirely made of a semiconductor material. The semiconductor substrate may include an insulating substrate and a semiconductor layer provided on the insulating substrate. The photosensitive region may be formed on the semiconductor layer side.

In the example illustrated in FIG. 1, the plurality of pixels 11a are arranged in a row direction and a column direction. In this specification, the row direction and the column direction refer to directions in which rows and columns extend, respectively. In page space of the drawings, the vertical direction is the column direction and the horizontal direction is the row direction. The plurality of pixels 11a may be arranged one-dimensionally. In other words, the imaging device 101 can be a line sensor.

Each pixel 11a is connected to a power supply wiring 22. A predetermined power supply voltage is supplied to each pixel 11a through the power supply wiring 22. As will be described in detail later, each pixel 11a in this embodiment includes a photoelectric converter laminated on the semiconductor substrate. The "photoelectric converter laminated on the semiconductor substrate" is an expression intended to include a configuration in which other elements are interposed between the semiconductor substrate and the photoelectric converter. As illustrated in FIG. 1, the imaging device 101 has a accumulation control line 17 for applying the same fixed voltage to all the photoelectric converters.

Each pixel 11a is also connected to a reset voltage line 77. A reset potential Vrst is supplied to each pixel 11a through the reset voltage line 77.

The peripheral circuits of the imaging device 101 include a vertical scanning circuit 16, a load circuit 19, a column signal processing circuit 20, and a horizontal signal readout circuit 21. The vertical scanning circuit 16 may also be referred to as a row scanning circuit 16. The column signal processing circuit 20 may also be referred to as a row signal accumulation circuit 20. The horizontal signal readout circuit 21 may also be referred to as a column scanning circuit 21. The column signal processing circuit 20 and the load circuit 19 are arranged for each column of the two-dimensionally arranged pixels 11a. That is, in this example, the peripheral circuits include a plurality of column signal processing circuits 20 and a plurality of load circuits 19.

An address signal line 30 is provided for each row of the pixels 11a. The pixels 11a in each row are electrically connected to the vertical scanning circuit 16 through the corresponding address signal line 30. By applying a predetermined voltage to the address signal line 30, the vertical scanning circuit 16 selects the plurality of pixels 11a arranged in each row on a row-by-row basis. Thus, electric signals are read out from the selected pixels 11a.

A reset signal line 26 is provided for each row of the pixels 11a. The pixels 11a in each row are electrically connected to the vertical scanning circuit 16 through the corresponding reset signal line 26.

A specific reset signal line 75 is provided for each row of the pixels 11a. The pixels 11a in each row are electrically connected to the vertical scanning circuit 16 through the corresponding specific reset signal line 75.

A vertical signal line 18 is provided for each column of the pixels 11a. The pixels 11a in each column are electrically connected to the corresponding vertical signal lines 18.

The load circuit 19 is provided for each vertical signal line 18. Each load circuit 19 is electrically connected to the corresponding vertical signal line 18.

The column signal processing circuit 20 is provided for each vertical signal line 18. Each column signal processing circuit 20 is electrically connected to the corresponding vertical signal line 18. The column signal processing circuit 20 performs noise suppression signal processing, analog-digital conversion (AD conversion), and the like. The noise suppression signal processing is, for example, correlated double sampling. A plurality of column signal processing circuits 20 are electrically connected to the horizontal signal readout circuit 21. The horizontal signal readout circuit 21 sequentially reads signals from the plurality of column signal processing circuits 20 to a horizontal common signal line 23.

Figure 2:
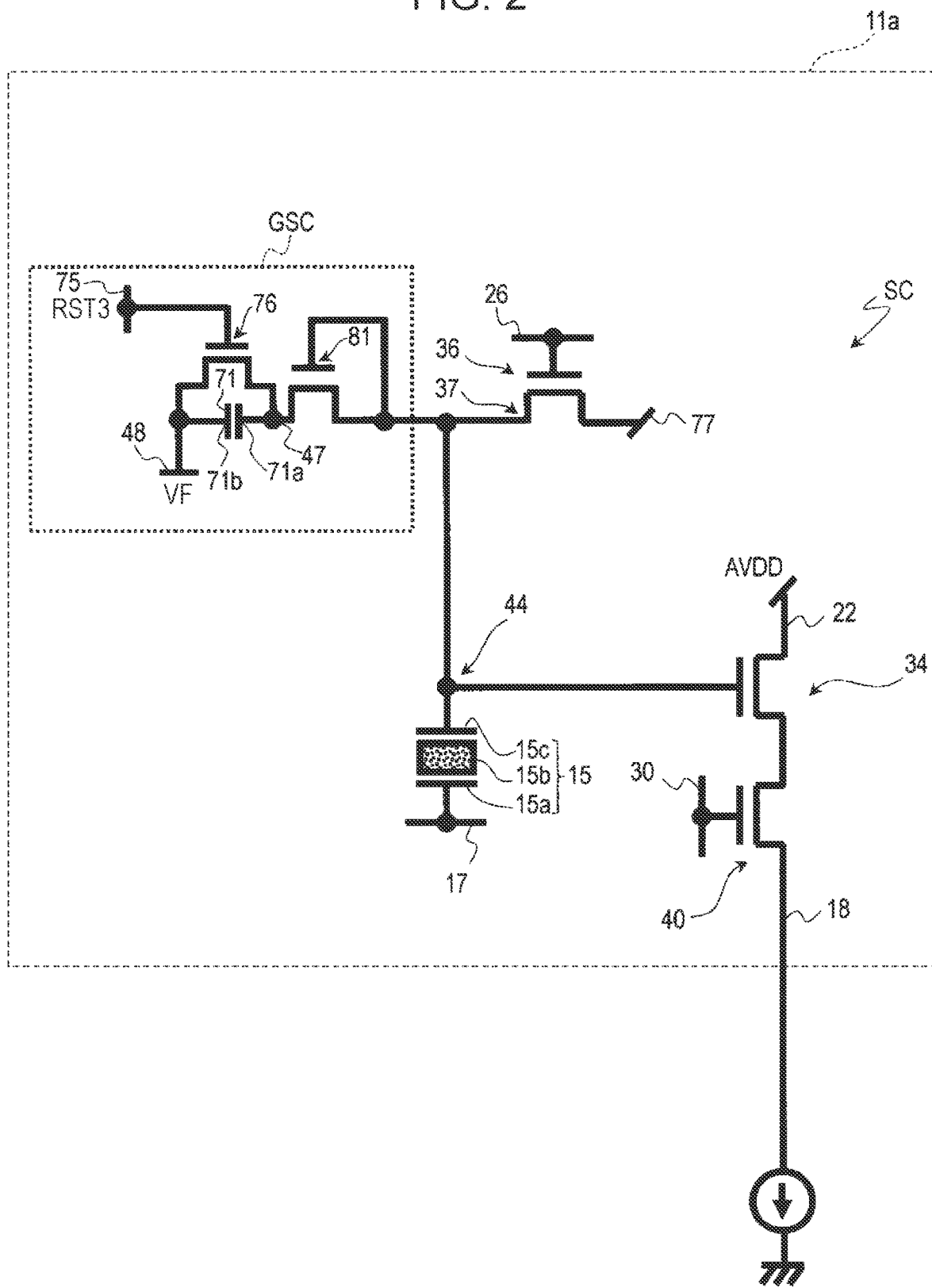
FIG. 2 is a schematic diagram illustrating an exemplary circuit configuration of a pixel illustrated in FIG. 1.

FIG. 2 illustrates an exemplary circuit configuration of the pixel 11a illustrated in FIG. 1. The pixel 11a includes a photoelectric converter 15, a signal detection circuit SC, and a specific circuit GSC.

In the pixel 11a, charges are generated by photoelectric conversion. Hereinafter, these charges may be referred to as signal charges. To be more specific, the photoelectric converter 15 converts light into charges.

In this embodiment, the photoelectric converter 15 has a counter electrode 15a, a photoelectric conversion layer 15b, and a pixel electrode 15c. The photoelectric conversion layer 15b is arranged between the counter electrode 15a and the pixel electrode 15c.

The photoelectric conversion layer 15b is stacked on the semiconductor substrate in the pixel region. The material of the photoelectric conversion layer 15b may be an organic material or an inorganic material. Examples of the inorganic material include amorphous silicon. The photoelectric conversion layer 15b may include a layer made of an organic material and a layer made of an inorganic material. The photoelectric conversion layer 15b typically has a film shape.

The counter electrode 15a is provided on the light receiving surface side of the photoelectric conversion layer 15b. Light enters the photoelectric conversion layer 15b through the counter electrode 15a. The material of the counter electrode 15a is typically a transparent conductive material. Examples of the transparent conductive material include indium tin oxide (ITO).

The pixel electrode 15c is provided on the side facing the counter electrode 15a with the photoelectric conversion layer 15b interposed therebetween. The pixel electrode 15c collects signal charges generated by photoelectric conversion in the photoelectric conversion layer 15b. The material of the pixel electrode 15c is, for example, metal, metal compound, polysilicon, or the like. Examples of metal include aluminum, copper, and the like. Examples of metal compound include metal nitride. Polysilicon may be doped with impurities to impart conductivity.

The counter electrode 15a is electrically connected to the accumulation control line 17. The pixel electrode 15c is electrically connected to a node 44. In the example illustrated in FIG. 2, the node 44 may also be referred to as a charge accumulation node or floating diffusion node.

The potential of the counter electrode 15a is controlled through the accumulation control line 17. Thus, among hole-electron pairs generated by photoelectric conversion in the photoelectric conversion layer 15b, either holes or electrons can be collected by the pixel electrode 15c. In this embodiment, holes are collected as signal charges by the pixel electrode 15c.

When the holes are used as the signal charges, the potential of the counter electrode 15a is set so that the potential of the counter electrode 15a exceeds the potential of the pixel electrode 15c. A case where the holes are used as the signal charges will be described below. A voltage of about 10 V, for example, is applied to the counter electrode 15a through the accumulation control line 17. Alternatively, electrons may be used as the signal charges.

A photodiode can also be used as the photoelectric converter 15. The photodiode can be disposed in the semiconductor substrate.

A charge accumulator 37 is electrically connected to the node 44. The charges generated by photoelectric conversion are accumulated in the charge accumulator 37. To be more specific, the charges generated by photoelectric conversion in the photoelectric converter 15 are accumulated in the charge accumulator 37. In this embodiment, the charge accumulator 37 is a diffusion region provided in the semiconductor substrate.

During exposure, the photoelectric converter 15, the charge accumulator 37, and the specific circuit GSC are electrically connected. When the photoelectric converter 15 has the counter electrode 15a, the photoelectric conversion layer 15b, and the pixel electrode 15c, "exposure" can be realized by applying a voltage to the counter electrode 15a. In the example illustrated in FIG. 2, no transfer transistor is provided between the photoelectric converter 15 and the charge accumulator 37, thus realizing the electrical connection configuration described above.

The signal detection circuit SC includes an amplifying transistor 34, an address transistor 40, and a first reset transistor 36.

One of the source and drain of the first reset transistor 36 is electrically connected to the node 44. In this embodiment, one of the source and drain of the first reset transistor 36 constitutes the charge accumulator 37. The other of the source and drain of the first reset transistor 36 is electrically connected to the reset voltage line 77.

The amplifying transistor 34 has its gate electrode electrically connected to the node 44, the charge accumulator 37, and the photoelectric converter 15. To be more specific, the gate electrode of the amplifying transistor 34 is electrically connected to the pixel electrode 15c. One of the source and drain of the amplifying transistor 34 is electrically connected to the power supply wiring 22. The other of the source and drain of the amplifying transistor 34 is electrically connected to one of the source and drain of the address transistor 40. The other of the source and drain of the address transistor 40 is electrically connected to the vertical signal line 18. The address transistor 40 has its gate electrode connected to the address signal line 30.

In the example illustrated in FIG. 2, the amplifying transistor 34 has its drain electrically connected to the power supply wiring 22. The amplifying transistor 34 has its source connected to the vertical signal line 18 through the address transistor 40.

In the example illustrated in FIG. 2, the power supply wiring 22 is a source follower power supply. A source follower circuit is formed by the amplifying transistor 34 and the load circuit 19 illustrated in FIG. 1.

The charge accumulator 37 has a potential corresponding to the amount of signal charges accumulated in the charge accumulator 37. Therefore, the potential corresponding to the amount of signal charges accumulated in the charge accumulator 37 is applied to the gate electrode of the amplifying transistor 34. The amplifying transistor 34 outputs an electric signal corresponding to this potential. The electric signal is selectively read out by the address transistor 40. The electric signal is specifically a signal voltage.

The first reset transistor 36 resets the potential of the charge accumulator 37. To be more specific, when the first reset transistor 36 is turned on, the reset potential Vrst is supplied from the reset voltage line 77 to the charge accumulator 37 through the first reset transistor 36, and the potential of the charge accumulator 37 is reset.

The specific circuit GSC includes a first capacitive element 71, a first transistor 81, and a specific reset transistor 76. The first capacitive element 71 includes a first terminal 71a, a second terminal 71b, and a dielectric layer.

The first capacitive element 71 may include at least one selected from the group consisting of a metal-insulator-metal (MIM) capacitor, a metal-oxide-metal (MOM) capacitor, and a metal-oxide-semiconductor (MOS) capacitor. The same applies to the second capacitive element 72 and third capacitive element 73 to be described later.

In this embodiment, the first capacitive element 71 is the MIM capacitor or MOM capacitor. When the first capacitive element 71 is the MIM capacitor or MOM capacitor, it is easy to realize the first capacitive element 71 with a large capacitance value. This is advantageous from the point of view of realizing a wide dynamic range.

To be more specific, the first capacitive element 71, which is the MIM capacitor or MOM capacitor, can be provided outside the semiconductor substrate. More specifically, such a first capacitive element 71 can be provided between the semiconductor substrate and the photoelectric converter 15. This means that the capacitance value of the first capacitive element 71 can be increased without being restricted by the layout of the elements on the semiconductor substrate.

Note that there are capacitive elements that are both MIM and MOM capacitors. The expression "the first capacitive element 71 is the MIM capacitor or MOM capacitor" is intended to include a configuration in which the first capacitive element 71 is the MIM capacitor and the MOM capacitor.

Hereinafter, a source of the first transistor 81 may be referred to as a first source. A drain of the first transistor 81 may be referred to as a first drain. A gate electrode of the first transistor 81 may be referred to as a first gate electrode.

In this embodiment, the first gate electrode is electrically connected to the charge accumulator 37. One of the first source and the first drain is electrically connected to the charge accumulator 37. The other of the first source and the first drain is electrically connected to the first terminal 71a. In this embodiment, a control potential VF is applied to the second terminal 71b from the control circuit of the imaging device 101. This control potential VF may be a fixed potential. The same applies to the following description. The fixed potential refers to a specified potential or ground potential.

To be more specific, in this embodiment, one of the first source and the first drain constitutes the charge accumulator 37. More specifically, the charge accumulator 37 also has a function to accumulate signal charges, a function as one of the source and drain of the first reset transistor 36, and a function as one of the first source and the first drain of the first transistor 81.

In this embodiment, the first transistor 81 is electrically connected to the first capacitive element 71. To be more specific, at least one selected from the group consisting of the first source, the first drain, and the first gate electrode of the first transistor 81 is electrically connected to at least one selected from the group consisting of the first terminal 71a and the second terminal 71b of the first capacitive element 71. As will be described later, the first capacitive element 71 may be configured using the first transistor 81.

In this embodiment, the control circuit is the vertical scanning circuit 16. However, the control circuit may be provided separately from the vertical scanning circuit 16.

Hereinafter, the node to which the control potential VF is supplied may be referred to as a node 48. In this embodiment, the node 48 is electrically connected to the second terminal 71b of the first capacitive element 71. A node electrically connected to the first source or first drain of the first transistor 81 and to the first capacitive element 71 may be referred to as a node 47. In this embodiment, the node 47 is electrically connected to the other of the first source and the first drain of the first transistor 81 and to the first terminal 71a of the first capacitive element 71. Here, these may be electrically connected at least during the pixel exposure period.

In this embodiment, the control potential VF is a DC potential. The level of the control potential VF, which is the DC potential, may vary from one period to another.

Hereinafter, the term "charge accumulation capacitor X" will be used. The charge accumulation capacitor X is a capacitor electrically connected to the node 44. The charge accumulation capacitor X accumulates charges generated by photoelectric conversion. The charge accumulation capacitor X may include the charge accumulator 37. The charge accumulation capacitor X may include the first capacitive element 71. The charge accumulation capacitor X may exert a function other than the function to accumulate charges. The charge accumulation capacitor X may constitute a combined impedance capacitor.

In this embodiment, the specific circuit GSC changes the capacitance value of the charge accumulation capacitor X in response to a change in potential of the charge accumulator 37. This configuration is suitable for realizing a wide dynamic range. To be more specific, this configuration is suitable for realizing a wide dynamic range while ensuring an SNR at low illuminance.

To be more specific, the potential of the specific circuit GSC changes as the potential of the charge accumulator 37 changes. The specific circuit GSC changes the capacitance value of the charge accumulation capacitor X in response to a change in potential of the specific circuit GSC. As can be understood from this description, in this embodiment, the capacitance value of the charge accumulation capacitor X may change automatically in real time as the potential of the charge accumulator 37 changes in an analog circuit provided in the imaging device 101.

In this embodiment, the specific circuit GSC changes the capacitance value of the charge accumulation capacitor X according to the capacitance value of the first capacitive element 71 in response to a change in potential of the charge accumulator 37. In one specific example, the specific circuit GSC changes the capacitance value of the charge accumulation capacitor X according to the capacitance value of the first capacitive element 71 in response to a change in potential of the charge accumulator 37. The expression "changing the capacitance value of the charge accumulation capacitor X according to the capacitance value of the first capacitive element 71" means that a change in capacitance value of the charge accumulation capacitor X matches the capacitance value of the first capacitive element 71.

In this embodiment, the capacitance value of the first capacitive element 71 is larger than the capacitance value of the charge accumulator 37. However, the capacitance value of the first capacitive element 71 may be the same as the capacitance value of the charge accumulator 37 or may be smaller than the capacitance value of the charge accumulator 37.

In this embodiment, the specific circuit GSC changes the capacitance value of the charge accumulation capacitor X when the potential of the charge accumulator 37 changes beyond the first threshold potential. Such a change in capacitance value can be realized using the first transistor 81.

In this embodiment, the control circuit controls the first threshold potential by applying the control potential VF to the specific circuit GSC. To be more specific, a gate-source voltage of the first transistor 81 changes according to the potential of the charge accumulator 37. The control circuit controls the gate-source voltage when the potential of the charge accumulator 37 is the reset potential Vrst.

In this embodiment, the first transistor 81 is turned on in response to a change in potential of the charge accumulator 37. The capacitance value of the charge accumulation capacitor X increases when or after the first transistor 81 is turned on.

To be more specific, the gate-source voltage of the first transistor 81 changes as the potential of the charge accumulator 37 changes. The capacitance value of the charge accumulation capacitor X increases when or after the first transistor 81 is turned on as the gate-source voltage changes beyond a threshold voltage.

The advantages of this embodiment will be further described below with reference to FIG. 3.

Figure 3:
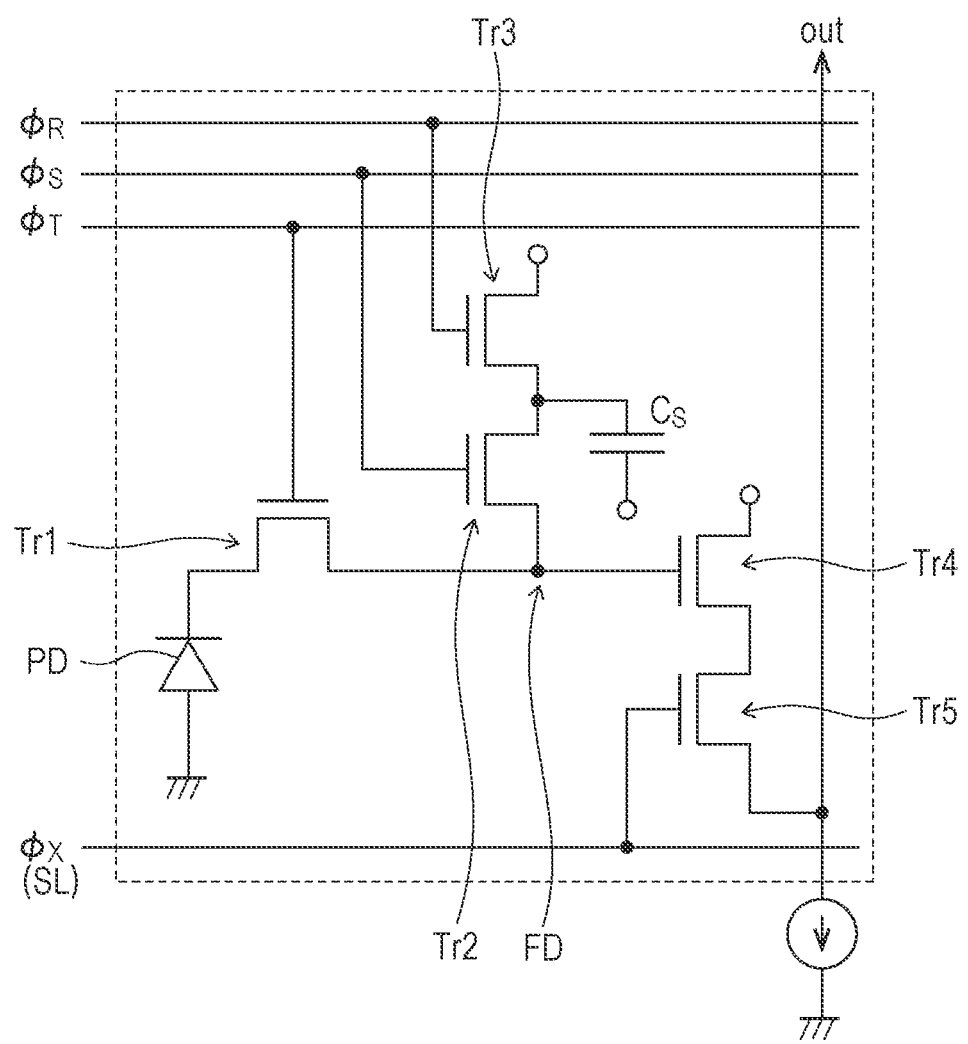
FIG. 3 is a schematic diagram illustrating a circuit configuration according to a reference embodiment.

FIG. 3 is a schematic diagram illustrating a circuit configuration according to a reference embodiment. In the reference embodiment, two readouts, a first readout and a second readout, are performed in one frame. The first readout is a readout of a signal from a floating diffusion FD. The second readout is a readout of a signal from a combined capacitor obtained by combining the floating diffusion FD and a capacitive element $C_S$.

Figure 21:
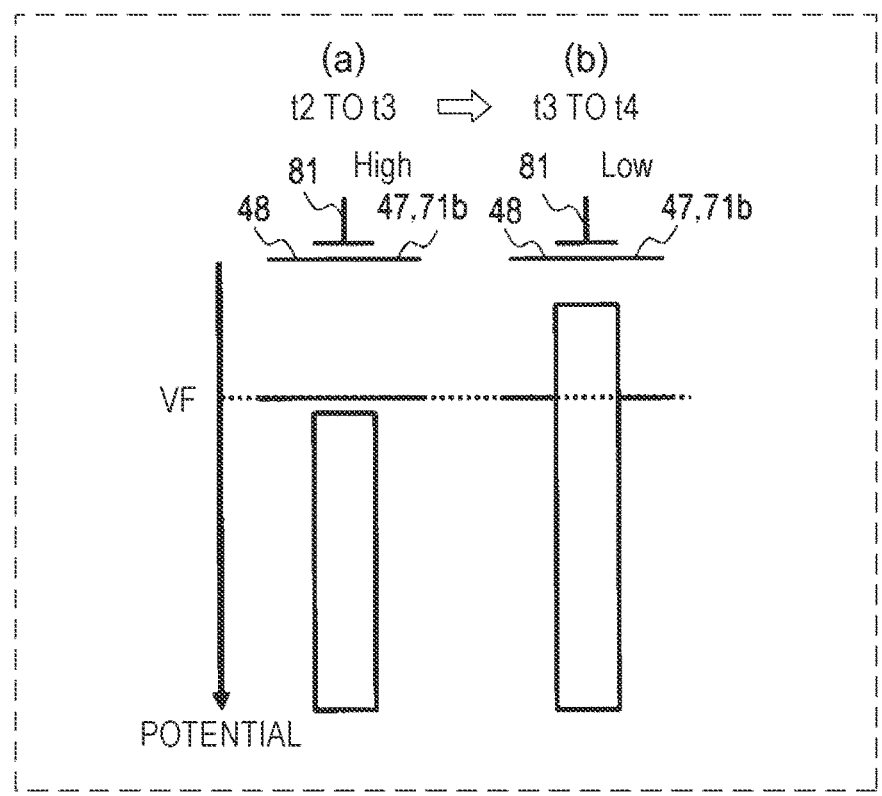
FIG. 21 is a schematic diagram illustrating a typical example of a potential state of the transistor in the second mode in the imaging device according to the fifth embodiment.

The circuit configuration of FIG. 3 corresponds to FIG. 21 of Japanese Patent No. 4317115. The first read corresponds to (E) of FIG. 25 of Japanese Patent No. 4317115. The second readout corresponds to (F) of FIG. 25 of Japanese Patent No. 4317115. A wide dynamic range is described as an effect in Japanese Patent No. 4317115.

However, it takes long to perform the two readouts in the reference embodiment. This is disadvantageous from the point of view of speeding up and reducing power consumption. Also, it is necessary to synthesize images corresponding to the two readouts. The second readout is the readout of the signal from the combined capacitor. The combined capacitor has a large capacitance value. For this reason, it is difficult to ensure a variation width of the signal to be read out from the combined capacitor. This means that it is difficult to ensure the SNR. Further, in the reference embodiment, charges overflowing from the photodiode PD are accumulated in the floating diffusion FD and the capacitive element $C_S$. However, although the overflowing charges can be accumulated, the number of saturated charges is rate-controlled by the photodiode PD in the first readout, and the SNR decreases in the second readout due to the contribution of the capacitive element $C_S$. For these reasons, there is a limit to the expansion of the dynamic range by the two readouts.

On the other hand, in this embodiment, only one signal readout is necessary. This is advantageous from the point of view of speeding up and reducing power consumption. This embodiment does not require image synthesis. In this embodiment, the capacitance value of the charge accumulation capacitor X can be reduced under a low illuminance situation. Therefore, the SNR is easily ensured under the low illuminance situation. Further, in this embodiment, the photoelectric converter 15 and the charge accumulator 37 are electrically connected, and the first capacitive element 71 function as part of the charge accumulation capacitor X in response to a change in potential of the charge accumulator 37. This embodiment is advantageous from the point of view of realizing a wide dynamic range.

In this embodiment, the amplifying transistor 34, the first reset transistor 36, the address transistor 40, the first transistor 81, and the specific reset transistor 76 are each a metal oxide semiconductor field effect transistor (MOSFET), more specifically, an N-channel MOSFET. However, these transistors may be P-channel MOS transistors. It is not necessary that all of these transistors are either N-channel MOS or P-channel MOS transistors. The same applies to a second reset transistor 38, a second transistor 82, and a third transistor 83, which will be described later. As described above, the signal charges may also be holes or electrons.

In this embodiment, the imaging device 101 includes a control circuit. The control circuit switches the first threshold potential according to a shooting mode. To be more specific, the shooting mode has a first mode and a second mode. The control circuit can switch the shooting mode between the first and second modes by changing the first threshold potential. As described above, the control circuit is the vertical scanning circuit 16 in this embodiment.

The second mode may be a higher saturation mode than the first mode. The first mode may be a higher sensitivity mode than the second mode.

In this embodiment, the capacitance value of the charge accumulation capacitor X increases when or after the first transistor 81 is turned on in response to a change in potential of the charge accumulator 37 in the second mode. To be more specific, the capacitance value of the charge accumulation capacitor X increases due to the first capacitive element 71. On the other hand, the first transistor 81 is maintained in the off state in the first mode. Therefore, the capacitance value of the charge accumulation capacitor X does not increase due to the first capacitive element 71.

In this embodiment, as the photoelectric conversion progresses, the potential of the charge accumulator 37 changes and thus the gate-source voltage of the first transistor 81 decreases. The gate-source voltage when the potential of the charge accumulator 37 is the reset potential Vrst in the second mode is lower than that when the potential of the charge accumulator 37 is the reset potential Vrst in the first mode. To be more specific, such a magnitude relationship is set by the control circuit.

In the following examples illustrated in FIGS. 4 to 9B, the control potential VF is set in the second mode so that the specific circuit GSC can change the capacitance value of the charge accumulation capacitor X in response to a change in potential of the charge accumulator 37. In the second mode, pseudo-gamma characteristics can be achieved within the pixel 11a without image processing in a subsequent stage of the imaging device 101. Therefore, a state where the shooting mode is the second mode can be referred to as "auto-gamma ON". On the other hand, the control potential VF is set in the first mode so that the specific circuit GSC does not change the capacitance value of the charge accumulation capacitor X. Therefore, a state where the shooting mode is the first mode can be referred to as "auto-gamma OFF". Thus, in this example, auto-gamma ON and auto-gamma OFF can be switched by controlling the control potential VF.

FIG. 4 is a timing chart for explaining an operation example of the transistors in the first mode in the imaging device 101 according to the first embodiment. In FIG. 4, ADD schematically represents an example of a change in potential of the gate electrode of the address transistor 40. RST1 schematically represents an example of a change in potential of the gate electrode of the first reset transistor 36. VF schematically represents an example of a change in the control potential VF. RST3 schematically represents an example of a change in potential of the gate electrode of the specific reset transistor 76. In the example illustrated in FIG. 4, at time t0, the address transistor 40, the first reset transistor 36, and the specific reset transistor 76 are all off. The control potential VF is maintained at a high level. In FIG. 4, the high level is indicated as High. For simplicity, description of an operation of an electronic shutter will be omitted below.

First, at time t1, the address transistor 40 is turned on by controlling the potential of the address signal line 30. In this event, the signal charge accumulated in the charge accumulation capacitor X is read out.

Next, at time t2, the first reset transistor 36 is turned on by controlling the potential of the reset signal line 26. Thus, the reset potential Vrst is supplied from the reset voltage line 77 to the charge accumulator 37, and the potential of the charge accumulator 37 is reset. The reset potential Vrst is, for example, 1 V. The reset potential Vrst may be 0 V depending on a threshold voltage Vt of the amplifying transistor 34. Here, the threshold voltage Vt refers to a gate-source voltage when a drain current starts to flow through the amplifying transistor 34.

At time t2, the specific reset transistor 76 is turned on by controlling the potential of the specific reset signal line 75. Thus, the control potential VF is supplied to the first terminal 71a of the first capacitive element 71 through the source and drain of the specific reset transistor 76, and the potential of the first terminal 71a is reset. In the first mode, the control potential VF supplied to the first terminal 71a is at high level.

Then, at time t3, the first reset transistor 36 and the specific reset transistor 76 are turned off. Hereinafter, a period from when the first reset transistor 36 and the specific reset transistor 76 are turned on at time t2 to when the first reset transistor 36 and the specific reset transistor 76 are turned off may be referred to as a "reset period". The reset period is a period from time t2 to time t3 in FIG. 4. In FIG. 4, the reset period is schematically indicated by an arrow Rst.

In this embodiment, the period during which the first reset transistor 36 is on and the period during which the specific reset transistor 76 is on are the same, both from time t2 to time t3. This configuration allows simultaneous control of the transistors 36 and 76 and makes it possible to reduce the time required for one frame.

At time t4, exposure is started. In the example illustrated in FIG. 4, there is a time lag between when the first reset transistor 36 and the specific reset transistor 76 are turned off and when the exposure is started. However, the exposure may be started at the same time as the first reset transistor 36 and the specific reset transistor 76 are turned off.

In FIG. 4, the exposure period is schematically indicated by an arrow Exp. The reset voltage is read out at a predetermined timing during the exposure period. This timing corresponds to time t5. Since the time required to read the reset voltage is short, the reset voltage may be read while the address transistor 40 remains on.

By determining a difference between the signal read out between time t1 and time t2 and the signal read out at time t5, a signal from which fixed noise has been removed is obtained. Thus, the signal having the fixed noise removed therefrom is obtained.

Figure 5:
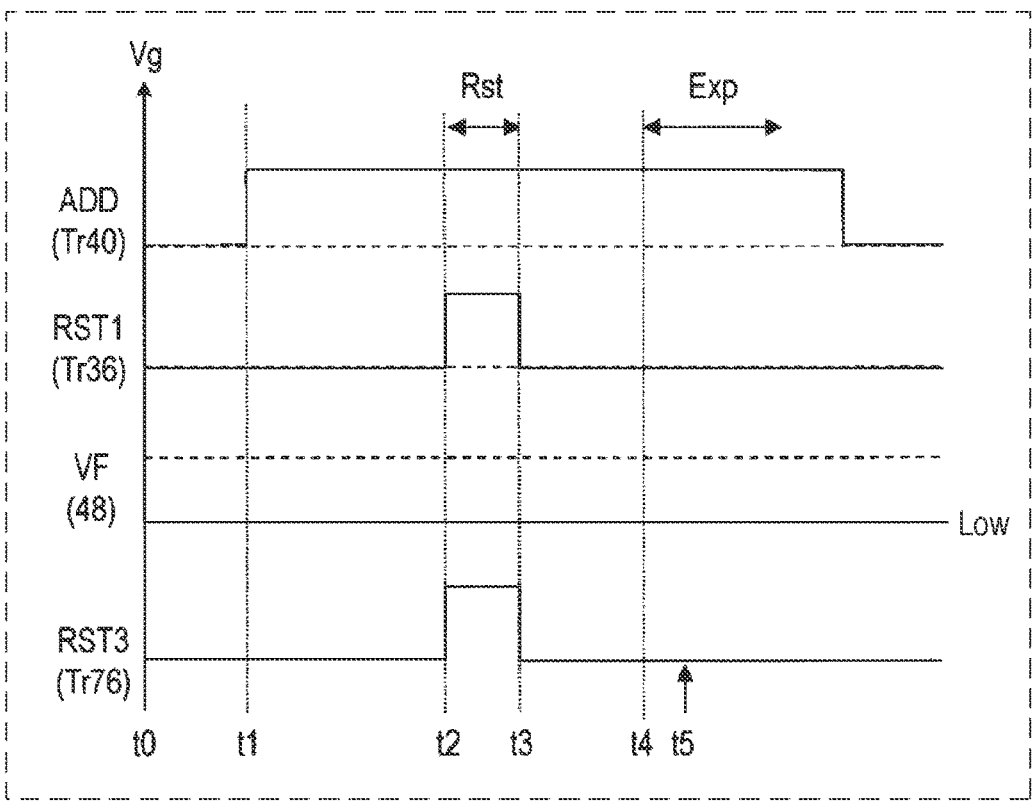
FIG. 5 is a timing chart for explaining an operation example of a transistor in a second mode in the imaging device according to the first embodiment.

FIG. 5 is a timing chart for explaining an operation example of the transistors in the second mode in the imaging device 101 according to the first embodiment. As described above, the second mode is a high saturation mode compared to the first mode. As can be understood from FIGS. 4 and 5, the second mode differs from the first mode in that the control potential VF is maintained at a low level. In FIG. 5, the low level is indicated as Low.

Figure 6:
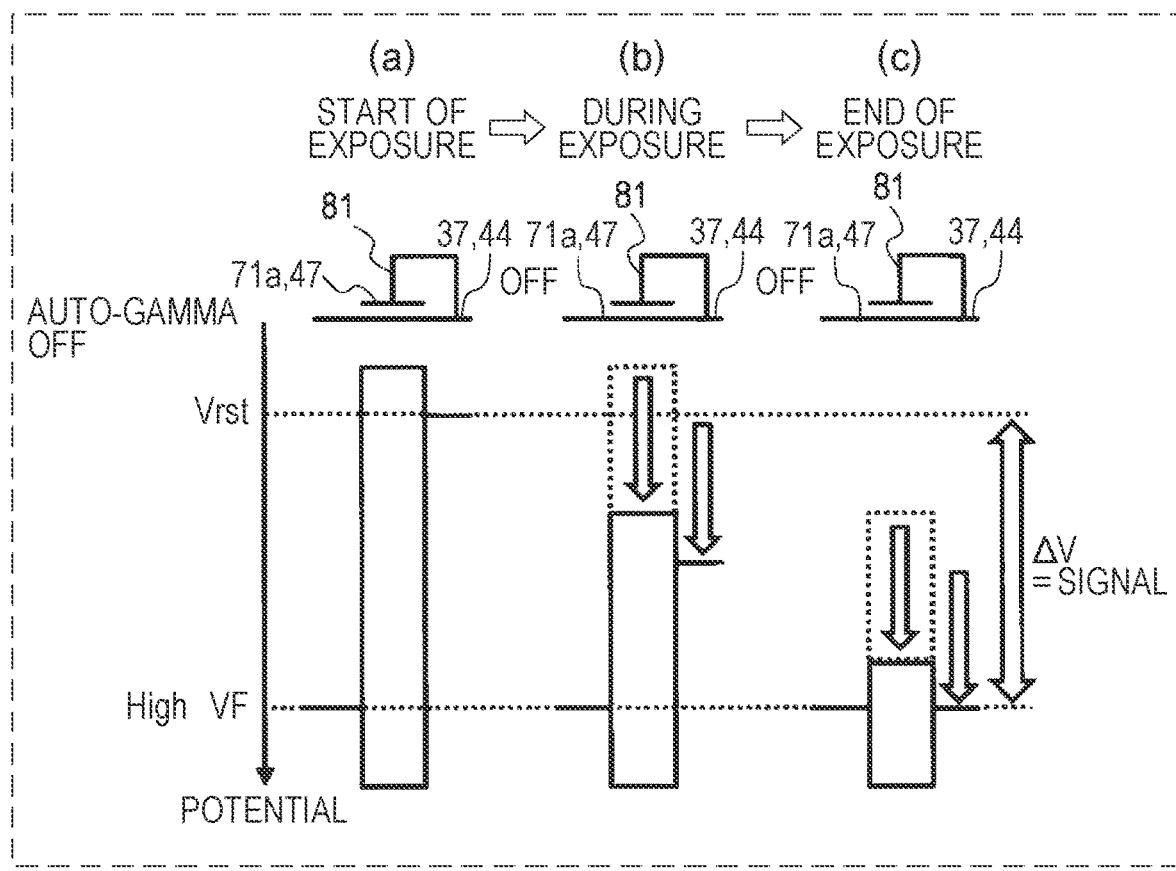
FIG. 6 is a schematic diagram illustrating a typical example of a potential state of the transistor in the first mode in the imaging device according to the first embodiment.

FIG. 6 is a schematic diagram illustrating a typical example of potential states of the transistor in the first mode in the imaging device 101 according to the first embodiment. As described above, the signal charges are holes in this embodiment. Therefore, FIG. 6 also relates to the case where the signal charges are holes.

A state (a) of FIG. 6 is a state at the start of exposure. In the state (a) of FIG. 6, the potential of the charge accumulator 37 is the reset potential Vrst. The potential of the first terminal 71a of the first capacitive element 71 is the control potential VF. The potential of the charge accumulator 37 is higher than the potential under the gate of the first transistor 81. The potential of the first terminal 71a of the first capacitive element 71 is higher than the potential of the charge accumulator 37. The first transistor 81 is off.

A state (b) of FIG. 6 is a state during exposure. Since the signal charges are holes, the potential of the charge accumulator 37 increases during the exposure. The gate electrode of the first transistor 81 is electrically connected to the charge accumulator 37. Therefore, as the potential of the charge accumulator 37 rises, the potential under the gate of the first transistor 81 also rises.

A state (c) of FIG. 6 is a state at the end of exposure. In the first mode, the control potential VF is at high level. Therefore, the potential under the gate of the first transistor 81 does not reach higher than the control potential VF. Also, the first transistor 81 is off.

In FIG. 6, a difference voltage ΔV is a difference between the potential of the charge accumulator 37 at the start of exposure, that is, the reset potential Vrst and the potential of the charge accumulator 37 at the end of exposure. An electric signal corresponding to the difference voltage ΔV may be outputted from the amplifying transistor 34. As described above, the electric signal is specifically a signal voltage.

Figure 7:
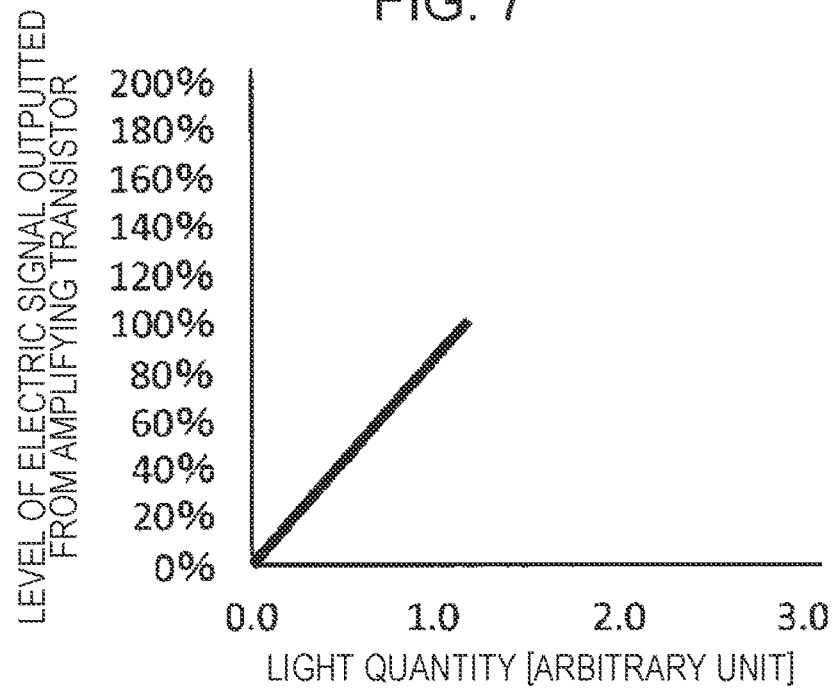
FIG. 7 is a graph schematically illustrating a typical example of changes in level of an electric signal outputted from an amplifying transistor with respect to changes in quantity of light that enters a photoelectric converter in a first mode according to the first embodiment.

FIG. 7 is a graph schematically illustrating a typical example of changes in level of the electric signal outputted from the amplifying transistor 34 with respect to a change in quantity of light incident on the photoelectric converter 15 in the first mode. In the graph illustrated in FIG. 7, the horizontal axis represents the quantity of light, and the vertical axis represents the level of the electric signal outputted from the amplifying transistor 34. The values on the horizontal and vertical axes in FIG. 7 are normalized values. The same applies to FIG. 9A to be described later. As illustrated in FIG. 7, in the first mode, the level of the electric signal outputted from the amplifying transistor 34 continuously increases as the quantity of light increases. However, the increase in signal level peaks out when the quantity of light is 1.

Figure 8:
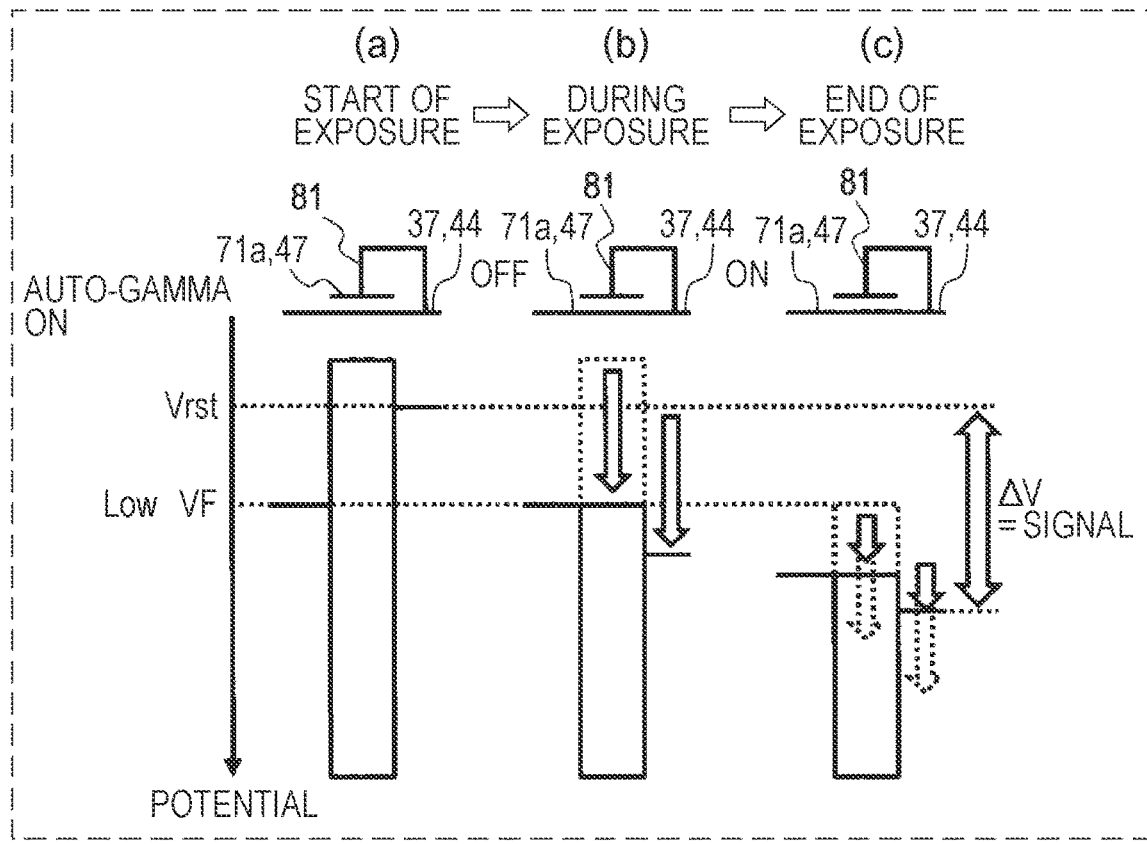
FIG. 8 is a schematic diagram illustrating a typical example of a potential state of the transistor in the second mode in the imaging device according to the first embodiment.

FIG. 8 is a schematic diagram illustrating a typical example of the potential state of the transistor in the second mode in the imaging device 101 according to the first embodiment.

A state (a) of FIG. 8 is a state at the start of exposure. In the state (a), the potential of the charge accumulator 37 is the reset potential Vrst. The potential of the first terminal 71a of the first capacitive element 71 is the control potential VF. The potential of the charge accumulator 37 is higher than the potential under the gate of the first transistor 81. The potential of the first terminal 71a of the first capacitive element 71 is higher than the potential of the charge accumulator 37. The first transistor 81 is off.

A state (b) of FIG. 8 is a state during exposure. Since the signal charges are holes, the potential of the charge accumulator 37 increases during exposure. The gate electrode of the first transistor 81 is electrically connected to the charge accumulator 37. Therefore, the potential under the gate of the first transistor 81 also rises as the potential of the charge accumulator 37 rises.

In the second mode, the control potential VF is at low level. Therefore, the potential of the first terminal 71a is also at low level when the exposure is started as in the state (a). Therefore, when the potential under the gate of the first transistor 81 rises together with the potential of the charge accumulator 37, the potential under the gate of the first transistor 81 eventually reaches the potential of the first terminal 71a.

When the potential of the gate electrode of the first transistor 81 rises during exposure, the gate-source voltage of the first transistor 81 eventually exceeds the threshold voltage and the first transistor 81 is turned on. As a result, the charge accumulator 37 and the first terminal 71a are electrically connected through the first transistor 81.

In the example illustrated in FIG. 8, the timing at which the first transistor 81 is turned on is the same as the timing at which the potential under the gate of the first transistor 81 reaches the potential of the first terminal 71a. However, the former timing may be before or after the latter timing.

When the first transistor 81 is on while the exposure is in progress, a situation may arise where the potential under the gate of the first transistor 81 is higher than the potential of the first terminal 71a and the potential of the charge accumulator 37 is higher than the potential under the gate of the first transistor 81. In this situation, electrons are injected into the charge accumulator 37 from the first terminal 71a through the first transistor 81. The injection of electrons lowers the potential of the charge accumulator 37. Accordingly, the potential under the gate of the first transistor 81 also drops. On the other hand, the potential of the first terminal 71a rises.

Such injection of electrons balances the potential of the charge accumulator 37 and the potential of the first terminal 71a. During exposure, the potential of the charge accumulator 37 and the potential of the first terminal 71a can rise while maintaining this balance. In this situation, the voltage between the first terminal 71a and the second terminal 71b changes as signal charges are generated. That is, the first capacitive element 71 functions as part of the charge accumulation capacitor X that accumulates charges, resulting in a state where the capacitance value of the charge accumulation capacitor X has increased. Accordingly, the potential of the charge accumulator 37 changes more gradually.

A state (c) of FIG. 8 is a state at the end of exposure. Compared to the first mode illustrated in FIG. 6, the potential of the charge accumulator 37 is low at the end of exposure as the potential of the charge accumulator 37 changes more gradually in the second mode as described above. Therefore, the difference voltage ΔV is lower in the second mode than in the first mode.

Figure 9A:
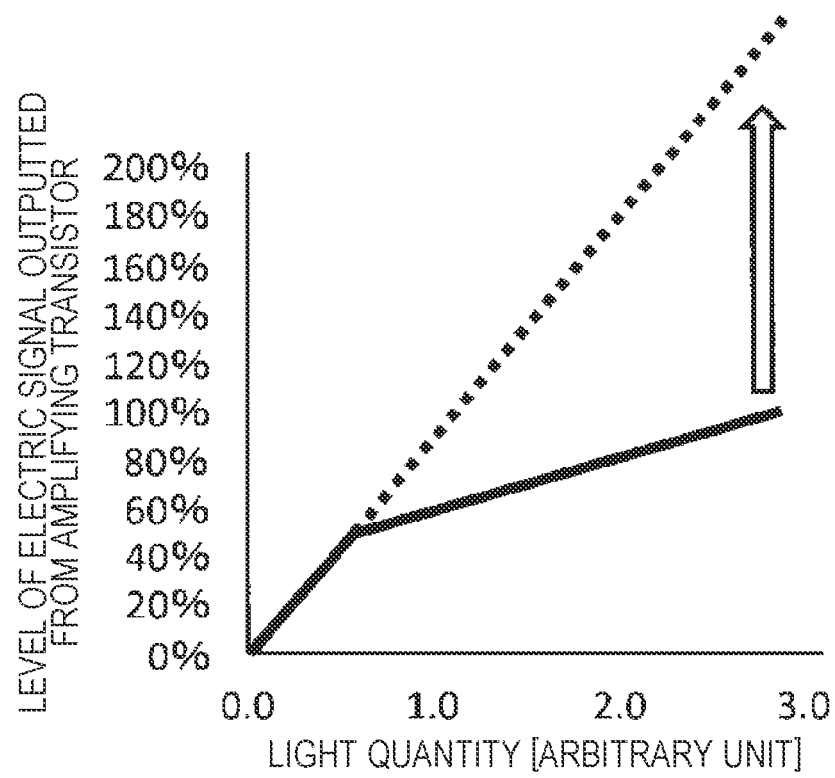
FIG. 9A is a graph schematically illustrating a typical example of changes in level of an electric signal outputted from the amplifying transistor with respect to changes in quantity of light that enters the photoelectric converter in a second mode according to the first embodiment.

FIG. 9A is a graph schematically illustrating a typical example of changes in level of the electric signal outputted from the amplifying transistor 34 with respect to changes in quantity of light incident on the photoelectric converter 15 in the second mode. As illustrated in FIG. 9A, in the second mode, when the quantity of light increases, the level of the electric signal outputted from the amplifying transistor 34 increases gradually as the quantity of light increases beyond a first threshold light quantity. This is because a phenomenon that the potential of the charge accumulator 37 changes more gradually as described with reference to FIG. 8 occurs in a region where the quantity of light is more than or equal to the first threshold light quantity. In other words, this is because the capacitance value of the charge accumulation capacitor X increases when the quantity of light increases beyond the first threshold light quantity. As can be understood from FIGS. 9A and 7, in the second mode, signal charges can be accumulated in the charge accumulation capacitor X up to a region with a larger quantity of light, as compared with the first mode. This means that an electric signal corresponding to the quantity of light can be properly generated also for the region with a larger quantity of light. This means that the dynamic range is expanded.

Note that it is possible to correct data on the electric signal in a high light intensity region so that a light intensity-electric signal characteristics graph in the high light intensity region is positioned on the extension of a light intensity-electric signal characteristics graph in a low light intensity region. This correction is schematically indicated by the block arrow and dotted line in FIG. 9A. A specific example of this correction will be described later with reference to FIG. 32 and the like.

As can be understood from the description with reference to FIGS. 5, 8, and 9A, when the first capacitive element 71 does not function as a capacitor to accumulate charges generated by photoelectric conversion, the first capacitive element 71 does not constitute part of the charge accumulation capacitor X. On the other hand, when the first capacitive element 71 functions as the capacitor to accumulate charges generated by photoelectric conversion, the first capacitive element 71 constitutes part of the charge accumulation capacitor X. In the examples of FIGS. 5, 8, and 9A, the charge accumulation capacitor X increases as the first capacitive element 71 functions as the capacitor to accumulate charges generated by photoelectric conversion. In other words, the charge accumulation capacitor X increases by becoming "visible" as a capacitor from the first capacitive element 71.

The charge accumulation capacitor X can be explained as follows. Specifically, the capacitance value of a capacitor that does not function as a capacitor to accumulate charges generated by photoelectric conversion in the imaging device 101 is not counted as the capacitance value of the charge accumulation capacitor X. On the other hand, the capacitance value of a capacitor that functions as a capacitor to accumulate charges generated by photoelectric conversion in the imaging device 101 is counted as the capacitance value of the charge accumulation capacitor X. In other words, the capacitance value of an "invisible" capacitor as the capacitor in the imaging device 101 is not counted as the capacitance value of the charge accumulation capacitor X. On the other hand, the capacitance value of a "visible" capacitor as the capacitor in the imaging device 101 is counted as the capacitance value of the charge accumulation capacitor X.

The weaker the light, the more sensitive the human vision, and the stronger the light, the less sensitive the human vision. In order to simulate such characteristics of human vision, gamma correction may be performed in the subsequent image processing of the imaging device in a camera system.

Figure 9B:
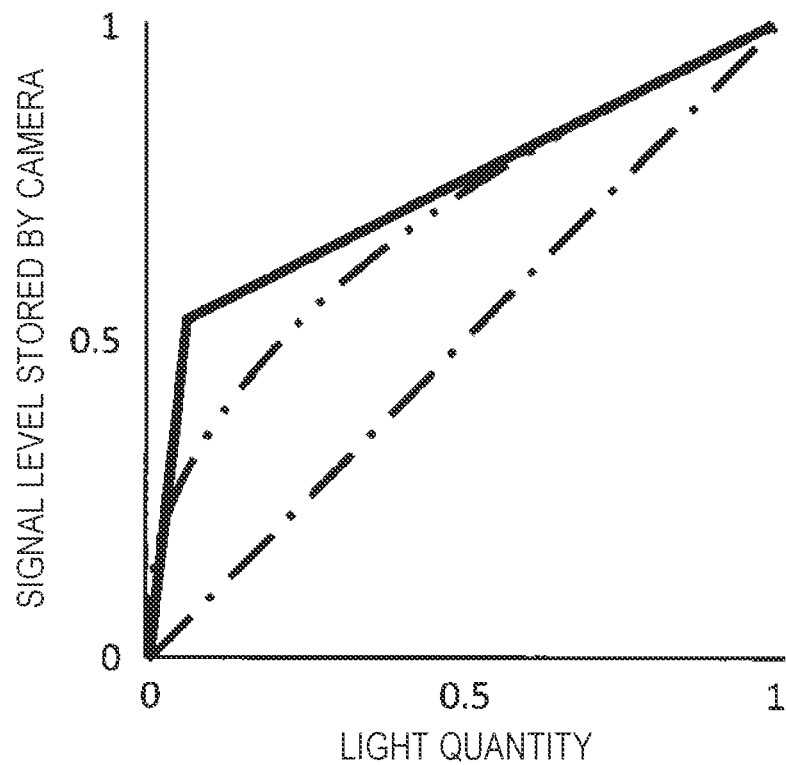
FIG. 9B is a graph for explaining gamma characteristics.

FIG. 9B is a graph for explaining gamma correction. In FIG. 9B, the horizontal axis represents the quantity of light and the vertical axis represents a signal level held by the camera system. The values on the horizontal and vertical axes in FIG. 9B are normalized values.

In FIG. 9B, the dashed-two dotted curve represents light intensity-signal level characteristics obtained by the gamma correction in the subsequent image processing of the imaging device. The dashed-dotted straight line represents light intensity-signal level characteristics obtained when the gamma correction is not performed. The dashed-dotted straight line indicates that the light intensity and the signal level held by the camera system take the same value when the gamma correction is not performed. It can be understood from the dashed-two dotted curve that the gamma correction increases the ratio of the signal level value to the light intensity value in a low light intensity region. For example, the dashed-two dotted curve illustrates that the signal level=0.5 when the light intensity=0.2.

In FIG. 9B, the solid line represents light intensity-signal level characteristics that can be obtained by the second mode of this embodiment. It will be understood from FIG. 9B that pseudo-gamma characteristics are obtained within the pixel 11a according to the second mode of this embodiment. To be more specific, the pseudo-gamma characteristics obtained in this embodiment have the following advantages. These advantages are useful in the camera system.

The SNR is easily ensured in a low light intensity region.
An extensive gradation or number of bits is easily assigned to the low light intensity region.
In a high light intensity region, the capacitance value of the charge accumulation capacitor X is easily ensured, making it easier to achieve a wide dynamic range and to prevent overexposure.
In the high light intensity region, a rise in potential of the charge accumulator 37 can be suppressed, and a high voltage is not applied to the charge accumulator 37, transistors, and the like for a long period of time, making it easier to ensure the reliability of the imaging device 101.

As can be understood from the description with reference to FIGS. 9A and 9B, in this embodiment, the ratio of the increase in electric signal level to the increase in quantity of light incident on the imaging device 101 decreases when the quantity of light incident on the imaging device 101 increases beyond the first threshold light quantity. To be more specific, this behavior can occur in the second mode. In this context, the electric signal is an electric signal outputted by the amplifying transistor 34 according to the potential of the charge accumulator 37. The quantity of light incident on the imaging device 101 is specifically a quantity of light incident on the photoelectric converter 15. The ratio is specifically a value obtained by differentiating the level of the electric signal with respect to the quantity of light. In these explanations, the "light quantity" can read "illuminance".

Figure 10:
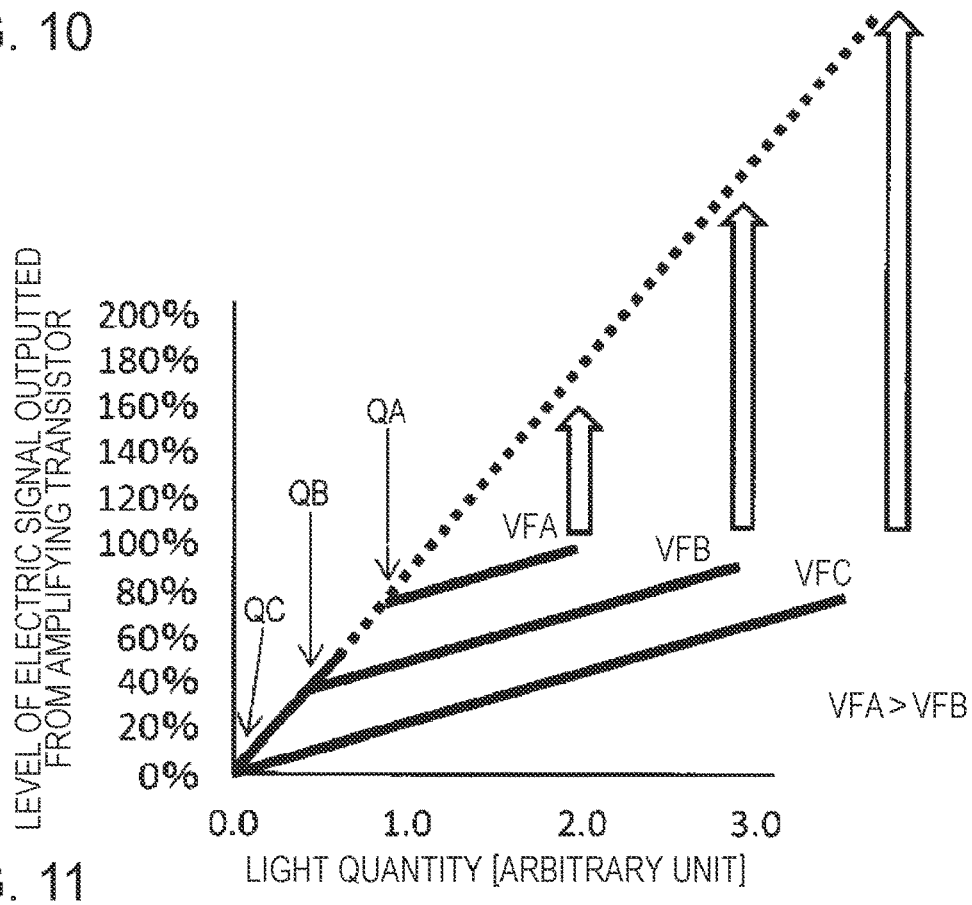
FIG. 10 is a graph for explaining adjustment of the gamma characteristics.

The gamma characteristics can be adjusted by adjusting the control potential VF. FIG. 10 is a graph for explaining adjustment of gamma characteristics. In the example of FIG. 10, description is given of cases where the control potential VF is set to a potential VFA, where the control potential VF is set to a potential VFB, and where the control potential VF is set to a potential VFC. The potential VFA is greater than the potential VFB, and the potential VFB is greater than the potential VFC. The first threshold light quantity when the control potential VF is set to the potential VFA is a light quantity QA. The first threshold light quantity when the control potential VF is set to the potential VFB is a light quantity QB. The first threshold light quantity when the control potential VF is set to the potential VFC is a light quantity QC. The light quantity QA is larger than the light quantity QB, and the light quantity QB is larger than the light quantity QC.

As described above, potential VFA>potential VFB>potential VFC, and light quantity QA>light quantity QB>light quantity QC. As can be understood from the above, in a dark scene, an extensive gradation or number of bits can be assigned to a low light intensity region by setting the control potential VF to the potential VFA. In a bright scene, an extensive gradation or number of bits can be assigned to a high light intensity region by setting the control potential VF to the potential VFC.

Several other embodiments will be described below. In the following description, common elements in embodiments already described and those to be described later are denoted by the same reference numerals, and the description thereof may be omitted. The descriptions of the embodiments can be applied to each other unless technically inconsistent. The embodiments can be combined with each other unless technically inconsistent.

Second Embodiment

Figure 11:
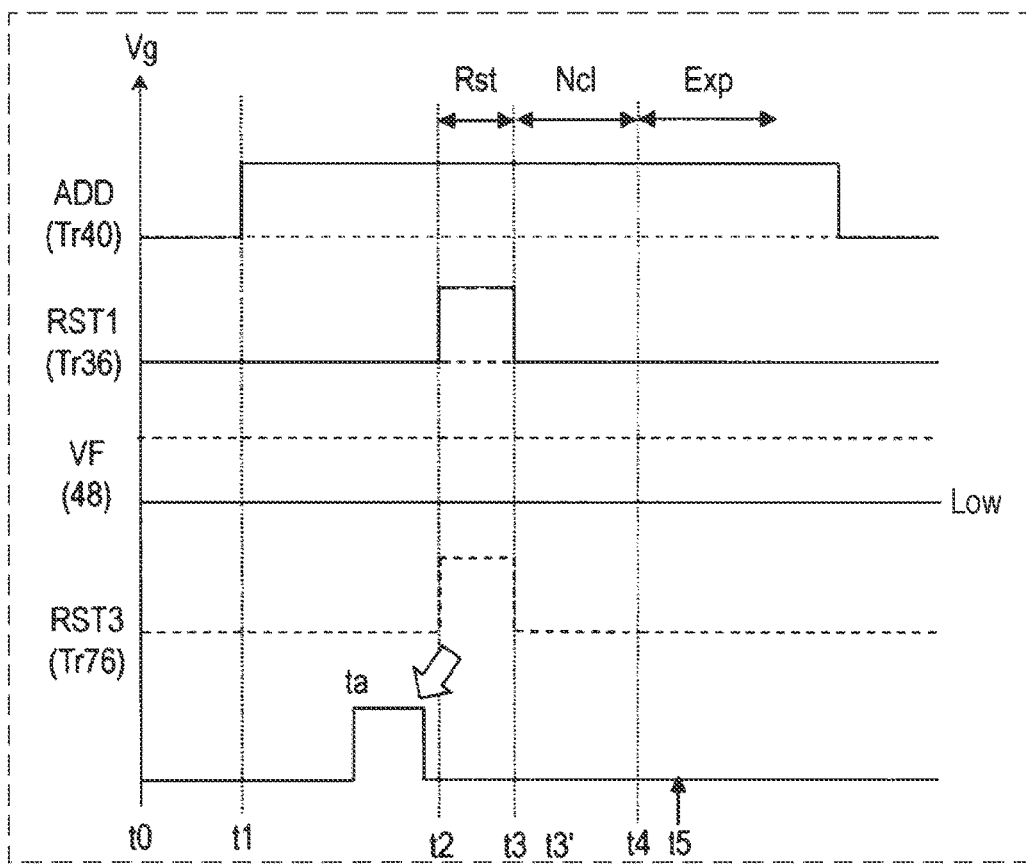
FIG. 11 is a timing chart for explaining an operation example of a transistor in a second mode in an imaging device according to a second embodiment.

In a second mode of a second embodiment, transistors operate at different timings from those in the second mode of the first embodiment. FIG. 11 is a timing chart for explaining an operation example of the transistors in the second mode in an imaging device according to the second embodiment. In FIG. 11, the dotted line with the characters RST3 schematically represents an example of changes in potential of the gate electrode of the specific reset transistor 76 in the first embodiment. The dotted line with the letters to schematically represents an example of changes in potential of a gate electrode of a specific reset transistor 76 in the second embodiment.

As described with reference to FIG. 5, in the second mode of the first embodiment, the period during which the first reset transistor 36 is on is the same as the period during which the specific reset transistor 76 is on. In such a case, when the control potential VF is low, the gate-source voltage of the first transistor 81 becomes larger than the threshold voltage during the period when these transistors 36 and 76 are on, and the first source and the first drain of the first transistor 81 may be short-circuited. In this case, overcurrent may flow. Also, in this case, the potentials of the charge accumulator 37 and the node 47 may be reset to an intermediate potential between the control potential VF and the reset potential Vrst. In other words, resetting of the potentials of the charge accumulator 37 and the node 47 may become unstable.

To address this situation, in the second embodiment, the period during which the first reset transistor 36 is on is shifted from the period during which the specific reset transistor 76 is on. To be more specific, the period during which the specific reset transistor 76 is on is set before the period during which the first reset transistor 36 is on. In this way, even when the control potential VF is low, short-circuiting of the first source and the first drain of the first transistor 81 can be avoided.

When the control potential VF is low, the first threshold potential is low. Therefore, the threshold light quantity can be set low. This can be understood from FIG. 10.

According to the second embodiment, the potential states of the charge accumulator 37 and the node 47 can be stabilized.

There is typically a time lag between the period during which the first reset transistor 36 is on and the period during which the specific reset transistor 76 is on. However, this time lag may be omitted.

Figure 12:
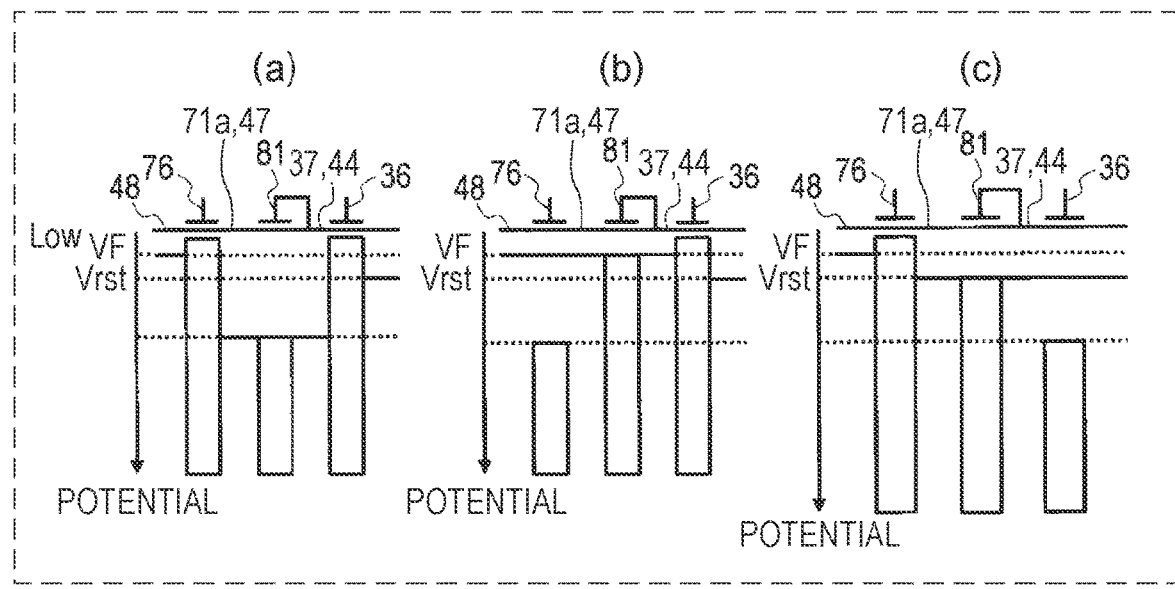
FIG. 12 is a schematic diagram illustrating a typical example of a potential state of the transistor in the second mode in the imaging device according to the second embodiment.

FIG. 12 is a schematic diagram illustrating a typical example of the potential states of the transistors in the second mode in the imaging device according to the second embodiment.

A state (a) of FIG. 12 is a state before the specific reset transistor 76 is turned on and the first reset transistor 36 is turned on.

A state (b) of FIG. 12 is a state during a period in which the specific reset transistor 76 is on. In the state (b), the node 47 is set to the control potential VF. The potential of the charge accumulator 37 is also set to the control potential VF.

A state (c) of FIG. 12 is a state during a period in which the first reset transistor 36 is on. In the state (c), the potential of the charge accumulator 37 is reset to the reset potential Vrst. The potential of the node 47 is also reset to the reset potential Vrst.

The first transistor 81 may have a substrate bias effect. In this case, a potential difference may occur between the first source and the first drain of the first transistor 81. However, even in this case, the potential states of the charge accumulator 37 and the node 47 can be stabilized by the operation of the transistors based on the timing chart of FIG. 11.

Figure 13:
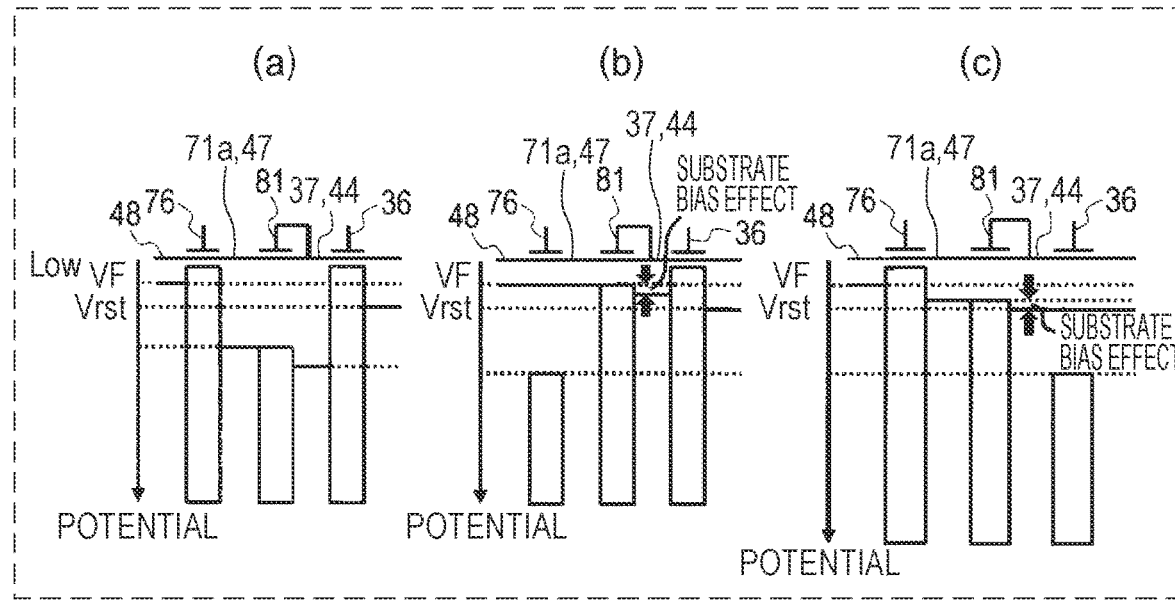
FIG. 13 is a schematic diagram illustrating an example of the potential state of the transistor in the second mode in the imaging device according to the second embodiment.

FIG. 13 is a schematic diagram illustrating another example of the potential states of the transistors in the second mode in the imaging device according to the second embodiment. To be more specific, FIG. 13 relates to a case where the first transistor 81 has the substrate bias effect.

A state (a) of FIG. 13 is a state before the specific reset transistor 76 is turned on and the first reset transistor 36 is turned on.

A state (b) of FIG. 13 is a state during a period in which the specific reset transistor 76 is on. In the state (b), the potential of the node 47 is set to the control potential VF. The potential of the charge accumulator 37 is set to a potential slightly higher than the control potential VF due to the substrate bias effect.

A state (c) of FIG. 13 is a state during a period in which the first reset transistor 36 is on. In the state (c), the potential of the charge accumulator 37 is reset to the reset potential Vrst. The potential of the node 47 is reset to a potential slightly lower than the reset potential Vrst due to the substrate bias effect.

Third Embodiment

Figure 14:
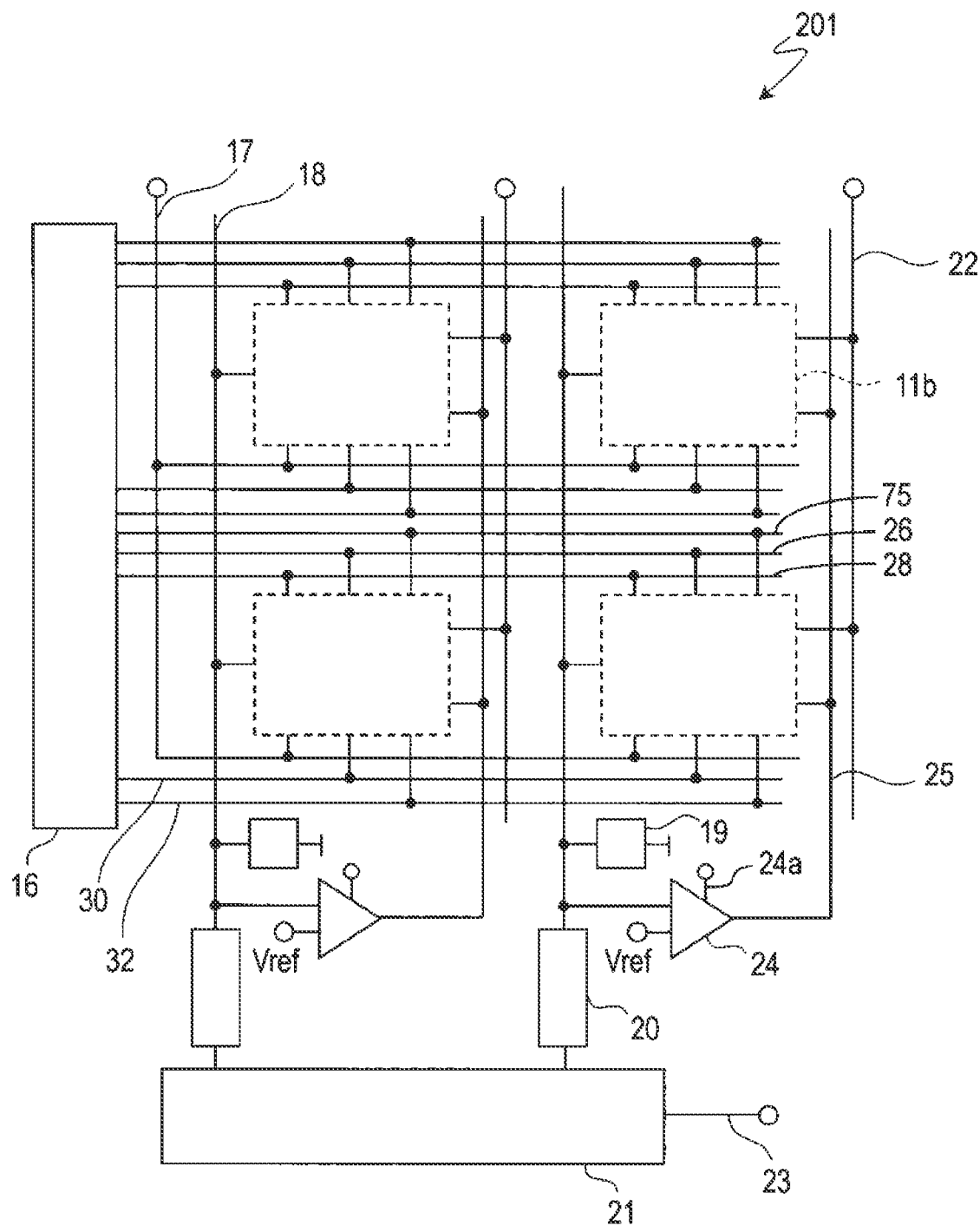
FIG. 14 is a schematic diagram illustrating an exemplary circuit configuration of an imaging device according to a third embodiment.

FIG. 14 is a schematic diagram illustrating an exemplary circuit configuration of an imaging device 201 according to a third embodiment.

An inverting amplifier 24 is provided for each vertical signal line 18. In this example, these inverting amplifiers 24 are included in peripheral circuits.

A feedback control line 28 is provided for each row of pixels 11b. The pixels 11b in each row are electrically connected to the vertical scanning circuit 16 through the corresponding feedback control line 28. A feedback circuit that negatively feeds back the output from the pixel 11b can be formed by the vertical scanning circuit 16 applying a predetermined voltage to the feedback control line 28.

A control line 32 is provided for each row of the pixels 11b. The pixels 11b in each row are electrically connected to the vertical scanning circuit 16 through the corresponding control line 32. The vertical scanning circuit 16 can supply a predetermined voltage to the plurality of pixels 11b through the control line 32.

A power supply wiring 22 is provided for each column of the pixels 11b. The pixels 11b in each column are electrically connected to the corresponding power supply wiring 22.

A negative-side input terminal of the inverting amplifier 24 is connected to the corresponding vertical signal line 18. A predetermined voltage Vref is supplied to a positive-side input terminal of the inverting amplifier 24. The voltage Vref is, for example, a positive voltage of 1 V or around 1 V. An output terminal of the inverting amplifier 24 is connected to the plurality of pixels 11b connected to the negative-side input terminal of the inverting amplifier 24 through a feedback line 25. The inverting amplifier 24 forms part of the feedback circuit that negatively feeds back an electric signal from the pixel 11b. The inverting amplifier 24 may also be referred to as a feedback amplifier. The inverting amplifier 24 includes a gain adjustment terminal 24a for changing an inverting amplification gain.

Figure 15:
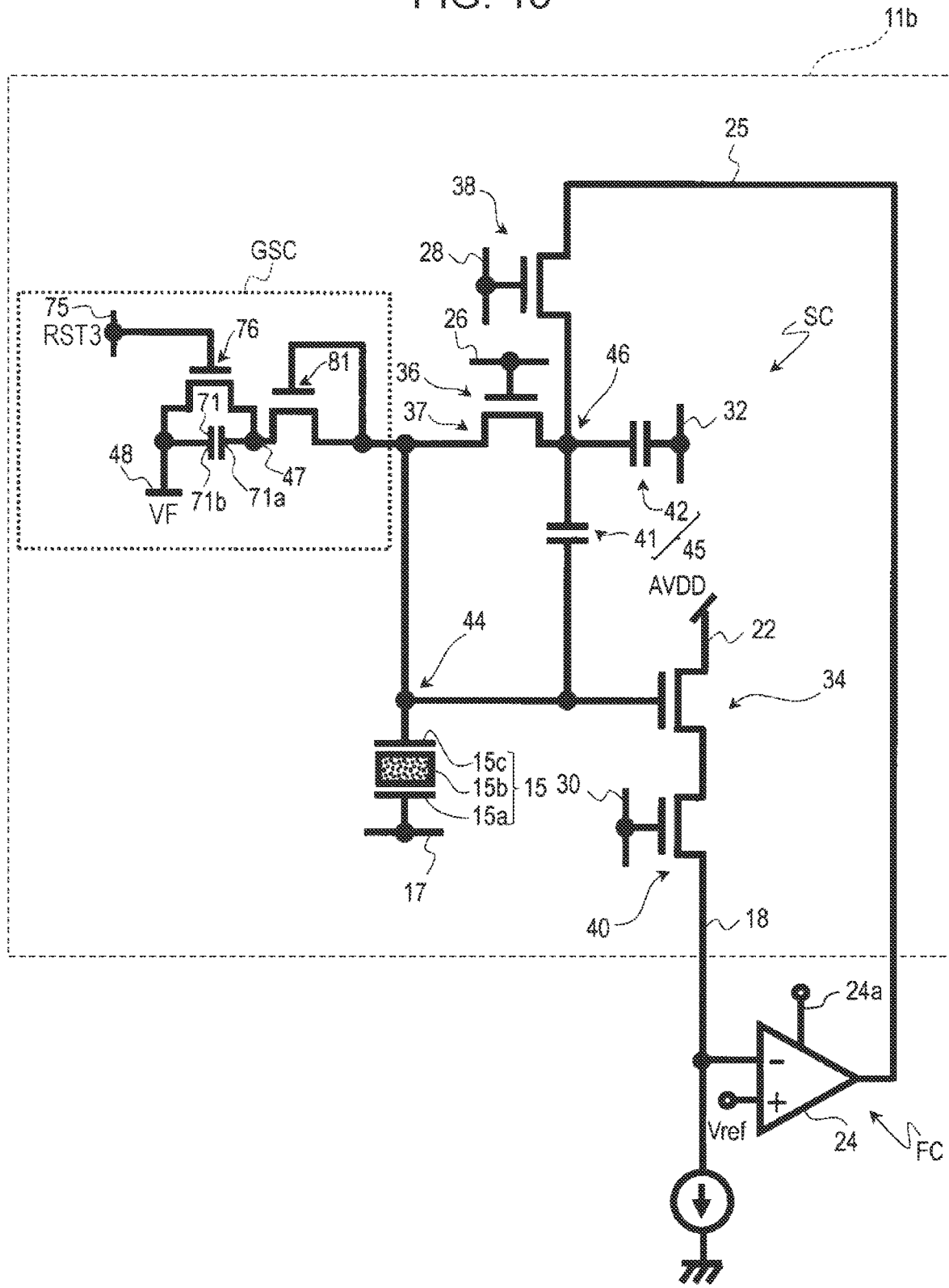
FIG. 15 is a schematic diagram illustrating an exemplary circuit configuration of a pixel illustrated in FIG. 14.

FIG. 15 is a schematic diagram illustrating an exemplary circuit configuration of the pixel 11b illustrated in FIG. 14.

The pixel 11b includes a capacitive circuit 45 in which a capacitive element 41 and a capacitive element 42 are connected in series. The capacitive element 42 has a capacitance value larger than that of the capacitive element 41. One of the source and drain of a first reset transistor 36, one electrode of the capacitive element 41, a pixel electrode 15c, and a node 44 are electrically connected.

The other of the source and drain of the first reset transistor 36, the other electrode of the capacitive element 41, and one electrode of the capacitive element 42 are electrically connected. The capacitive element 41 is connected in parallel with the first reset transistor 36. This parallel connection may reduce transistor junction leakage to the node 44 and reduce dark current. A node 46 including the connection between the capacitive elements 41 and 42 is called a reset drain node.

The other terminal of the capacitive element 42 is electrically connected to the control line 32. The control line 32 is used to control the potential of this terminal. The potential of the control line 32 is set to, for example, 0 V, that is, a reference potential. The potential of the control line 32 need not be fixed when the imaging device 201 is in operation. For example, a pulse voltage may be supplied from the vertical scanning circuit 16. The control line 32 can be used to control the potential of the node 44. As a matter of course, the potential of the control line 32 may be fixed when the imaging device 201 is in operation.

The pixel 11b includes a second reset transistor 38. One of the source and drain of the second reset transistor 38 is electrically connected to the node 46. The other of the source and drain of the second reset transistor 38 is electrically connected to the feedback line 25. That is, the node 46 and the feedback line 25 are connected through the second reset transistor 38. A gate electrode of the second reset transistor 38 is electrically connected to the feedback control line 28. A feedback circuit FC that feeds back the output from a signal detection circuit SC can be formed by controlling the potential of the feedback control line 28. To be more specific, the feedback circuit FC negatively feeds back the output from the signal detection circuit SC.

Figure 16:
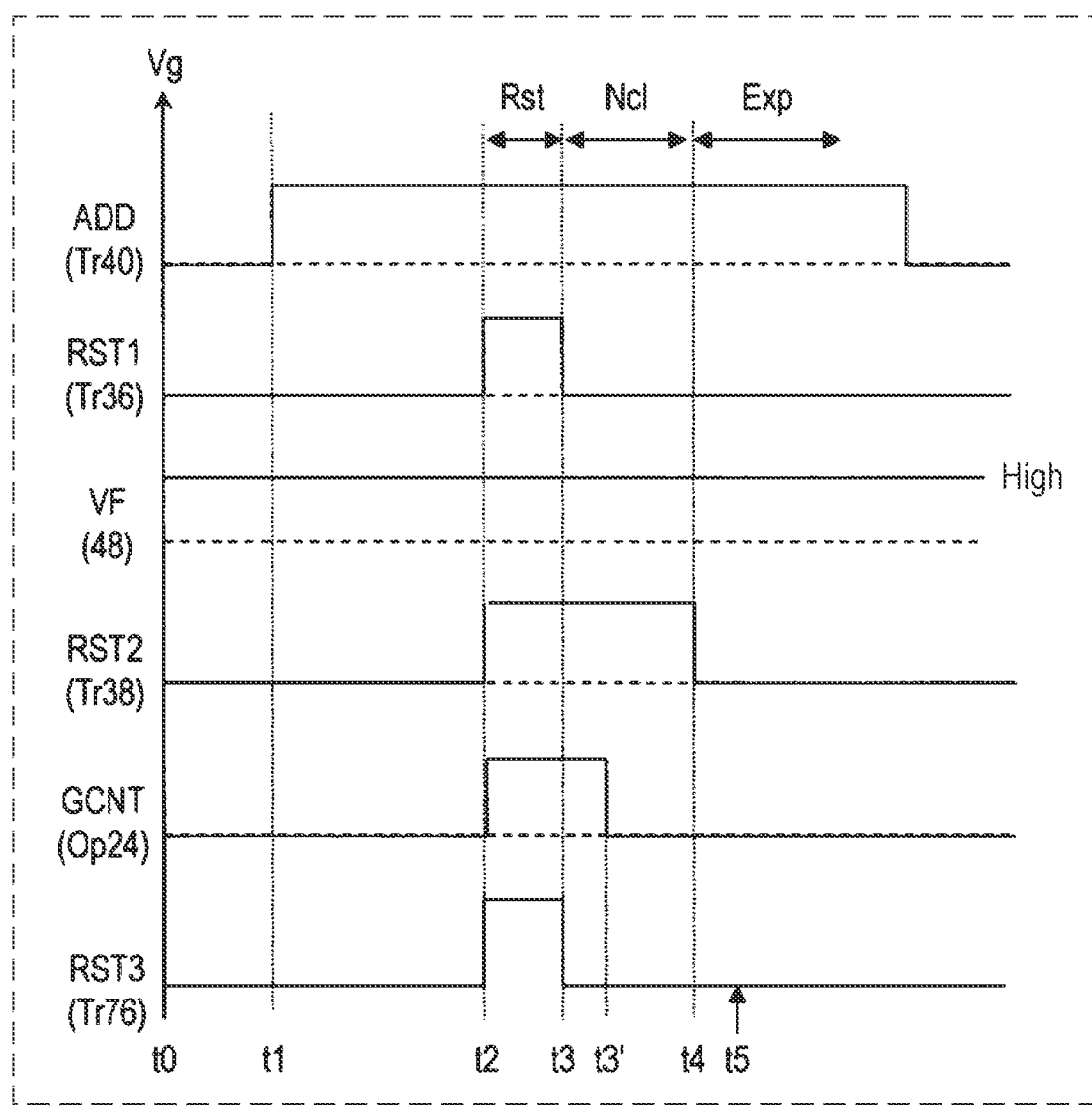
FIG. 16 is a timing chart for explaining an operation example of a transistor in a first mode in the imaging device according to the third embodiment.

FIG. 16 is a timing chart for explaining an operation example of transistors in a first mode in the imaging device 201 according to the third embodiment. In FIG. 16, RST2 schematically represents an example of changes in potential of the gate electrode of the second reset transistor 38. GCNT schematically represents an example of changes in a potential applied to the gain adjustment terminal 24a of the inverting amplifier 24. In the example illustrated in FIG. 16, the second reset transistor 38 is off at time t0. The voltage of the gain adjustment terminal 24a of the inverting amplifier 24 has a certain predetermined value.

First, at time t1, the address transistor 40 is turned on by controlling the potential of the address signal line 30. In this event, the signal charge accumulated in the charge accumulation capacitor X is read out.

Next, at time t2, the first reset transistor 36 and the second reset transistors 38 are turned on by controlling the potentials of the reset signal line 26 and the feedback control line 28. Thus, the node 44 and the feedback line 25 are connected through the first reset transistor 36 and the second reset transistors 38 to form the feedback circuit FC that negatively feeds back the output from the signal detection circuit SC. By providing the second reset transistor 38 between the node 46 and the feedback line 25, the feedback circuit FC can be selectively formed by the second reset transistor 38 and the signal from the photoelectric converter 15 can be fed back.

In this example, the feedback circuit FC is formed for one of the plurality of pixels 11b sharing the feedback line 25. The potential of the gate electrode of the address transistor 40 is controlled to select the target pixel 11b for forming the feedback circuit FC, and at least one selected from the group consisting of resetting and noise cancellation can be executed for the desired pixel 11b.

Here, the feedback circuit FC is a negative feedback amplifier circuit including the amplifying transistor 34, the inverting amplifier 24, and the second reset transistor 38. The address transistor 40, which is turned on at time t1, supplies the output from the amplifying transistor 34 as an input to the feedback circuit FC.

The potential of the charge accumulator 37 is reset by electrically connecting the node 44 and the feedback line 25. In this event, by negatively feeding back the output from the signal detection circuit SC, the potential of the vertical signal line 18 converges to the potential Vref applied to the positive-side input terminal of the inverting amplifier 24. That is, in this example, the reference potential at reset is the potential Vref. In the configuration illustrated in FIG. 15, any potential Vref can be set within the range between the power supply potential and the ground potential. In other words, any voltage within a certain range can be used as the reference potential at reset. For example, a potential other than the power supply potential can be used as the reference potential at reset. The power supply potential is, for example, 3.3 V. The ground potential is 0 V.

At time t2, the potential of the gain adjustment terminal 24a of the inverting amplifier 24 is controlled to reduce the gain of the inverting amplifier 24. In the inverting amplifier 24, since the product G×B of a gain G and a bandwidth B is constant, the bandwidth B widens as the gain G decreases. Therefore, the above convergence can be speeded up in the negative feedback amplifier circuit. Widening the bandwidth B means increasing a cutoff frequency.

At time t2, the specific reset transistor 76 is turned on by controlling the potential of the specific reset signal line 75. Thus, the control potential VF is supplied to the first terminal 71a of the first capacitive element 71 through the source and drain of the specific reset transistor 76, and the potential of the first terminal 71a is reset. In the first mode, the control potential VF supplied to the first terminal 71a is at high level.

Next, at time t3, the first reset transistor 36 and the specific reset transistor 76 are turned off. Hereinafter, a period from when the first reset transistor 36, the second reset transistor 38, and the specific reset transistor 76 are turned on at time t2 to when the first reset transistor 36 and the specific reset transistor 76 are turned off may be referred to as "reset period". The reset period is a period from time t2 to time t3 in FIG. 16. In FIG. 16, the reset period is schematically indicated by an arrow Rst. Turning off the first reset transistor 36 at time t3 causes kTC noise. Therefore, kTC noise is added to the voltage of the charge accumulator 37 after reset.

As can be understood from FIG. 15, the state where the feedback circuit FC is formed is maintained while the second reset transistor 38 is on. Therefore, the kTC noise caused by turning off the first reset transistor 36 at time t3 is canceled to the magnitude of 1/(1+A) where A is the gain of the feedback circuit FC.

In this example, the voltage of the vertical signal line 18 immediately before the first reset transistor 36 is turned off, that is, immediately before noise cancellation is started, is substantially equal to the voltage Vref applied to the negative-side input terminal of the inverting amplifier 24. By bringing the voltage of the vertical signal line 18 at the start of noise cancellation closer to the target voltage Vref after noise cancellation, the kTC noise can be canceled in a relatively short time. Hereinafter, the period from when the first reset transistor 36 is turned off until the second reset transistor 38 is turned off may be referred to as "noise cancellation period". The noise cancellation period is a period from time t3 to time t4 in FIG. 16. In FIG. 16, the noise cancellation period is schematically indicated by an arrow Ncl.

At time t3, the gain of the inverting amplifier 24 is in a reduced state. Therefore, noise can be canceled quickly at the beginning of the noise cancellation period.

Subsequently, at time t3', the potential of the gain adjustment terminal 24a of the inverting amplifier 24 is controlled to increase the gain of the inverting amplifier 24. Thus, the noise level can be further lowered. The product G×B of the gain G and the bandwidth B is constant. Therefore, the bandwidth B is narrowed by increasing the gain G, and the time required for convergence in the negative feedback amplifier circuit is increased. However, between t3 and t3', the voltage of the vertical signal line 18 is already controlled to around the convergence level. Therefore, the magnitude of the voltage to be converged is suppressed in advance to a small range, and the increase in convergence time due to the narrowed bandwidth B is limited. Note that narrowing the bandwidth B means lowering the cutoff frequency.

As described above, according to the third embodiment, it is possible to reduce the kTC noise generated by turning off the first reset transistor 36, and to cancel the generated kTC noise in a relatively short time.

Then, at time t4, the second reset transistor 38 is turned off, and exposure is performed for a predetermined period of time. The kTC noise is generated by turning off the second reset transistor 38 at time t4. However, according to the second embodiment, the kTC noise generated by turning off the second reset transistor 38 can be sufficiently reduced by appropriately setting the capacitance values of the capacitive elements 41 and 42.

In FIG. 16, the exposure period is schematically indicated by an arrow Exp. At a predetermined timing during the exposure period, the reset voltage with the kTC noise canceled is read out. This timing corresponds to time t5. Since the time required to read the reset voltage is short, the reset voltage may be read while the address transistor 40 remains on.

By determining a difference between the signal read out between time t1 and time t2 and the signal read out at time t5, a signal from which the fixed noise has been removed is obtained. Thus, a signal having the kTC noise and fixed noise removed therefrom is obtained.

Figure 17:
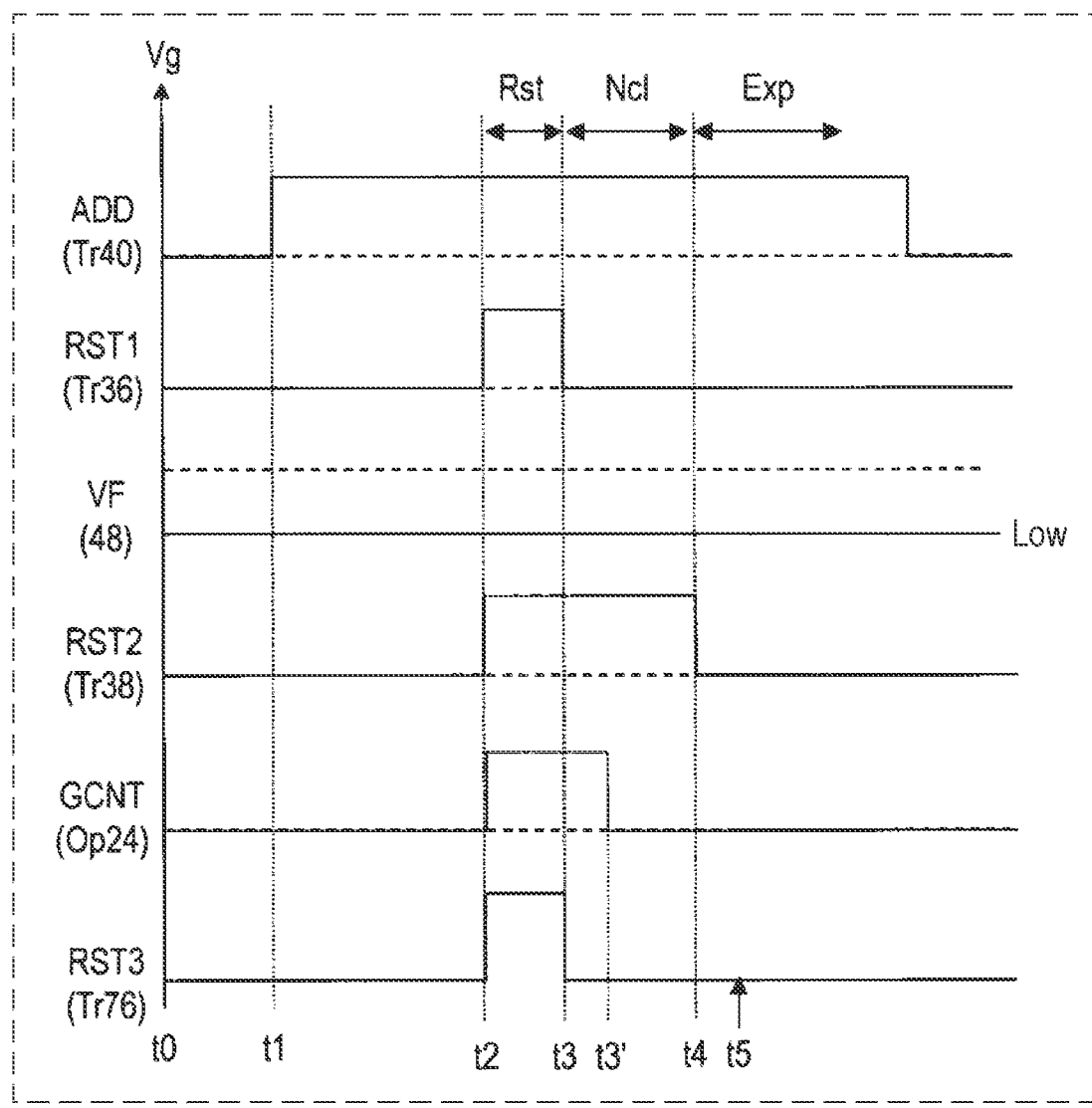
FIG. 17 is a timing chart for explaining an operation example of the transistor in a second mode in the imaging device according to the third embodiment.

FIG. 17 is a timing chart for explaining an operation example of the transistors in a second mode in the imaging device 201 according to the third embodiment. As described above, the second mode is a high saturation mode compared to the first mode. As can be understood from FIGS. 16 and 17, the second mode differs from the first mode in that the potential of the control potential VF is maintained at low level.

Fourth Embodiment

Figure 18:
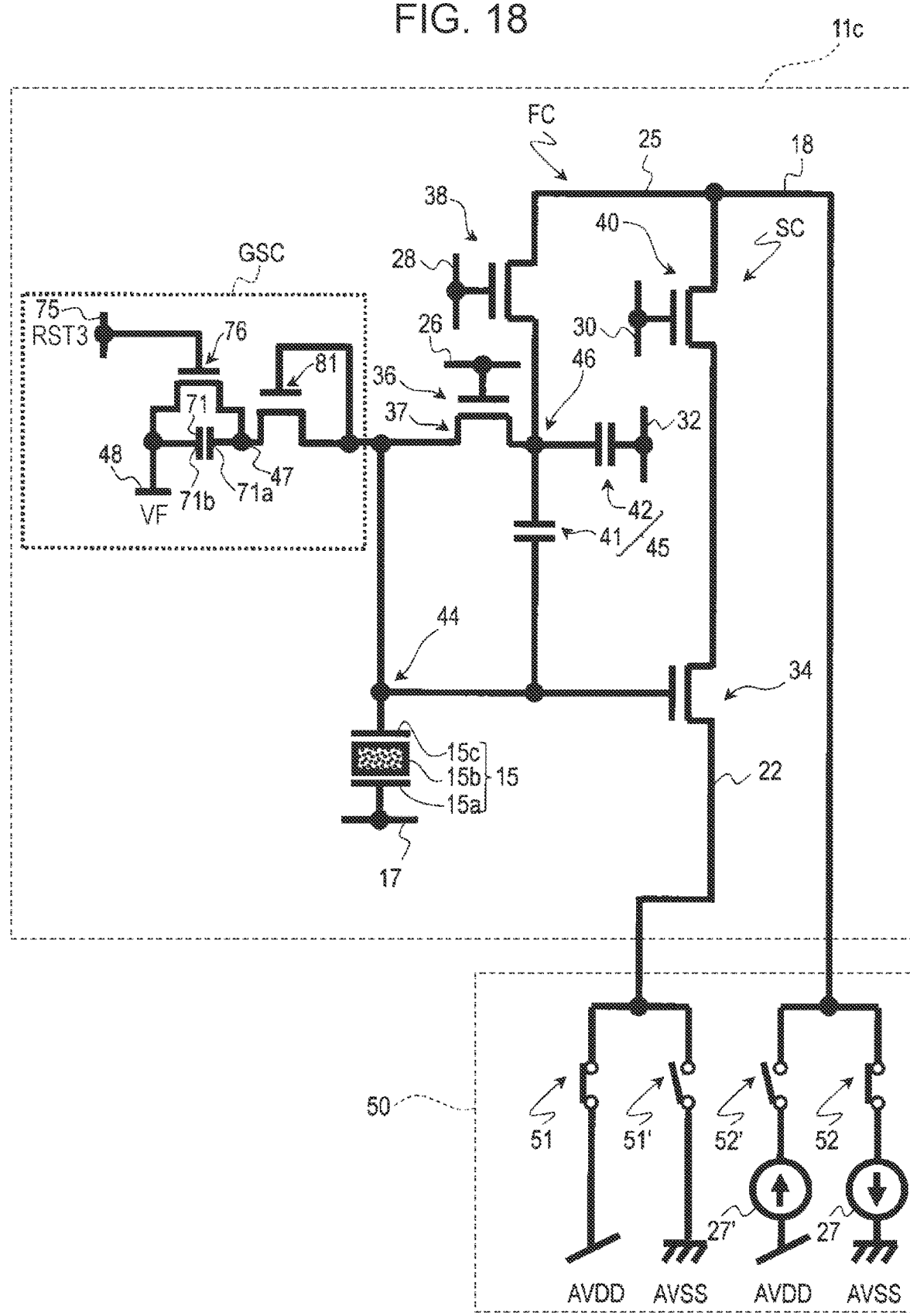
FIG. 18 is a schematic diagram illustrating an exemplary circuit configuration of a pixel in an imaging device according to a fourth embodiment.

FIG. 18 is a schematic diagram illustrating an exemplary circuit configuration of a pixel 11c in an imaging device according to a fourth embodiment. As illustrated in FIG. 18, the imaging device of the fourth embodiment is different from the imaging device 201 of the third embodiment in that a switching circuit 50 is provided, instead of the inverting amplifier 24, in each column of pixels 11c. As for the plurality of pixels 11c included in each column of the imaging device according to the fourth embodiment, the pixels 11c are not connected by a feedback line 25.

One of the source and drain of a second reset transistor 38 is electrically connected to a node 46 in each pixel 11c. The other of the source and drain of the second reset transistor 38 is electrically connected to the feedback line 25. One of the source and drain of an address transistor 40 is electrically connected to the feedback line 25 and a vertical signal line 18. The other of the source and drain of the address transistor 40 is electrically connected to one of the source and drain of an amplifying transistor 34. The other of the source and drain of the amplifying transistor 34 is electrically connected to a power supply wiring 22.

The switching circuit 50 includes switch elements 51 and 51', switch elements 52 and 52', and constant current sources 27 and 27'.

The switch elements 51 and 51' are electrically connected to a power supply wiring 22. A power supply potential AVDD can be connected to the power supply wiring 22 through the switch element 51. A reference potential AVSS can be connected to the power supply wiring 22 through the switch element 51'.

The switch elements 52 and 52' are electrically connected to the vertical signal line 18. The reference potential AVSS can be connected to the vertical signal line 18 through the constant current source 27 and the switch element 52 in this order. The power supply potential AVDD can be connected to the vertical signal line 18 through the constant current source 27' and the switch element 52' in this order.

A voltage is applied to the gate electrode of the address transistor 40 through the address signal line 30 during signal readout. Thus, one of the pixels 11c in each column is selected. By turning on the switch elements 51 and 52 of the switching circuit 50, a current flows from the constant current source 27 in a direction from the amplifying transistor 34 to the address transistor 40, for example, and the potential of the charge accumulator 37 amplified by the amplifying transistor 34 is detected.

During a reset operation, the switch elements 51' and 52' of the switching circuit 50 are turned on. Thus, a current flows through the address transistor 40 and the amplifying transistor 34 in a direction opposite to that during signal readout. Accordingly, a feedback circuit FC is formed, including the amplifying transistor 34, the address transistor 40, the feedback line 25, the second reset transistor 38, and the first reset transistor 36. Since the address transistor 40 and the amplifying transistor 34 are cascode-connected, a large gain can be obtained. Therefore, the feedback circuit FC can perform noise cancellation with a large gain.

The imaging device of this embodiment can reduce kTC noise, as in the third embodiment.

The imaging device of this embodiment does not include the inverting amplifier 24, and the address transistor 40 and the amplifying transistor 34 are included in the signal detection circuit SC and function as amplifiers of the feedback circuit FC. Therefore, the circuit area of the imaging device can be reduced. Also, the power consumption of the imaging device can be reduced. Furthermore, since a large gain can be obtained by cascode connection, the kTC noise can be reduced even when the capacitance of the capacitive elements 41 and 42 is small.

Fifth Embodiment

Figure 19A:
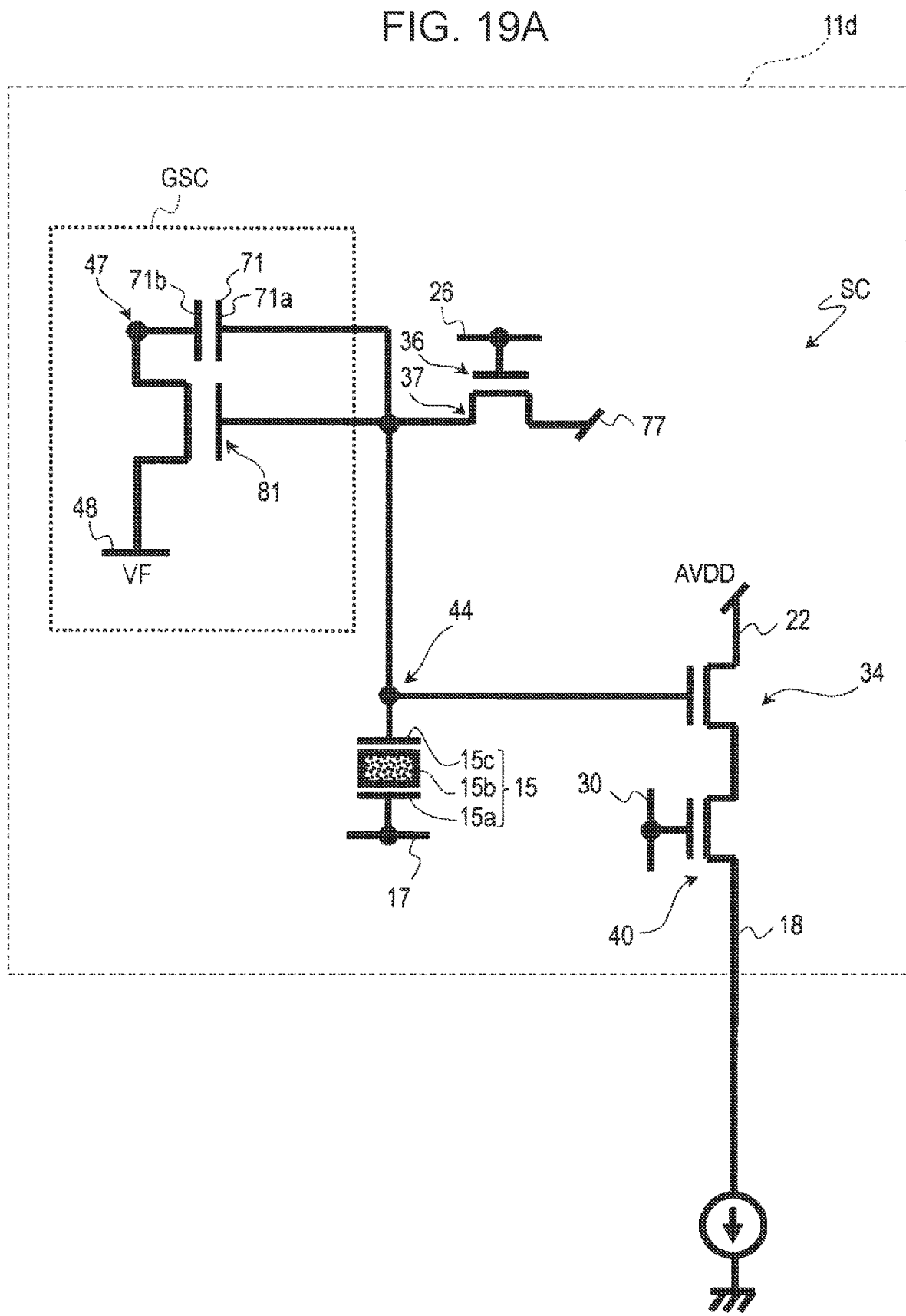
FIG. 19A is a schematic diagram illustrating an exemplary circuit configuration of an imaging device according to a fifth embodiment.

FIG. 19A is a schematic diagram illustrating an exemplary circuit configuration of an imaging device according to a fifth embodiment. A circuit configuration of a pixel 11d of the fifth embodiment illustrated in FIG. 19A differs from the circuit configuration of the pixel 11a of the first embodiment illustrated in FIG. 2 in a specific circuit GSC.

In the fifth embodiment, a first gate electrode of a first transistor 81 is electrically connected to a first terminal 71a of a first capacitive element 71 and a charge accumulator 37. One of a first source and a first drain of the first transistor 81 is electrically connected to a second terminal 71b of the first capacitive element 71. In this embodiment, a control potential VF is applied from a control circuit to the other of the first source and the first drain of the first transistor 81.

In this embodiment, a node 47 is electrically connected to one of the first source and the first drain of the first transistor 81 and to the second terminal 71b of the first capacitive element 71. The node 48 is electrically connected to the other of the first source and the first drain of the first transistor 81. In this embodiment, one of the source and drain of a first reset transistor 36 constitutes the charge accumulator 37.

In this embodiment, the specific circuit GSC changes the capacitance value of a charge accumulation capacitor X in response to a change in potential of the charge accumulator 37 in the following manner.

When the potential of the charge accumulator 37 is low, the potential of the gate electrode of the first transistor 81 is also low. The first transistor 81 is off. The control potential VF is not supplied to the node 47 and the second terminal 71b of the first capacitive element 71. The node 47 and the second terminal 71b are in a floating state. In this case, the first capacitive element 71 does not function as a capacitor to accumulate charges generated by photoelectric conversion. Therefore, the capacitance value of the charge accumulation capacitor X is not increased by the first capacitive element 71.

During exposure, the potential of the charge accumulator 37 rises, and accordingly the potential of the gate electrode of the first transistor 81 also rises. When the potential of the gate electrode of the first transistor 81 rises, a gate-source voltage of the first transistor 81 eventually exceeds a threshold voltage and the first transistor 81 is turned on. When the first transistor 81 is on, the control potential VF is supplied to the node 47 and the second terminal 71b of the first capacitive element 71 through the first source and the first drain of the first transistor 81. That is, the potentials of the node 47 and the second terminal 71b are fixed. In this case, the first capacitive element 71 functions as the capacitor to accumulate charges generated by photoelectric conversion. Thus, the capacitance value of the charge accumulation capacitor X is increased by the first capacitive element 71.

As described above, in this embodiment, the capacitance value of the charge accumulation capacitor X is changed by floating control of the first capacitive element 71. For details of the floating control, see International Publication No. WO 2020/144910.

Figure 20:
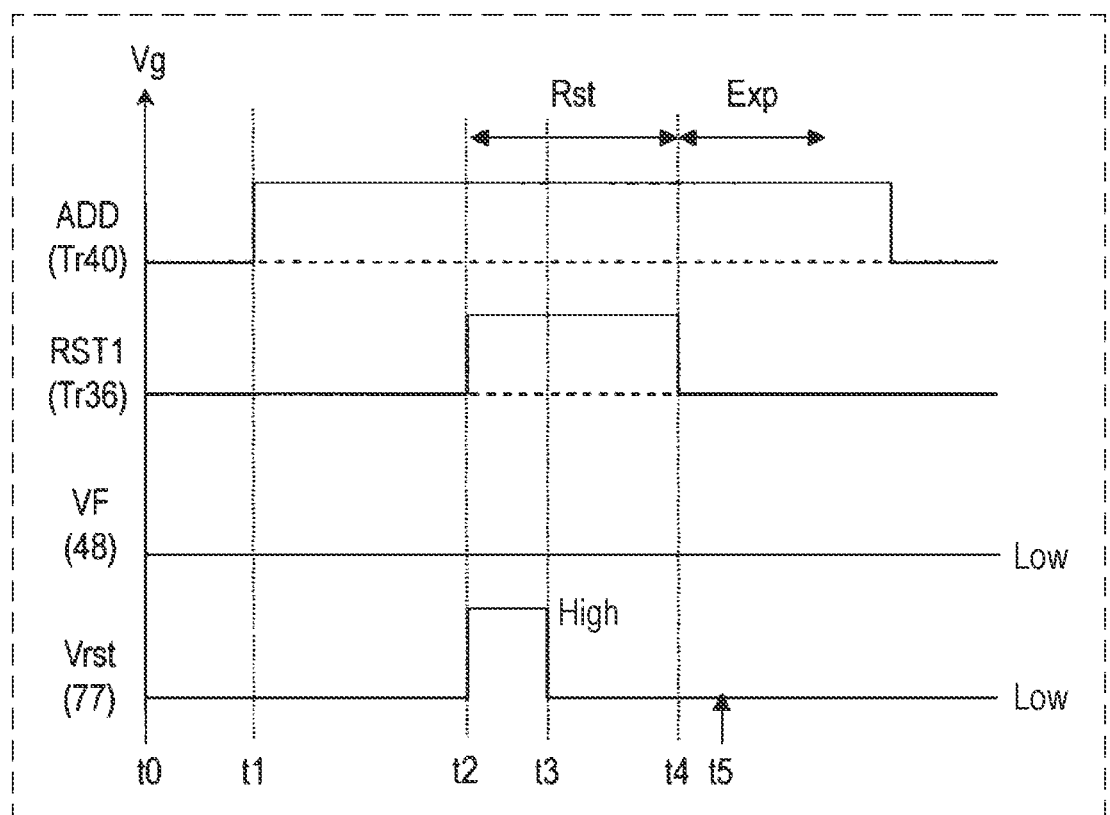
FIG. 20 is a timing chart for explaining a typical example of an operation of a transistor in a second mode in the imaging device according to the fifth embodiment.

FIG. 20 is a timing chart for explaining a typical operation example of the transistors in the second mode in the imaging device according to the fifth embodiment. The period during which the first reset transistor 36 is on differs between the example illustrated in FIG. 20 according to the fifth embodiment and the example illustrated in FIG. 5 according to the first embodiment. To be more specific, in the example illustrated in FIG. 20, the first reset transistor 36 is on during a period from time t2 to time t4.

In FIG. 20, Vrst schematically represents an example of change in the reset potential Vrst applied to a reset voltage line 77. In the example illustrated in FIG. 20, the reset potential Vrst applied to the reset voltage line 77 is at low level during a period from time t0 to time t2, at high level during a period from time t2 to t3, and at low level during a period after time t3.

In the example of FIG. 20, the end of the reset period corresponds to the start of the exposure period. However, there may be a time lag between the end of the reset period and the start of the exposure period.

FIG. 21 is a schematic diagram illustrating a typical example of the potential state of the transistor in the second mode in the imaging device according to the fifth embodiment. The states of FIG. 21 can be obtained by the control illustrated in FIG. 20.

A state (a) of FIG. 21 is a state during a period from time t2 to time t3. During this period, the first reset transistor 36 is on and the reset potential Vrst is at high level. Therefore, the high-level reset potential Vrst is applied to the first gate electrode of the first transistor 81. The first transistor 81 is on. The control potential VF is supplied not only to the node 48 but also to the node 47 and the second terminal 71b through the first source and the first drain of the first transistor 81. Thus, the potentials of the node 47 and the second terminal 71b are reset to the control potential VF.

A state (b) of FIG. 21 is a state during a period from time t3 to time t4. During this period, although the first reset transistor 36 is on, the reset potential Vrst is at low level. Therefore, the first transistor 81 is off. During this period, the potential of the charge accumulator 37 is reset to the low-level reset potential Vrst.

As can be understood from the above description, in the examples of FIGS. 19A, 20, and 21, the control circuit applies the reset potential Vrst to the charge accumulator 37 in the reset period. During a period included in the reset period, the control circuit temporarily turns on the first transistor 81 by changing the level of the reset potential Vrst in a pulsed manner. Accordingly, the first transistor 81 is temporarily turned on, and the control potential VF is applied from the control circuit to the second terminal 71b through the first source and the first drain of the first transistor 81, thus resetting the potential of the second terminal 71b. Thus, according to this example, in the reset period, the potential of the second terminal 71b can be reset at the same time as resetting the potential of the charge accumulator 37.

To be more specific, the reset period has a first period and a second period following the first period. The first period is a period following a 0-th period. In the 0-th period and the second period, the reset potential Vrst is at a second level. In the first period, the reset potential Vrst is at a first level. In the first period, the potential of the second terminal 71b is reset to the control potential VF. In the second period, the potential of the charge accumulator 37 is reset to the reset potential Vrst at the second level.

The first period corresponds to the period from time t2 to t3 in FIG. 20. The second period corresponds to the period from time t3 to t4 in FIG. 20. The first level corresponds to the high level in FIG. 20. The second level corresponds to the low level in FIG. 20.

Figure 22:
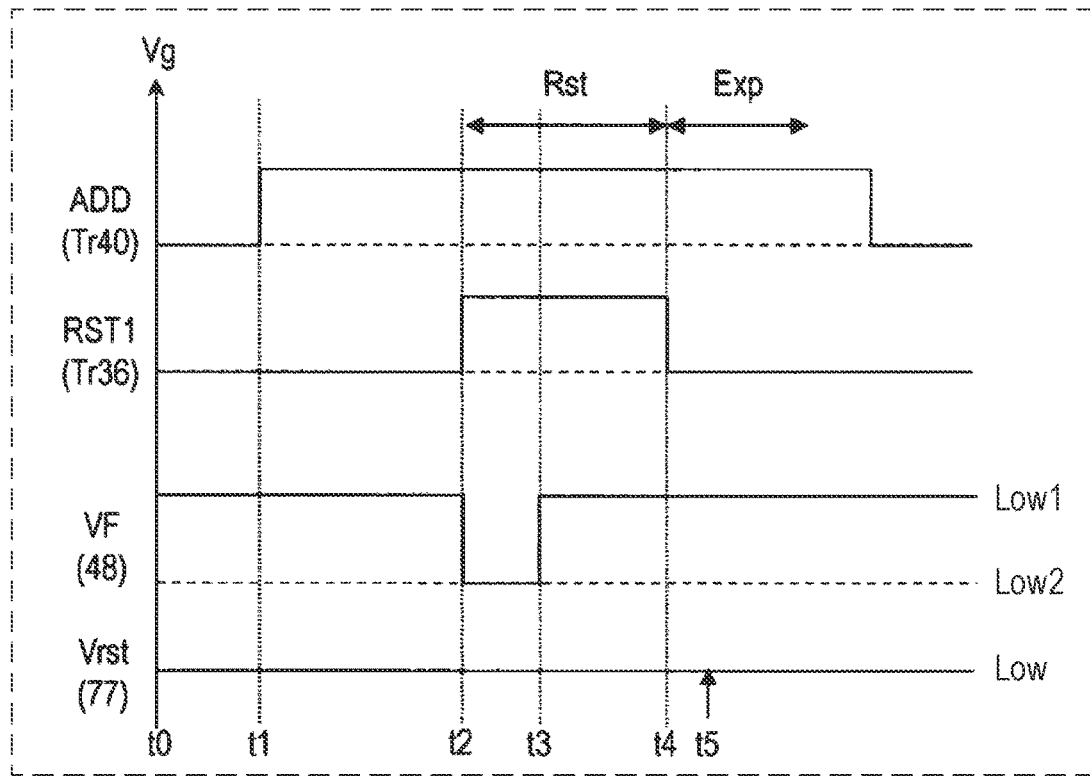
FIG. 22 is a timing chart for explaining an operation example of the transistor in the second mode in the imaging device according to the fifth embodiment.

In the circuit configuration illustrated in FIG. 19A, it is also possible to reset the potential of the second terminal 71b and the potential of the node 47 at the same time as resetting the potential of the charge accumulator 37 by control different from the control illustrated in FIG. 20. FIG. 22 is a timing chart for explaining another operation example of the transistor in the second mode in the imaging device according to the fifth embodiment.

The reset potential Vrst applied to the reset voltage line 77 differs between the example illustrated in FIG. 22 and the example illustrated in FIG. 20. To be more specific, in the example illustrated in FIG. 22, the reset potential Vrst applied to the reset voltage line 77 is constant at low level.

The control potential VF differs between the example illustrated in FIG. 22 and the example illustrated in FIG. 20. To be more specific, in the example illustrated in FIG. 22, the control potential VF is at a first low level during a period from time t0 to time t2, at a second low level during a period from time t2 to t3, and at the first low level during a period after time t3. The second low level is lower than the first low level. In FIG. 22, the first low level is indicated as Low1, and the second low level is indicated as Low2.

Figure 23:
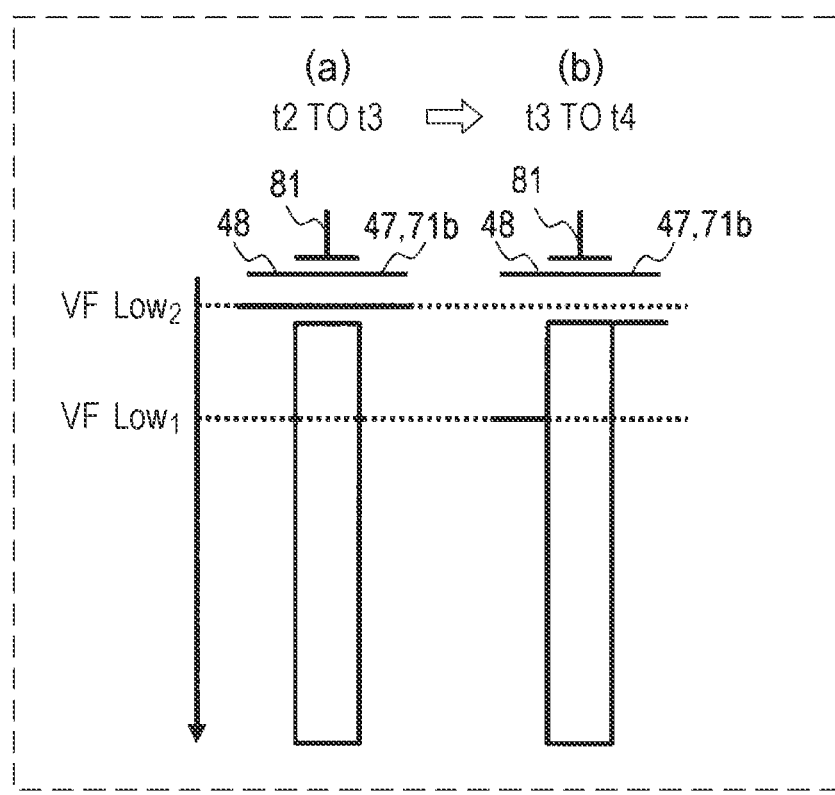
FIG. 23 is a schematic diagram illustrating an example of the potential state of the transistor in the second mode in the imaging device according to the fifth embodiment.

FIG. 23 is a schematic diagram illustrating an example of the potential states of the transistor in the second mode in the imaging device according to the fifth embodiment. The states of FIG. 23 can be obtained by the control illustrated in FIG. 22.

A state (a) of FIG. 23 is a state during a period from time t2 to t3. During this period, the control potential VF is at a relatively low second low level. The second low level is lower than the potential under the gate of the first transistor 81 in the off state. Therefore, although the first transistor 81 is off, the control potential VF is supplied from the control circuit to the node 47 and the second terminal 71b through the first source and the first drain.

A state (b) of FIG. 23 is a state during a period from time t3 to t4. During this period, the control potential VF is at a relatively high first low level. The first low level is higher than the potential under the gate of the first transistor 81 in the off state. By shifting from the state (a) to the state (b), the potentials of the node 47 and the second terminal 71b are reset to the potential under the gate of the first transistor 81 in the off state.

According to the control illustrated in FIGS. 22 and 23, the potential of the charge accumulator 37 is reset to the reset potential Vrst.

As can be understood from the above description, in the examples of FIGS. 19A, 22, and 23, the control circuit applies the reset potential Vrst to the charge accumulator 37 in the reset period. During a period included in the reset period, the control circuit temporarily short-circuits the first source and the first drain of the first transistor 81 in the off state by changing the level of the control potential VF in a pulsed manner. According to this example, the potential of the second terminal 71b can be reset as the potential of the charge accumulator 37 is reset in the reset period.

To be more specific, the reset period has a first period and a second period following the first period. The first period is a period following a 0-th period. In the 0-th, first, and second periods, the reset potential Vrst is at a level that maintains the first transistor 81 in the off state. In the 0-th and second periods, the control potential VF is at a third level. In the first period, the control potential VF is at a fourth level. At the third level, the first source and the first drain of the first transistor 81 are not short-circuited. At the fourth level, the first source and the first drain of the first transistor 81 are short-circuited. The control circuit changes the control potential VF between the third and fourth levels, in other words, beyond the level of the potential under the gate of the first transistor 81 in the off state. As a result, the potential of the second terminal 71b is reset to the potential under the gate of the first transistor 81 in the off state. In the second period, the potential of the charge accumulator 37 is reset to the reset potential Vrst. The control potential VF after the reset period is a potential for realizing auto-gamma ON.

The first period corresponds to the period from time t2 to t3 in FIG. 20. The second period corresponds to the period from time t3 to t4 in FIG. 20. The third level corresponds to the first low level in FIG. 22. The fourth level corresponds to the second low level in FIG. 22.

According to the examples of FIGS. 19A to 23, the potentials of the second terminal 71b and the node 47 can be reset as the potential of the charge accumulator 37 is reset. Thus, the potential state of the node 47 can be stabilized. Furthermore, according to this example, the potentials of the second terminal 71b and the node 47 can be reset without the specific reset transistor 76 illustrated in FIG. 2. This is advantageous from the point of view of reducing the size of the pixel 11d, improving the resolution, and the like.

Figure 19B:
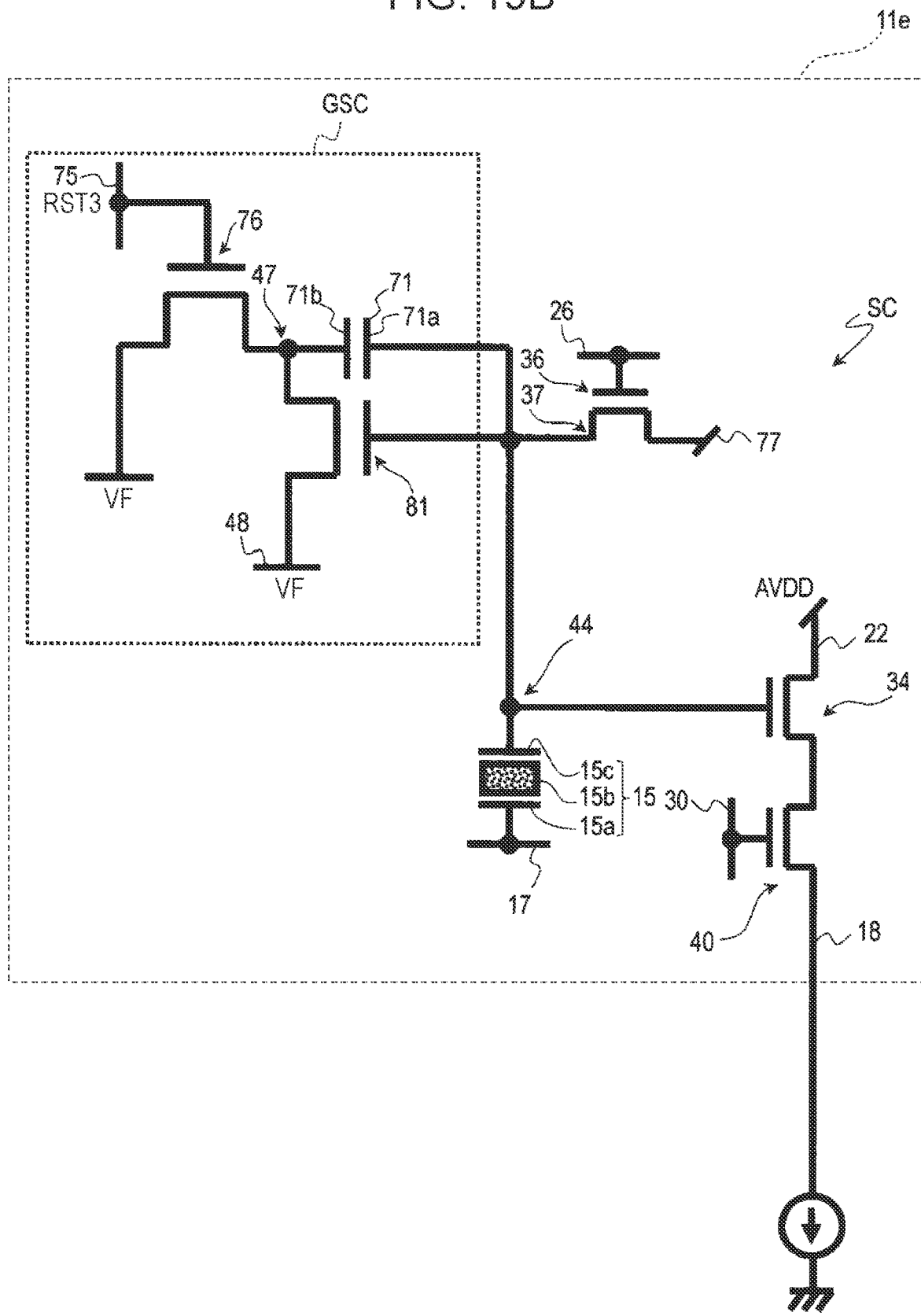
FIG. 19B is a schematic diagram illustrating an exemplary circuit configuration of the imaging device according to the fifth embodiment.

The specific circuit GSC may have a specific reset transistor 76 when performing floating control. FIG. 19B is a schematic diagram illustrating another exemplary circuit configuration of the imaging device according to the fifth embodiment.

In a pixel 11e illustrated in FIG. 19B, one of the source and drain of the specific reset transistor 76 is connected to a node 47. A control potential VF is applied from a control circuit to the other of the source and drain of the specific reset transistor 76.

According to the example of FIG. 19B, the potentials of the second terminal 71b and the node 47 can be reset to the control potential VF by turning on the specific reset transistor 76. Therefore, the potentials of the second terminal 71b and the node 47 can be reset without the timing control illustrated in FIGS. 20 to 23.

Sixth Embodiment

Figure 24:
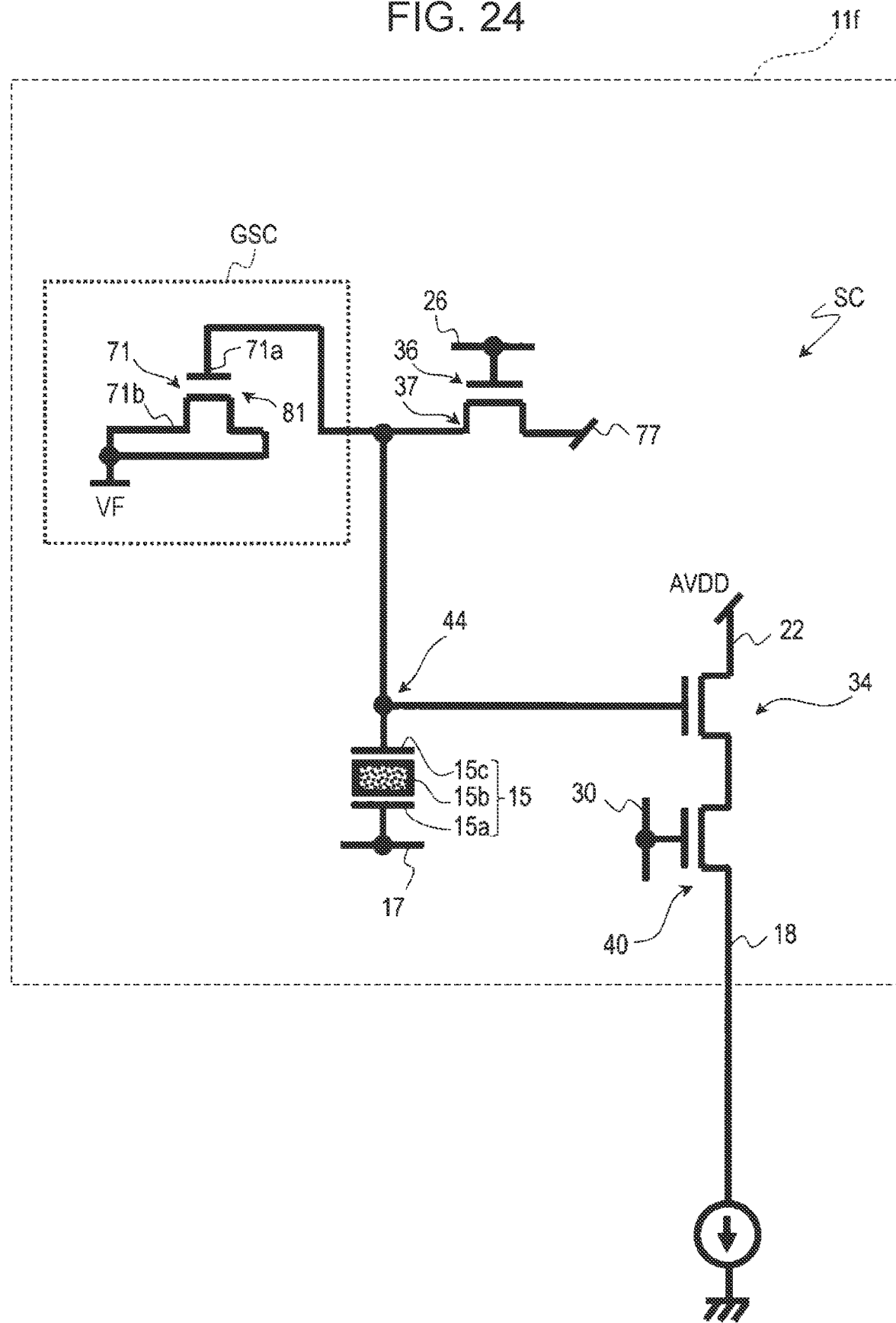
FIG. 24 is a schematic diagram illustrating an exemplary circuit configuration of an imaging device according to a sixth embodiment.

FIG. 24 is a schematic diagram illustrating an exemplary circuit configuration of an imaging device according to a sixth embodiment. In a pixel 11f according to the sixth embodiment, a first capacitive element 71 is a MOS capacitor.

The first capacitive element 71 has a first terminal 71a electrically connected to a gate electrode of an amplifying transistor 34, a charge accumulator 37, a node 44, and a photoelectric converter 15. To be more specific, the first terminal 71a is electrically connected to a pixel electrode 15c.

By adopting the first capacitive element 71 that is the MOS capacitor, a specific circuit GSC can be realized with a small number of elements. This is advantageous from the point of view of reducing the size of the pixel 11f, improving the resolution, and the like.

In this embodiment, the first capacitive element 71 that is the MOS capacitor is configured using a first transistor 81. One of the first terminal 71a and a second terminal 71b is electrically connected to a first source and a first drain of the first transistor 81. The other of the first terminal 71a and the second terminal 71b is electrically connected to a first gate electrode of the first transistor 81. In the example of FIG. 24, the second terminal 71b is electrically connected to the first source and the first drain of the first transistor 81. The first terminal 71a is electrically connected to the first gate electrode of the first transistor 81.

The first source and the first drain of the first transistor 81 are electrically connected to each other. According to this configuration, the first transistor 81 can be turned on when a difference in potential between the first capacitive element 71 and the second terminal 71b reaches a certain value. The first source and the first drain of the first transistor 81 can be electrically connected by wiring or the like.

Operations of the imaging device according to this embodiment will be described below. In the following description, the term "inter-terminal voltage" of the first capacitive element 71 may be used. The inter-terminal voltage is a difference in potential between the first capacitive element 71 and the second terminal 71b.

A control potential VF is applied to the second terminal 71b of the first capacitive element 71. On the other hand, the first terminal 71a is electrically connected to the charge accumulator 37. Therefore, when photoelectric conversion is performed in the photoelectric converter 15, the potential of the first terminal 71a changes together with the potential of the charge accumulator 37, and the inter-terminal voltage also changes. To be more specific, since signal charges are holes, the potential of the first terminal 71a rises together with the potential of the charge accumulator 37 when photoelectric conversion is performed in the photoelectric converter 15. When the inter-terminal voltage reaches a certain value, the first transistor 81 is turned on. As a result, the first capacitive element 71 functions as a capacitor to accumulate charges generated by photoelectric conversion. Thus, the capacitance value of the charge accumulation capacitor X increases.

The control potential VF applied to the second terminal 71b may be switched. In one example, a shooting mode of the imaging device has a first mode and a second mode. In the first mode, the control potential VF applied to the second terminal 71b is a potential VFA. In the second mode, the control potential VF applied to the second terminal 71b is a potential VFB. The potentials VFA and VFB are different from each other. According to this example, a difference can be made between a first threshold potential in the first mode and a first threshold potential in the second mode.

In this embodiment, the first capacitive element 71 that is the MOS capacitor can function as a capacitor that accumulates charges generated by photoelectric conversion. Typically, this function gradually changes as the potential of the charge accumulator 37 changes beyond the first threshold potential. However, this function may also change continuously as the potential of the charge accumulator 37 changes beyond the first threshold potential. The expression that "the specific circuit GSC changes the capacitance value of the charge accumulation capacitor X when the potential of the charge accumulator 37 changes beyond the first threshold potential" includes any of the configurations described above. The expression the "the specific circuit GSC changes the capacitance value of the charge accumulation capacitor X according to the capacitance value of the first capacitive element 71 in response to a change in potential of the charge accumulator 37" includes any of the configurations described above. Moreover, the expression that "the specific circuit GSC changes the capacitance value of the charge accumulation capacitor X in response to a change in potential of the charge accumulator 37" includes any of the configurations described above.

Seventh Embodiment

Figure 25:
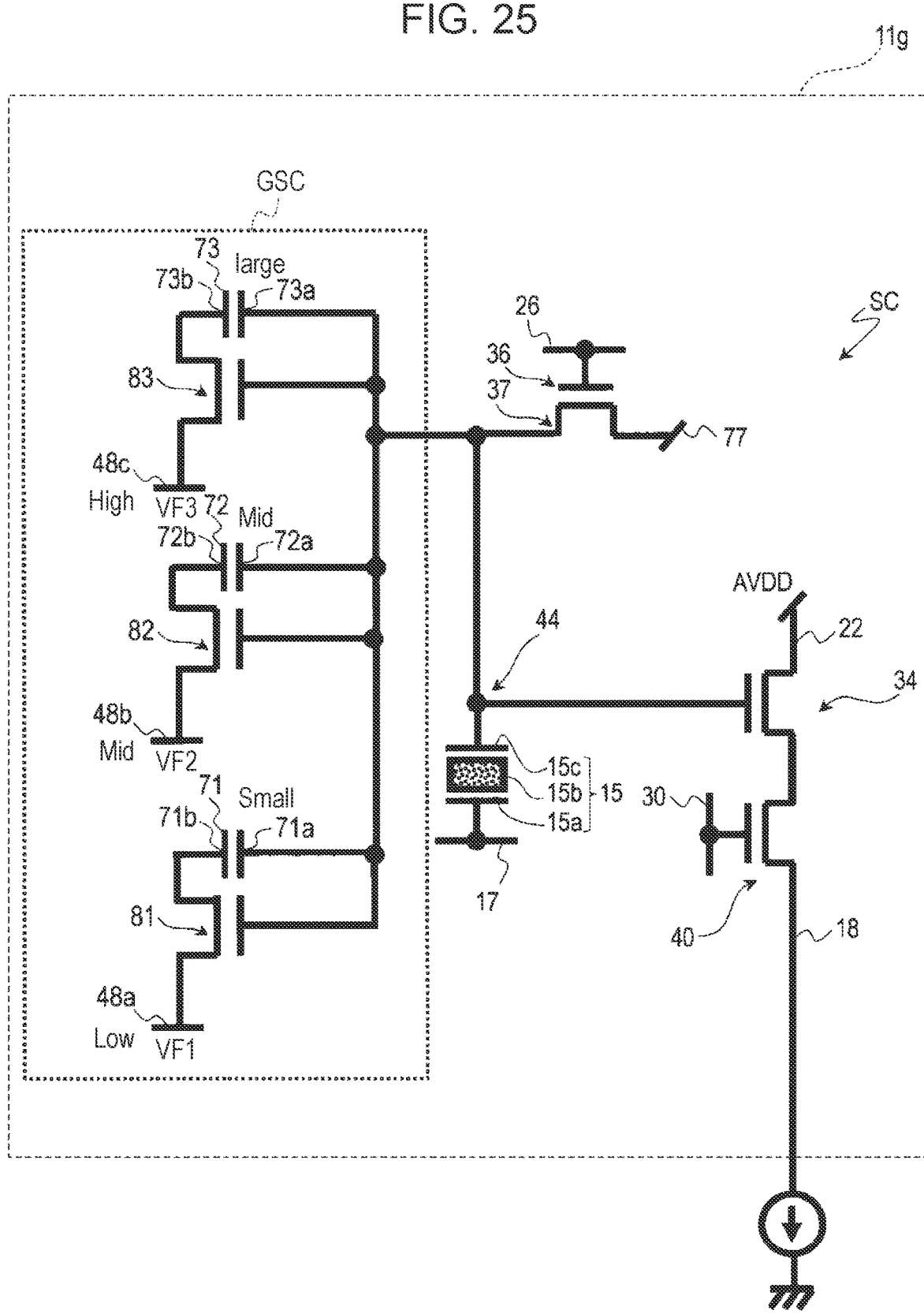
FIG. 25 is a schematic diagram illustrating an exemplary circuit configuration of an imaging device according to a seventh embodiment.

FIG. 25 is a schematic diagram illustrating an exemplary circuit configuration of an imaging device according to a seventh embodiment. A circuit configuration of a pixel 11g of the seventh embodiment illustrated in FIG. 25 differs from the circuit configuration of the pixel 11d of the fifth embodiment illustrated in FIG. 19A in a specific circuit GSC. To be more specific, the specific circuit GSC of the seventh embodiment illustrated in FIG. 25 has a plurality of stages of circuits corresponding to the specific circuit GSC of the fifth embodiment illustrated in FIG. 19A.

More specifically, in the seventh embodiment, the specific circuit GSC includes a first transistor 81, a second transistor 82, a third transistor 83, a first capacitive element 71, a second capacitive element 72, and a third capacitive element 73.

Hereinafter, a source of the second transistor 82 may be referred to as a second source. A drain of the second transistor 82 may be referred to as a second drain. A gate electrode of the second transistor 82 may be referred to as a second gate electrode. A source of the third transistor 83 may be referred to as a third source. A drain of the third transistor 83 may be referred to as a third drain. A gate electrode of the third transistor 83 may be referred to as a third gate electrode.

The second capacitive element 72 includes a first terminal 72a and a second terminal 72b. The third capacitive element 73 includes a first terminal 73a and a second terminal 73b.

A first gate electrode of the first transistor 81 is electrically connected to the first terminal 71a of the first capacitive element 71 and a charge accumulator 37. One of a first source and a first drain of the first transistor 81 is electrically connected to the second terminal 71b of the first capacitive element 71. A first control potential VF1 is applied to the other of the first source and the first drain of the first transistor 81 from the control circuit.

The second gate electrode of the second transistor 82 is electrically connected to the first terminal 72a of the second capacitive element 72 and the charge accumulator 37. One of the second source and the second drain of the second transistor 82 is electrically connected to the second terminal 72b of the second capacitive element 72. A second control potential VF2 is applied to the other of the second source and the second drain of the second transistor 82 from the control circuit.

The third gate electrode of the third transistor 83 is electrically connected to the first terminal 73a of the third capacitive element 73 and the charge accumulator 37. One of the third source and the third drain of the third transistor 83 is electrically connected to the second terminal 73b of the third capacitive element 73. A third control potential VF3 is applied to the other of the third source and the third drain of the third transistor 83 from the control circuit.

Figure 26:
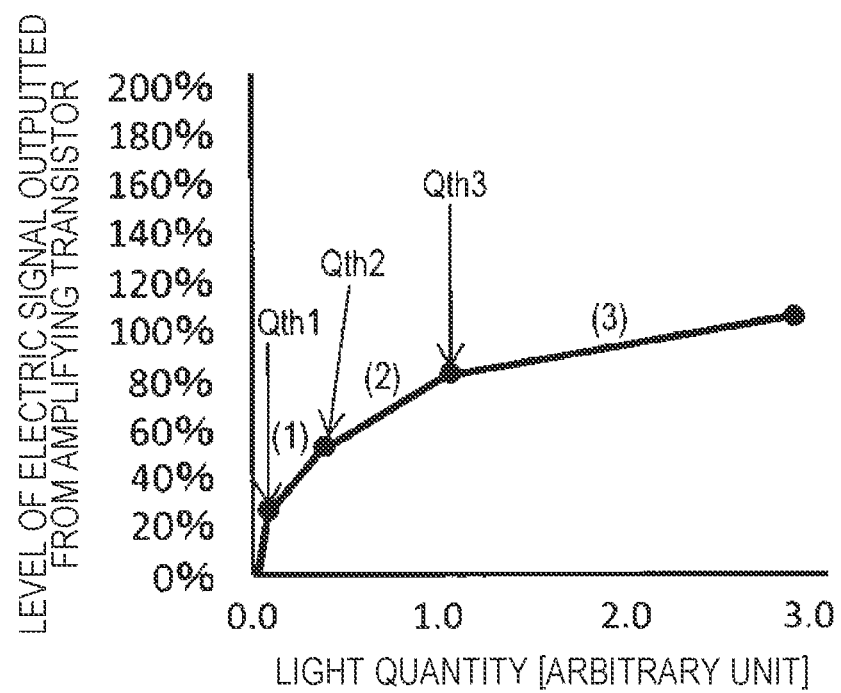
FIG. 26 is a graph schematically illustrating a typical example of changes in level of an electric signal outputted from an amplifying transistor with respect to changes in quantity of light that enters a photoelectric converter in a second mode according to the seventh embodiment.

FIG. 26 is a graph schematically illustrating a typical example of changes in level of an electric signal outputted from an amplifying transistor 34 with respect to changes in quantity of light incident on the photoelectric converter 15 in a second mode according to the seventh embodiment. In this embodiment, when the quantity of light incident on the imaging device increases beyond a first threshold light quantity Qth1, the first capacitive element 71 functions as a capacitor to accumulate charges generated by photoelectric conversion. As a result, the capacitance value of the charge accumulation capacitor X increases. When the quantity of light incident on the imaging device increases beyond a second threshold light quantity Qth2, the second capacitive element 72 functions as a capacitor to accumulate charges generated by photoelectric conversion. As a result, the capacitance value of the charge accumulation capacitor X increases. When the quantity of light incident on the imaging device increases beyond a third threshold light quantity Qth3, the third capacitive element 73 functions as a capacitor to accumulate charges generated by photoelectric conversion. As a result, the capacitance value of the charge accumulation capacitor X increases. In this context, the quantity of light incident on the imaging device is specifically the quantity of light incident on the photoelectric converter 15.

Hereinafter, in the light quantity-electric signal level characteristics illustrated in FIG. 26, a bandwidth in which the light quantity is greater than or equal to the first threshold light quantity Qth1 and less than the second threshold light quantity Qth2 is referred to as a bandwidth (1). A bandwidth in which the light quantity is greater than or equal to the second threshold light quantity Qth2 and less than the third threshold light quantity Qth3 is referred to as a bandwidth (2). A bandwidth in which the light quantity is greater than or equal to the third threshold light quantity Qth3 is referred to as a bandwidth (3).

The potential of the charge accumulator 37 when the light quantity is the first threshold light quantity Qth1 is referred to as a first threshold potential. The potential of the charge accumulator 37 when the light quantity is the second threshold light quantity Qth2 is referred to as a second threshold potential. The potential of the charge accumulator 37 when the light quantity is the second threshold light quantity Qth3 is referred to as a third threshold potential.

In this embodiment, the third control potential VF3, the second control potential VF2, and the first control potential VF1 are different from each other. Accordingly, the first threshold light quantity Qth1, the second threshold light quantity Qth2, and the third threshold light quantity Qth3 can be set to be different from each other. In this context, a threshold voltage is a gate-source voltage of a transistor when the transistor is turned on.

To be more specific, in this embodiment, the third control potential VF3 is higher than the second control potential VF2. The second control potential VF2 is higher than the first control potential VF1. Accordingly, as illustrated in FIG. 26, the third threshold light quantity Qth3 can be set larger than the second threshold light quantity Qth2, while the second threshold light quantity Qth2 can be set larger than the first threshold light quantity Qth1.

In a modified example, a threshold voltage Vth3 of the third transistor 83, a threshold voltage Vth2 of the second transistor 82, and a threshold voltage Vth1 of the first transistor 81 are different from each other. In the modified example, again, the first threshold light quantity Qth1, the second threshold light quantity Qth2, and the third threshold light quantity Qth3 can be set to be different from each other.

To be more specific, in the modified example described above, the threshold voltage Vth3 of the third transistor 83 is higher than the threshold voltage Vth2 of the second transistor 82. The threshold voltage Vth2 of the second transistor 82 is higher than the threshold voltage Vth1 of the first transistor 81. Accordingly, the third threshold light quantity Qth3 can be set larger than the second threshold light quantity Qth2, while the second threshold light quantity Qth2 can be set larger than the first threshold light quantity Qth1.

The magnitude relationship of third control potential VF3>second control potential VF2>first control potential VF1 and the magnitude relationship of threshold voltage Vth3>threshold voltage Vth2>threshold voltage Vth1 may both hold true. Only one of them may hold true.

In this embodiment, a capacitance value C3 of the third capacitive element 73 is larger than a capacitance value C2 of the second capacitive element 72. The capacitance value C2 of the second capacitive element 72 is larger than a capacitance value C1 of the first capacitive element 71. Accordingly, pseudo-gamma characteristics having the following advantages can be achieved. These advantages are useful in a camera system.

An SNR is easily ensured in a low light intensity region.

An extensive gradation or number of bits is easily assigned to the low light intensity region.

In a high light intensity region, the capacitance value of the charge accumulation capacitor X is easily ensured, making it easier to achieve a wide dynamic range and to prevent overexposure.

In the high light intensity region, a rise in potential of the charge accumulator 37 can be suppressed, and a high voltage is not applied to the charge accumulator 37, transistors, and the like for a long period of time, making it easier to ensure the reliability of the imaging device.

In this embodiment, the specific circuit GSC changes the capacitance value of the charge accumulation capacitor X when the potential of the charge accumulator 37 changes beyond the first threshold potential, when the potential of the charge accumulator 37 changes beyond the second threshold potential, and when the potential of the charge accumulator 37 changes beyond the third threshold potential. This configuration can contribute to achieving useful gamma characteristics in the camera system.

In one example, the specific circuit GSC changes the capacitance value of the charge accumulation capacitor X according to the capacitance value of the first capacitive element 71 when the potential of the charge accumulator 37 changes beyond the first threshold potential. The specific circuit GSC changes the capacitance value of the charge accumulation capacitor X according to the capacitance value of the second capacitive element 72 when the potential of the charge accumulator 37 changes beyond the second threshold potential. The specific circuit GSC changes the capacitance value of the charge accumulation capacitor X according to the capacitance value of the third capacitive element 73 when the potential of the charge accumulator 37 changes beyond the third threshold potential.

In one specific example, the specific circuit GSC changes the capacitance value of the charge accumulation capacitor X according to the capacitance value of the first capacitive element 71 when the potential of the charge accumulator 37 changes beyond the first threshold potential. The specific circuit GSC changes the capacitance value of the charge accumulation capacitor X according to the capacitance value of the second capacitive element 72 when the potential of the charge accumulator 37 changes beyond the second threshold potential. The specific circuit GSC changes the capacitance value of the charge accumulation capacitor X according to the capacitance value of the third capacitive element 73 when the potential of the charge accumulator 37 changes beyond the third threshold potential.

The specific circuit GSC of the seventh embodiment illustrated in FIG. 25 has a plurality of stages of circuits corresponding to the specific circuit GSC of the fifth embodiment illustrated in FIG. 19A. However, the specific circuit GSC may have a plurality of stages of circuits corresponding to the specific circuits GSC of the other embodiments. The number of the stages is three in this embodiment, but may be two, or greater than or equal to four.

Eighth Embodiment

Figure 27:
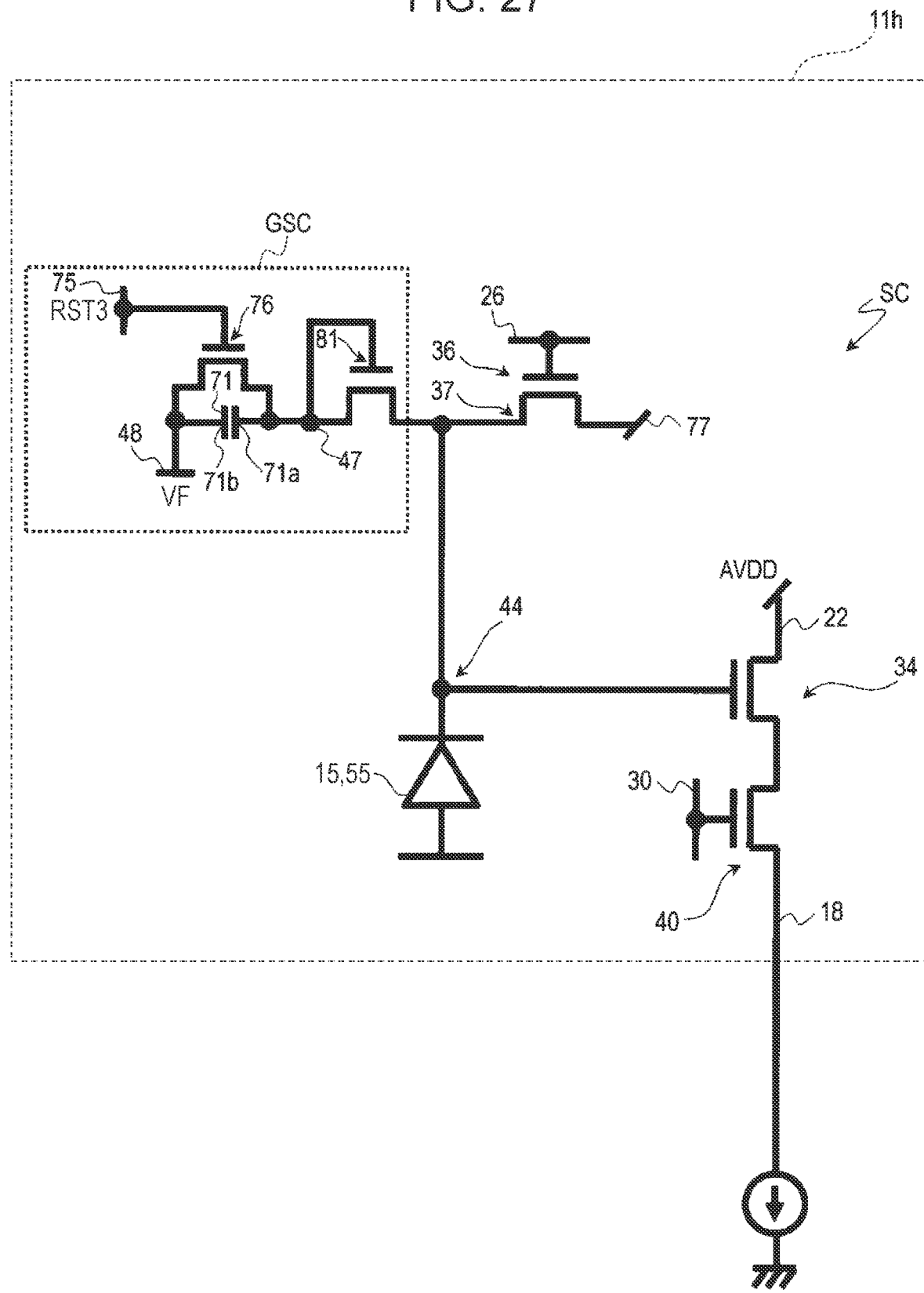
FIG. 27 is a schematic diagram illustrating an exemplary circuit configuration of an imaging device according to an eighth embodiment.

FIG. 27 is a schematic diagram illustrating an exemplary circuit configuration of an imaging device according to an eighth embodiment.

A pixel 11h according to the eighth embodiment is different from the pixel 11a according to the first embodiment in that a photoelectric converter 15 is a photodiode. To be more specific, the photoelectric converter 15 is a silicon photodiode. The photoelectric converter 15 is also a charge accumulator 55 that accumulates charges generated by photoelectric conversion. Signal charges are electrons.

In this embodiment, a first gate electrode of a first transistor 81 is electrically connected to a first terminal 71a of a first capacitive element 71. One of a first source and a first drain of the first transistor 81 is electrically connected to the first terminal 71a. The other of the first source and the first drain is electrically connected to the charge accumulator 55. In this embodiment, a control potential is applied to a second terminal 71b of the first capacitive element 71 from a control circuit.

In this embodiment, a node 48 is electrically connected to the second terminal 71b of the first capacitive element 71. A node 47 is electrically connected to one of the first source and the first drain of the first transistor 81 and to the first terminal 71a of the first capacitive element 71.

Figure 28:
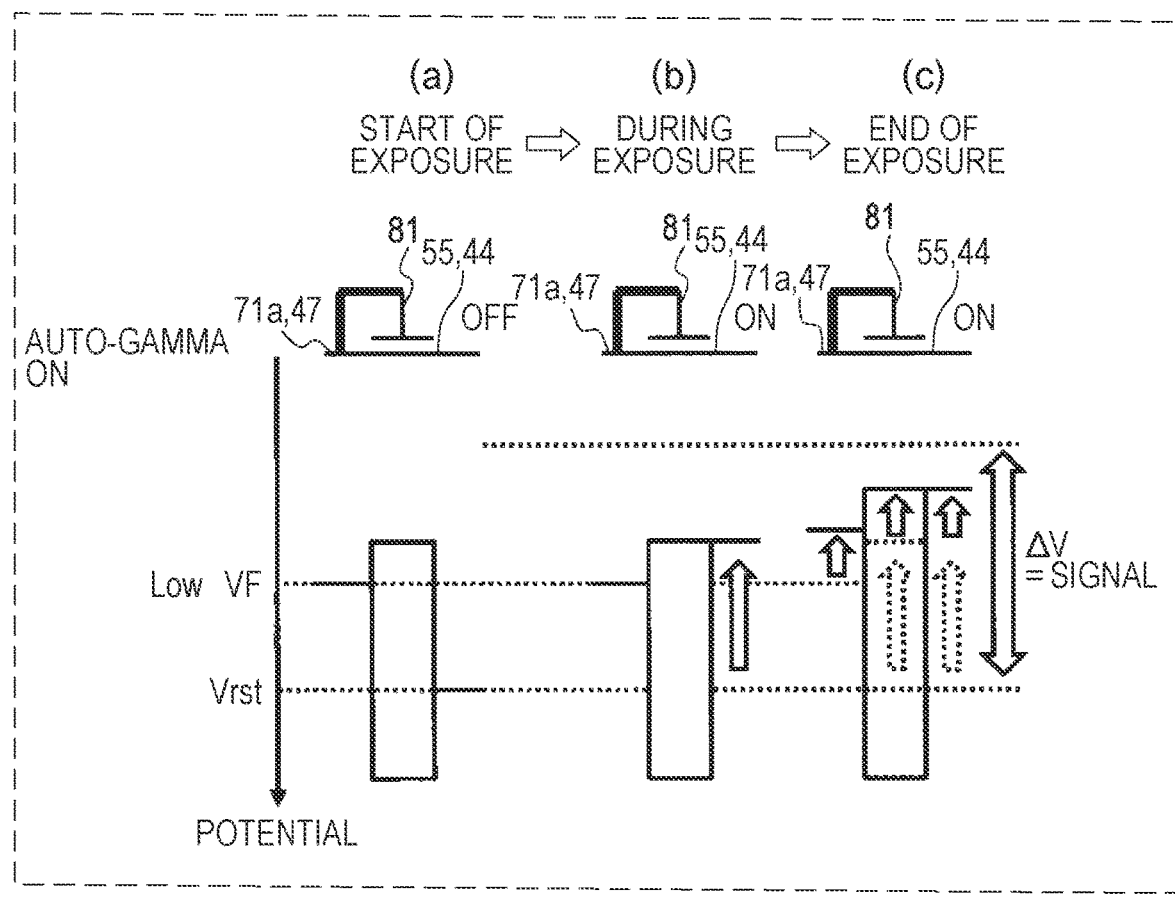
FIG. 28 is a schematic diagram illustrating a typical example of a potential state of a transistor in a second mode in the imaging device according to the eighth embodiment.

FIG. 28 is a schematic diagram illustrating a typical example of potential states of the transistor in a second mode in the imaging device according to the eighth embodiment.

A state (a) of FIG. 28 is a state at the start of exposure. In the state (a) of FIG. 28, the potential of the charge accumulator 55 is a reset potential Vrst. A potential of the first terminal 71a of the first capacitive element 71 is a control potential VF. The potential of the first terminal 71a of the first capacitive element 71 is higher than a potential under the gate of the first transistor 81. The potential of the charge accumulator 55 is higher than the potential of the first terminal 71a of the first capacitive element 71. The first transistor 81 is off.

A state (b) of FIG. 28 is a state during exposure. Since the signal charges are electrons, the potential of the charge accumulator 55 decreases during exposure.

When the potential of the charge accumulator 55 drops as the exposure progresses, a gate-source voltage of the first transistor 81 eventually exceeds a threshold voltage, and the first transistor 81 is turned on. As a result, the charge accumulator 55 and the first terminal 71a are electrically connected through the first transistor 81.

When the first transistor 81 is on while the exposure is in progress, a situation may arise where the potential under the gate of the first transistor 81 is lower than the potential of the first terminal 71a and the potential of the charge accumulator 55 is lower than the potential under the gate of the first transistor 81. In this situation, electrons are injected into the first terminal 71a from the charge accumulator 55 through the first transistor 81. The injection of electrons increases the potential of the charge accumulator 55. Accordingly, the potential under the gate of the first transistor 81 also rises. On the other hand, the potential of the first terminal 71a drops.

Such injection of electrons balances the potential of the charge accumulator 55 and the potential of the first terminal 71a. During exposure, the potential of the charge accumulator 55 and the potential of the first terminal 71a can drop while maintaining this balance. In this situation, the voltage between the first terminal 71a and the second terminal 71b changes as the signal charges are generated. That is, the first capacitive element 71 functions as part of the charge accumulation capacitor X that accumulates charges, resulting in a state where the capacitance value of the charge accumulation capacitor X has increased. Accordingly, the potential of the charge accumulator 55 changes more gradually.

A state (c) of FIG. 28 is a state at the end of exposure. Compared to the first mode, the potential of the charge accumulator 55 is low at the end of exposure as the potential of the charge accumulator 55 changes more gradually in the second mode as described above. Therefore, a difference voltage $\Delta V$ is higher in the second mode than in the first mode.

In this embodiment, the charge accumulator 55 and the charge accumulator 37 may both correspond to "the charge accumulator that accumulates charges generated by photoelectric conversion". In addition, the charge accumulator 55 and the charge accumulator 37 may both correspond to the "charge accumulator" in the expression that "the specific circuit changes the capacitance value of the charge accumulation capacitor in response to a change in potential of the charge accumulator".

Ninth Embodiment

Figure 29:
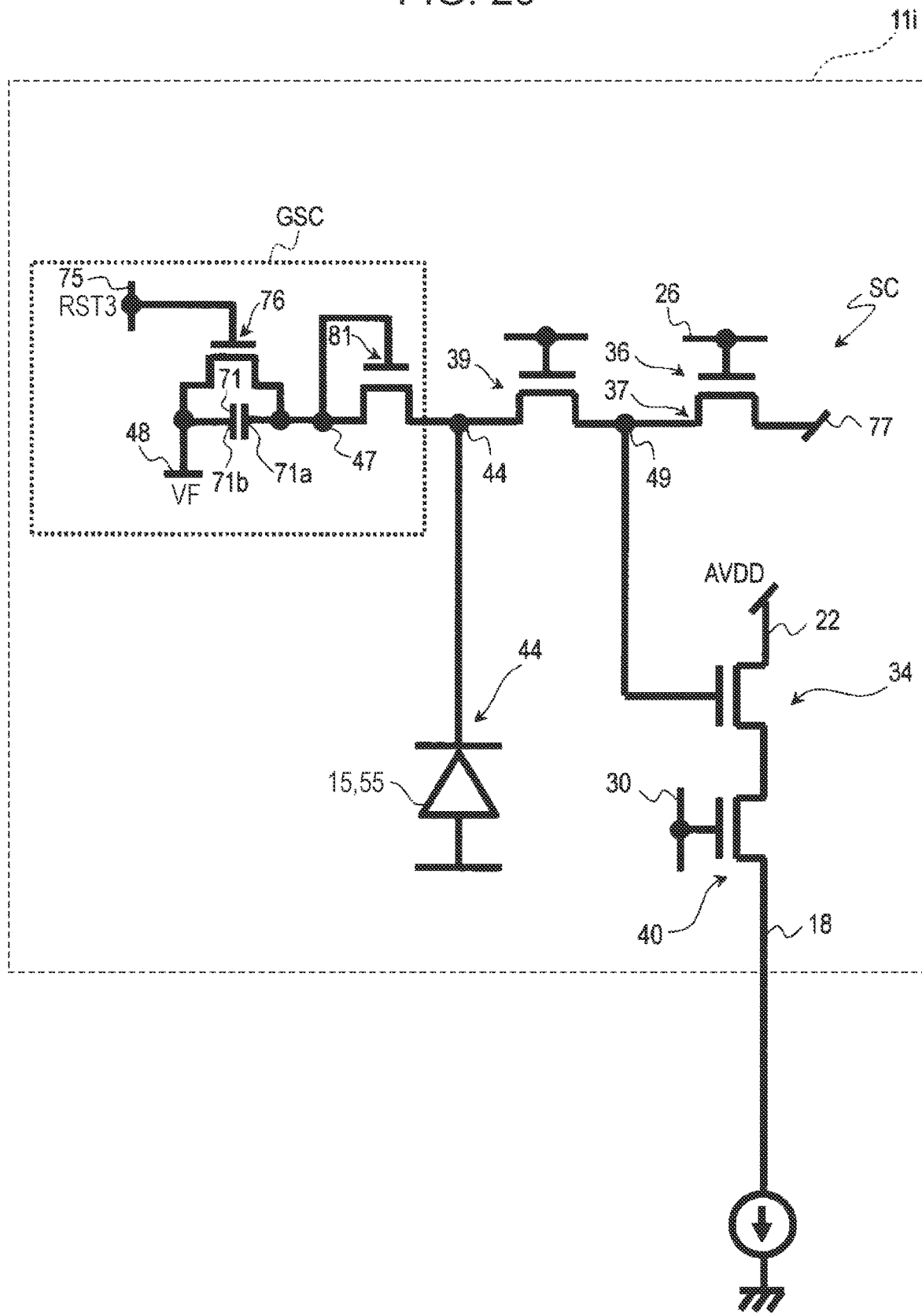
FIG. 29 is a schematic diagram illustrating an exemplary circuit configuration of an imaging device according to a ninth embodiment.

FIG. 29 is a schematic diagram illustrating an exemplary circuit configuration of an imaging device according to a ninth embodiment.

A pixel 11i according to the ninth embodiment is different from the pixel 11h according to the eighth embodiment in including a transfer transistor 39. One of the source and drain of the transfer transistor 39 is electrically connected to a gate electrode of an amplifying transistor 34. The other of the source and drain of the transfer transistor 39 is electrically connected to one of a first source and a first drain of a first transistor 81 and to a photoelectric converter 15, that is, a charge accumulator 55.

In this embodiment, a node 44 is electrically connected to the other of the source and drain of the transfer transistor 39, to one of the first source and the first drain of the first transistor 81, and to the photoelectric converter 15, that is, the charge accumulator 55. In this embodiment, a node electrically connected to one of the source and drain of the transfer transistor 39 and to the gate electrode of the amplifying transistor 34 is referred to as a node 49.

In this embodiment, one of the source and drain of the transfer transistor 39 constitutes a charge accumulator 37. More specifically, the charge accumulator 37 has a function to accumulate signal charges, a function as one of the source and drain of a first reset transistor 36, and a function as one of the source and drain of the transfer transistor 39.

Figure 30:
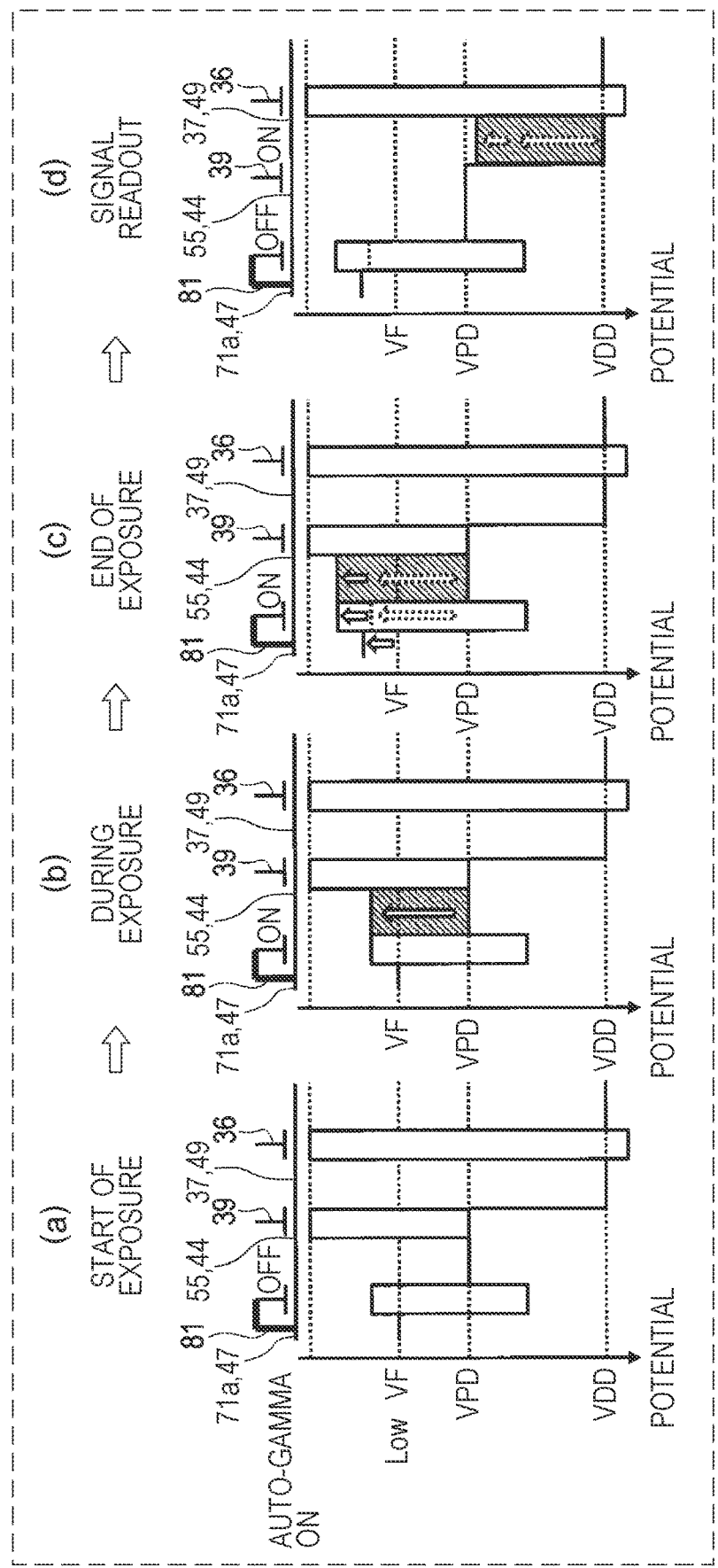
FIG. 30 is a schematic diagram illustrating a typical example of a potential state of a transistor in a second mode in the imaging device according to the ninth embodiment.

FIG. 30 is a schematic diagram illustrating a typical example of potential states of the transistor in a second mode in the imaging device according to the ninth embodiment.

A state (a) of FIG. 30 is a state at the start of exposure. In the state (a), no signal charges are accumulated in the charge accumulator 55. A potential of a first terminal 71a of a first capacitive element 71 is a control potential VF. The potential of the first terminal 71a of the first capacitive element 71 is higher than a potential under the gate of the first transistor 81. The potential of the charge accumulator 55 is higher than the potential of the first terminal 71a of the first capacitive element 71.

A state (b) of FIG. 30 is a state during exposure. Since signal charges are electrons, the potential of the photoelectric converter 15 drops during exposure. That is, the potential of the charge accumulator 55 drops.

When the potential of the charge accumulator 55 drops as the exposure progresses, a gate-source voltage of the first transistor 81 eventually exceeds a threshold voltage, and the first transistor 81 is turned on. As a result, the charge accumulator 55 and the first terminal 71a are electrically connected through the first transistor 81.

When the first transistor 81 is on while the exposure is in progress, a situation may arise where the potential under the gate of the first transistor 81 is lower than the potential of the first terminal 71a and the potential of the charge accumulator 55 is lower than the potential under the gate of the first transistor 81. In this situation, electrons are injected into the first terminal 71a from the charge accumulator 55 through the first transistor 81. The injection of electrons increases the potential of the charge accumulator 55. Accordingly, the potential under the gate of the first transistor 81 also rises. On the other hand, the potential of the first terminal 71a drops.

Such injection of electrons balances the potential of the charge accumulator 55 and the potential of the first terminal 71a. During exposure, the potential of the charge accumulator 55 and the potential of the first terminal 71a can drop while maintaining this balance. In this situation, the voltage between the first terminal 71a and the second terminal 71b changes as the signal charges are generated. That is, the first capacitive element 71 functions as part of the charge accumulation capacitor X that accumulates charges, resulting in a state where the capacitance value of the charge accumulation capacitor X has increased. Accordingly, the potential of the charge accumulator 55 changes more gradually.

A state (c) of FIG. 30 is a state at the end of exposure. When the transfer transistor 39 is turned on from this state, the charges are transferred from the charge accumulator 55 to the charge accumulator 37. Thus, a signal is read out, resulting in a state (d) of FIG. 30.

In this embodiment, the transfer transistor 39 transfers the charges from the charge accumulator 55 to the charge accumulator 37. This transfer can be so-called full transfer. Therefore, kTC noise can be properly reduced without a noise canceling circuit such as the feedback circuit FC illustrated in FIGS. 15 and 18.

Tenth Embodiment

Figure 31:
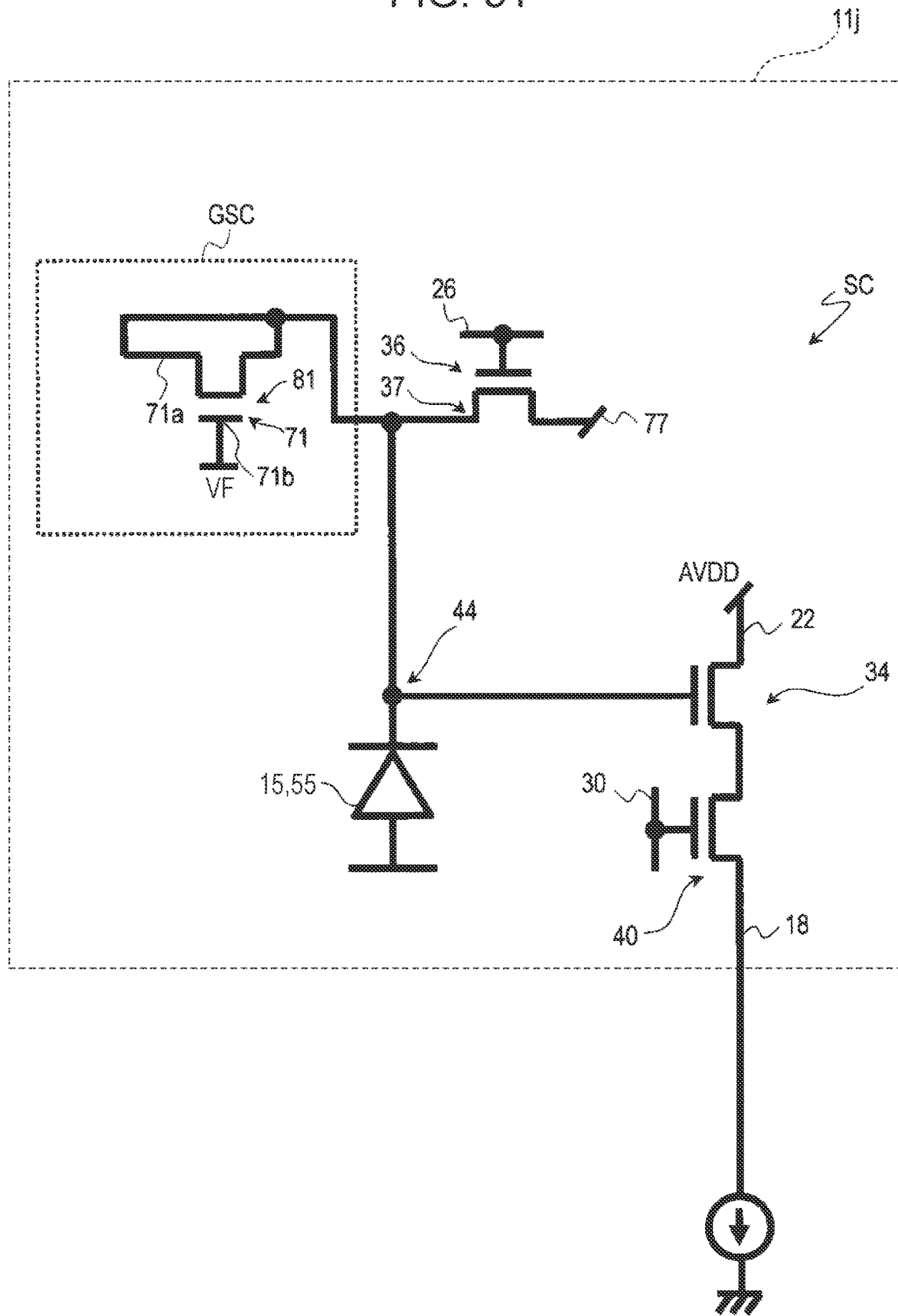
FIG. 31 is a schematic diagram illustrating an exemplary circuit configuration of an imaging device according to a tenth embodiment.

FIG. 31 is a schematic diagram illustrating an exemplary circuit configuration of an imaging device according to a tenth embodiment.

A circuit configuration of a pixel 11j of the tenth embodiment illustrated in FIG. 31 differs from the circuit configuration of the pixel 11h of the eighth embodiment illustrated in FIG. 27 in a specific circuit GSC.

In the tenth embodiment, a first capacitive element 71 is a MOS capacitor.

A first terminal 71a of the first capacitive element 71 is electrically connected to a gate electrode of an amplifying transistor 34, a charge accumulator 37, a node 44, and a photoelectric converter 15. The photoelectric converter 15 is a photodiode. The photoelectric converter 15 is also a charge accumulator 55.

In this embodiment, the first capacitive element 71 that is the MOS capacitor is configured using the first transistor 81. One of the first terminal 71a and a second terminal 71b is electrically connected to a first source and a first drain of the first transistor 81. The other of the first terminal 71a and the second terminal 71b is electrically connected to the first gate electrode of the first transistor 81. In the example of FIG. 31, the first terminal 71a is electrically connected to the first source and the first drain of the first transistor 81. The second terminal 71b is electrically connected to the gate electrode of the first transistor 81.

The first source and the first drain of the first transistor 81 are electrically connected to each other. According to this configuration, the first transistor 81 can be turned on when a difference between the potential of the first capacitive element 71 and the potential of the second terminal 71b reaches a certain value. The first source and the first drain of the first transistor 81 can be electrically connected by wiring or the like.

Operations of the imaging device according to this embodiment will be described below. A control potential VF is applied to the second terminal 71b of the first capacitive element 71. On the other hand, the first terminal 71a is electrically connected to the charge accumulator 55. Therefore, when photoelectric conversion is performed in the photoelectric converter 15, that is, the charge accumulator 55, the potential of the first terminal 71a changes together with the potential of the charge accumulator 55, and an inter-terminal voltage also changes. To be more specific, since signal charges are electrons, the potential of the first terminal 71a drops together with the potential of the charge accumulator 55 when photoelectric conversion is performed in the photoelectric converter 15, that is, the charge accumulator 55. When a difference between the potential of the first terminal 71a and the potential of the second terminal 71b reaches a certain value, the first transistor 81 is turned on. As a result, the first capacitive element 71 functions as a capacitor to accumulate charges generated by photoelectric conversion. Thus, the capacitance value of the charge accumulation capacitor X increases.

As in the sixth embodiment described with reference to FIG. 24, the control potential VF applied to the second terminal 71b may be switched, and an imaging mode of the imaging device may have a first mode and a second mode.

Linearity Correction According to Control Potential VF

FIG. 32 is a diagram schematically illustrating an example of changes in output from the horizontal signal readout circuit 21 with respect to an increase in amount of exposure.

In FIG. 32, the solid line L1 represents the extension of a linear graph to a region with a larger light quantity, the graph illustrating changes in output from the horizontal signal readout circuit 21 with respect to the increase in amount of exposure when the control potential VF is set to realize auto-gamma OFF. The broken line L2 and the broken line L3 are graphs each illustrating changes in output from the horizontal signal readout circuit 21 with respect to an increase in amount of exposure when the control potential VF is set to realize auto-gamma ON. To be more specific, the broken line L2 is a graph illustrating changes in output obtained when the control potential VF is set to the potential VFA in FIG. 10. The broken line L3 represents changes in output obtained when the control potential VF is set to the potential VFB in FIG. 10. In this example, the exposure amount is increased by increasing the exposure period under constant illuminance.

The solid line L1 is a linear line, while the broken lines L2 and L3 are polygonal lines. The broken lines L2 and L3 deviate more from the straight solid line L1 as the amount of exposure increases.

Therefore, by correcting the output from the horizontal signal readout circuit 21, for example, the deviation of the output of the horizontal signal readout circuit 21 from the straight line may be corrected with respect to the increase in the exposure period. FIG. 33 schematically illustrates an overview of linearity compensation processing. For example, a table for converting the output from the horizontal signal readout circuit 21 into an appropriate digital value may be prepared for each control potential VF.

In this example, a memory 162 holds three correction tables AT1 to AT3 corresponding to each control potential VF. For example, a control circuit 160 receives an analog-to-digital converted output, for example, from the horizontal signal readout circuit 21, and applies the correction table according to a specific value of the control potential VF. A selector 165 in FIG. 33 is a circuit that selects which one of the correction tables AT1 to AT3 is to be applied or not to be applied according to the value of the control potential VF. The corrected output is passed to an image processing circuit 164 for predetermined processing.

FIG. 34 illustrates an example of a correction table. The correction table illustrated in FIG. 34 describes a digital value after linearity compensation for each digital value output from the horizontal signal readout circuit 21. For example, when N is inputted as a sensor output from the horizontal signal readout circuit 21, the control circuit 160 outputs X to the image processing circuit 164. When a potential that does not require linearity compensation is selected as the control potential VF as illustrated in graph L1 of FIG. 32, the sensor output from the horizontal signal readout circuit 21 is directly passed to the image processing circuit 164.

By adopting such linearity compensation processing, as illustrated in FIG. 32, the characteristics indicated by the polygonal broken line L2 can be corrected as indicated by the linear solid line L1 in FIG. 32. Likewise, the characteristics indicated by the polygonal broken line L3 can be corrected as indicated by the linear solid line L1. The linearity compensation processing may be performed by the image processing circuit 164. Instead of converting digital values using such a table, linearity may be compensated by multiplying the sensor output from the image processing circuit 164 by an appropriate coefficient.

The linearity deviation as described above may differ from one imaging device to another or from one camera system to another. FIG. 35 is a graph for explaining a difference in linearity deviation between one imaging device or camera system and another. In FIG. 35, the broken line M1 represents an exemplary change in output from the horizontal signal readout circuit 21 with respect to an increase in exposure amount for one imaging device or camera system, while the broken line M2 represents an exemplary change in output from the horizontal signal readout circuit 21 with respect to an increase in exposure amount for another imaging device or camera system. It is beneficial when the output from the horizontal signal readout circuit 21 with respect to the increase in amount of exposure matches between the imaging devices or camera systems, as indicated by the straight line M12 in FIG. 35, for example.

FIG. 36 schematically illustrates an overview of linearity compensation processing for canceling differences between imaging devices or camera systems. For example, when there are an imaging device of sample S1 and an imaging device of sample S2, data on the light quantity-signal level characteristics as illustrated in FIGS. 9A, 10, and the like is acquired in advance for each of samples S1 and S2. Further, a correction value for each sample is calculated based on the acquired data, and the correction values are stored in the memory 162 in a table format, for example. FIG. 36 illustrates an overview of linearity compensation processing in sample S1, for example. Correction tables AT11 to AT13 for converting the output from the horizontal signal readout circuit 21 into an appropriate digital value are written in the memory 162 of the imaging device of sample S1 for each control potential VF. Note that the memory 162 is typically a non-volatile memory.

Figures 38, 39, 40:
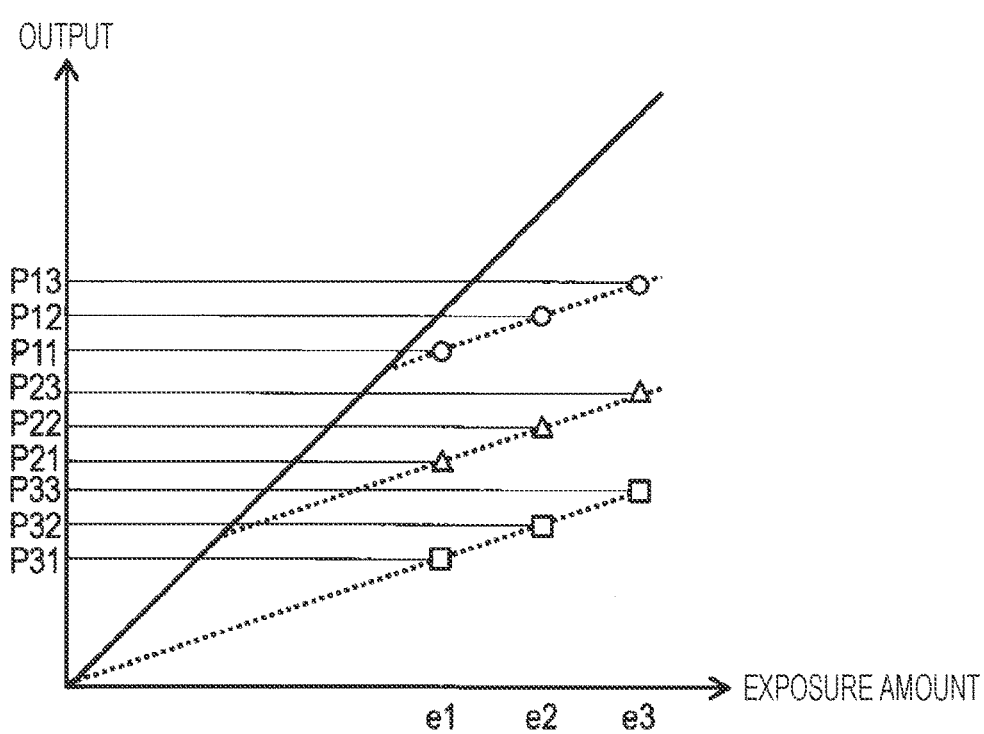
FIG. 38 is a diagram illustrating an example of a correction table stored in a memory of an imaging device of sample S2.
FIG. 39 is a diagram illustrating another example of the correction table stored in the memory.
FIG. 40 is a graph illustrating plotted output values listed in the correction table of FIG. 39.

FIG. 37 illustrates an example of a correction table stored in the memory 162 of the imaging device of sample S1. FIG. 38 illustrates an example of a correction table stored in the memory 162 of the imaging device of sample S2. When such a correction table is applied, for a sensor output N from the horizontal signal readout circuit 21, for example, a digital value X is outputted from the control circuit 160 of the imaging device of sample S1, whereas a digital value Y is outputted from the control circuit 160 of the imaging device of sample S2. By applying such linearity compensation processing adapted to each imaging device or camera system, it is possible to cancel the influence of the difference in photoelectric conversion characteristics due to the individual difference of each imaging device or camera system, as illustrated in the example of FIG. 35.

As described above, the correction value calculated based on the data on the light quantity-signal level characteristics can be prepared for each control potential VF. However, the exposure may be performed longer than an anticipated exposure time, or the control potential VF may be set to an unanticipated value.

FIG. 39 illustrates another example of a correction table stored in the memory 162. FIG. 40 illustrates plotted output values listed in the correction table of FIG. 39. In FIG. 40, white circles indicate plotted values for the correction value applied when the control potential VF is a potential Va, and white triangles indicate plotted values for the correction value applied when the control potential VF is a potential Vb. Also, white rectangles indicate plotted values for the correction value applied when the control potential VF is a potential Vc.

For example, when the value P13 is not obtained in advance in the correction table of FIG. 39, the value P13 can be calculated by linear interpolation from the correction values P11 and P12, for example. It is also possible to calculate, for example, a correction value for setting the control potential VF to an unanticipated value. For example, it is possible to subsequently calculate a correction value, from P22, P23, P32, and P33, when the exposure amount is between t2 and t3 and the control potential VF is set to a value between Vb and Vc.

Figure 41:
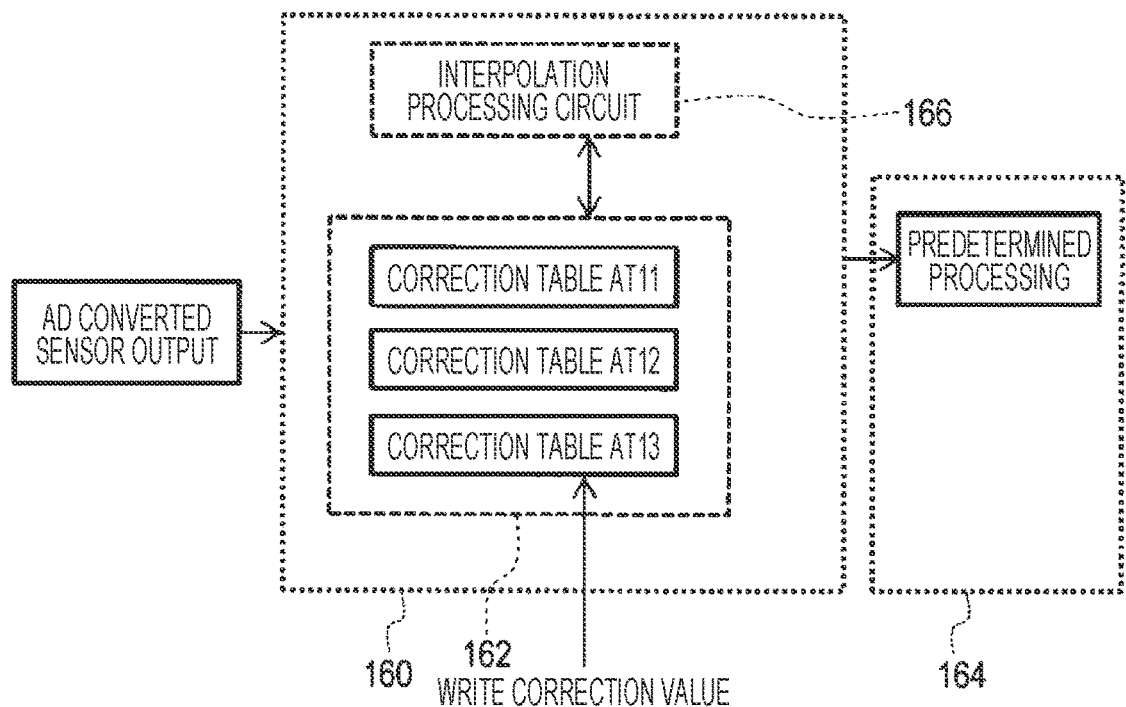
FIG. 41 is a diagram schematically illustrating an overview of linearity compensation processing including interpolation processing.

FIG. 41 schematically illustrates an overview of linearity compensation processing including interpolation processing. As illustrated in FIG. 41, the control circuit 160 may include, as part thereof, an interpolation processing circuit 166 that performs such linear interpolation.

Camera System

Figure 42:
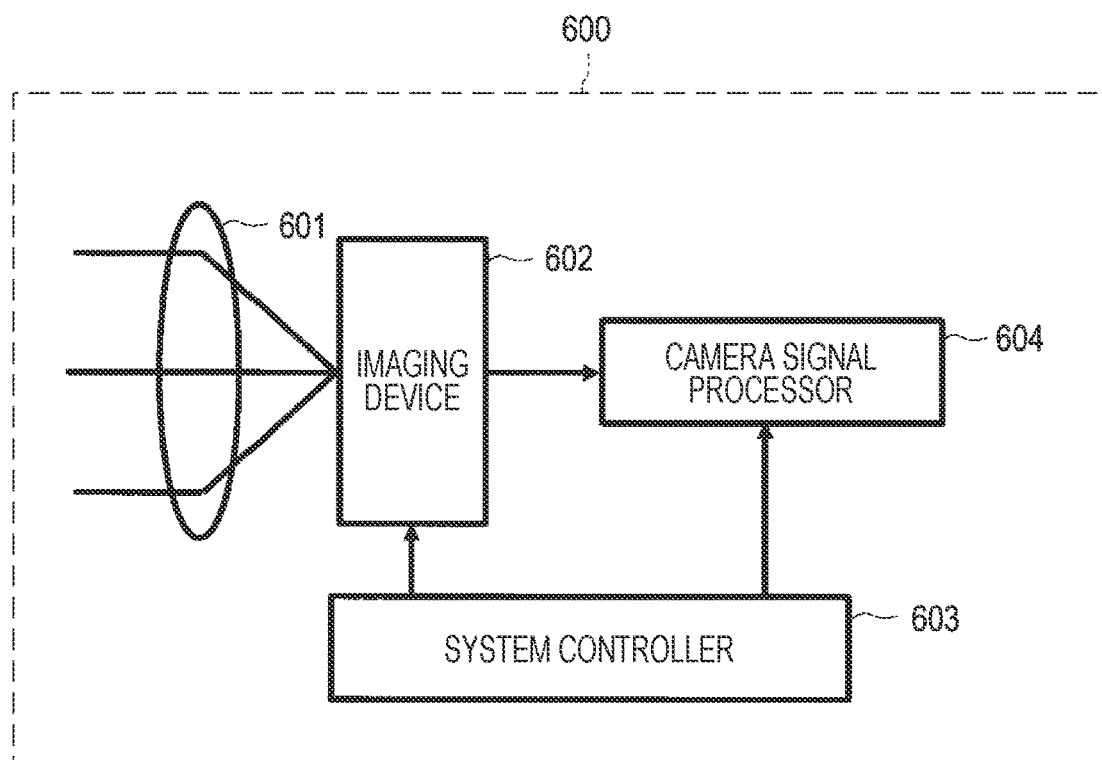
FIG. 42 is a schematic diagram illustrating a configuration example of a camera system.

FIG. 42 is a schematic diagram illustrating a configuration example of a camera system 600. The camera system 600 includes a lens optical system 601, an imaging device 602, a system controller 603, and a camera signal processor 604.

The lens optical system 601 includes, for example, an autofocus lens, a zoom lens, and a diaphragm. The lens optical system 601 focuses light onto an imaging surface of the imaging device 602. As the imaging device 602, the imaging device according to any of the first to tenth embodiments described above can be used.

The system controller 603 controls the entire camera system 600. The system controller 603 may be implemented by a microcomputer, for example.

The camera signal processor 604 functions as a signal processing circuit that processes an output signal from the imaging device 602. The camera signal processor 604 performs processing such as color interpolation processing, spatial interpolation processing, and auto white balance, for example. The camera signal processor 604 may be implemented by a digital signal processor (DSP), for example.

The camera system 600 may include a control circuit. For example, the system controller 603 may correspond to the control circuit. When the system controller 603 is used as the control circuit, the control circuit can operate in the same manner as when the vertical scanning circuit 16 is used as the control circuit. For example, the control circuit controls a first threshold potential by applying a control potential VF to a specific circuit GSC. For example, the control circuit switches the first threshold potential according to a shooting mode. The control circuit may also be configured to perform the linearity control described above. However, the camera system 600 may include an element different from the system controller 603 as the control circuit.

INDUSTRIAL APPLICABILITY

The camera system according to the present disclosure can be applied to various camera systems and sensor systems, such as a digital still camera, broadcast/professional-use camera, medical camera, surveillance camera, vehicle camera, digital single-lens reflex camera, and digital mirrorless single-lens camera.

What is claimed is:

1. An imaging device comprising:
a charge accumulator that accumulates charges generated by photoelectric conversion;
a first transistor having a first source, a first drain, and a first gate electrode electrically connected to one of the first source and the first drain; and
a first capacitive element that holds the charges and has a first terminal, wherein:
a fixed potential is supplied to the other of the first source and the first drain, and
the other of the first source and the first drain is always electrically connected to the first terminal of the first capacitive element from start to end of an exposure period.

2. The imaging device according to claim 1, further comprising:
an amplifying transistor that outputs an electric signal according to a potential of the charge accumulator.

3. The imaging device according to claim 1, further comprising:
a second transistor having a second source, a second drain, and a second gate electrode, wherein
a fixed potential is supplied to the other of the first source and the first drain through the second transistor, and
the first capacitive element is electrically connected between the second source and the second drain.

4. The imaging device according to claim 1, further comprising:
a second transistor having a second source, a second drain, and a second gate electrode, wherein
one of the second source and the second drain is electrically connected to the other of the first source and the first drain, and
a fixed potential is supplied to the other of the second source and the second drain.

5. The imaging device according to claim 1, further comprising:
a semiconductor substrate and a photoelectric converter that generates the charges by photoelectric conversion, wherein
the photoelectric converter is located in the semiconductor substrate.

6. The imaging device according to claim 1, further comprising:
a semiconductor substrate and a photoelectric converter that generates the charges by photoelectric conversion, wherein
the photoelectric converter is located on or above the semiconductor substrate.

7. The imaging device according to claim 1, wherein the first capacitive element includes a MIM capacitor.

8. The imaging device according to claim 1, further comprising:
a control circuit, wherein
the control circuit switches the first threshold potential according to a shooting mode.

9. A camera system comprising:
the imaging device according to claim 1; and
a lens optical system that focuses light onto an imaging surface of the imaging device.

10. The imaging device according to claim 1, wherein the other of the first source and the first drain is connected to the first terminal of the first capacitive element without a switch being provided in between.

11. The imaging device according to claim 1, further comprising:
a control circuit, wherein
the control circuit applies, as the fixed potential, a potential that differs between a first period and a second period.

12. The imaging device according to claim 1, wherein the fixed potential is a direct-current potential.

13. The imaging device according to claim 1, wherein the first gate electrode is always electrically connected to the charge accumulator from the start to the end of the exposure period.

14. An imaging device comprising:
a charge accumulator that accumulates charges generated by photoelectric conversion;
a first transistor having a first source, a first drain, and a first gate electrode connected to one of the first source and the first drain; and
a first capacitive element that is separately provided from first transistor and holds the charges and has a first terminal, wherein:
a fixed potential is supplied to the other of the first source and the first drain,
the one of the first source and the first drain is always electrically connected to the first terminal of the first capacitive element from start to end of an exposure period, and
the first gate electrode of the first transistor is connected to the one of the first source and the first drain through the first capacitive element and connected to the charge accumulator, from the start to the end of the exposure period.

15. A camera system comprising:
the imaging device according to claim 14; and
a lens optical system that focuses light onto an imaging surface of the imaging device.

16. An imaging device comprising:
a charge accumulator that accumulates charges generated by photoelectric conversion;
a node electrically connected to the charge accumulator; and
a circuit, wherein:
the circuit includes
a first transistor having a first source, a first drain, and a first gate electrode electrically connected to one of the first source and the first drain, and
a first capacitive element that holds the charges and has a first terminal,
a fixed potential is supplied to the other of the first source and the first drain,
the other of the first source and the first drain is always electrically connected to the first terminal of the first capacitive element, and
when a capacitor electrically connected to the node is defined as a charge accumulation capacitor, the circuit changes a capacitance value of the charge accumulation capacitor in response to a change in potential of the charge accumulator.

17. The imaging device according to claim 16, wherein the circuit changes, in response to a change in potential of the charge accumulator, the capacitance value of the charge accumulation capacitor according to a capacitance value of the first capacitive element.

18. The imaging device according to claim 16, wherein when the potential of the charge accumulator changes beyond a first threshold potential, the circuit changes the capacitance value of the charge accumulation capacitor.

19. The imaging device according to claim 18, further comprising:
a control circuit, wherein
the control circuit controls the first threshold potential by applying a control potential to the circuit.

20. A camera system comprising:
the imaging device according to claim 16; and
a lens optical system that focuses light onto an imaging surface of the imaging device.

* * * * *